United States Patent
Or-Bach et al.

(10) Patent No.: US 12,396,284 B2
(45) Date of Patent: *Aug. 19, 2025

(54) MULTILEVEL SEMICONDUCTOR DEVICE AND STRUCTURE WITH IMAGE SENSORS AND WAFER BONDING

(71) Applicant: Monolithic 3D Inc., Klamath Falls, OR (US)

(72) Inventors: Zvi Or-Bach, Haifa (IL); Deepak C. Sekar, Sunnyvale, CA (US); Brian Cronquist, Klamath Falls, OR (US)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/778,976

(22) Filed: Jul. 20, 2024

(65) Prior Publication Data
US 2024/0371906 A1    Nov. 7, 2024

Related U.S. Application Data

(63) Continuation-in-part of application No. 18/432,035, filed on Feb. 4, 2024, now Pat. No. 12,080,743, which is a continuation-in-part of application No. 18/382,463, filed on Oct. 20, 2023, now Pat. No. 11,929,372, which is a continuation-in-part of (Continued)

(51) Int. Cl.
    *H10F 39/00* (2025.01)

(52) U.S. Cl.
    CPC ..... *H10F 39/809* (2025.01); *H10F 39/80377* (2025.01)

(58) Field of Classification Search
    CPC ........... H01L 21/2007; H01L 21/76224; H01L 23/544; H04N 25/58; H04N 25/79; H10F 39/018; H10F 39/026; H10F 39/151; H10F 39/1575; H10F 39/1825; H10F 39/1843; H10F 39/1847; H10F 39/191; H10F 39/80; H10F 39/802; H10F 39/8023; H10F 39/8027; H10F 39/803; H10F 39/8033; H10F 39/8037; H10F 39/80373; H10F 39/80377; H10F 39/804; H10F 39/805; H10F 39/8053; H10F 39/8057; H10F 39/806; H10F 39/8063; H10F 39/8067; H10F 39/807; H10F 39/809; H10F 39/811; H10F 39/812; H10F 39/813

See application file for complete search history.

(56) References Cited

U.S. PATENT DOCUMENTS

2005/0029643 A1*   2/2005   Koyanagi ............ H01L 23/481
                                                    257/E31.118

* cited by examiner

*Primary Examiner* — Cheung Lee
(74) *Attorney, Agent, or Firm* — PatentPC/PowerPatent; Bao Tran

(57) ABSTRACT

An integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level including an oxide to oxide bond; a plurality of pixel control circuits; a third level disposed underneath the first level, where the third level includes a plurality of third transistors, where the plurality of third transistors each include a single crystal channel; and a plurality of recessed channel transistors.

20 Claims, 54 Drawing Sheets

Related U.S. Application Data application No. 18/141,975, filed on May 1, 2023, now Pat. No. 11,869,915, which is a continuation-in-part of application No. 18/105,881, filed on Feb. 6, 2023, now Pat. No. 11,855,114, which is a continuation-in-part of application No. 17/951,545, filed on Sep. 23, 2022, now Pat. No. 11,605,663, which is a continuation-in-part of application No. 17/844,687, filed on Jun. 20, 2022, now Pat. No. 11,488,997, which is a continuation-in-part of application No. 17/402,527, filed on Aug. 14, 2021, now Pat. No. 11,404,466, which is a continuation-in-part of application No. 17/317,894, filed on May 12, 2021, now Pat. No. 11,133,344, which is a continuation-in-part of application No. 17/143,956, filed on Jan. 7, 2021, now Pat. No. 11,043,523, which is a continuation-in-part of application No. 17/121,726, filed on Dec. 14, 2020, now Pat. No. 10,978,501, which is a continuation-in-part of application No. 17/027,217, filed on Sep. 21, 2020, now Pat. No. 10,943,934, which is a continuation-in-part of application No. 16/860,027, filed on Apr. 27, 2020, now Pat. No. 10,833,108, which is a continuation-in-part of application No. 15/920,499, filed on Mar. 14, 2018, now Pat. No. 10,679,977, which is a continuation-in-part of application No. 14/936,657, filed on Nov. 9, 2015, now Pat. No. 9,941,319, which is a continuation-in-part of application No. 13/274,161, filed on Oct. 14, 2011, now Pat. No. 9,197,804, which is a continuation-in-part of application No. 12/904,103, filed on Oct. 13, 2010, now Pat. No. 8,163,581.

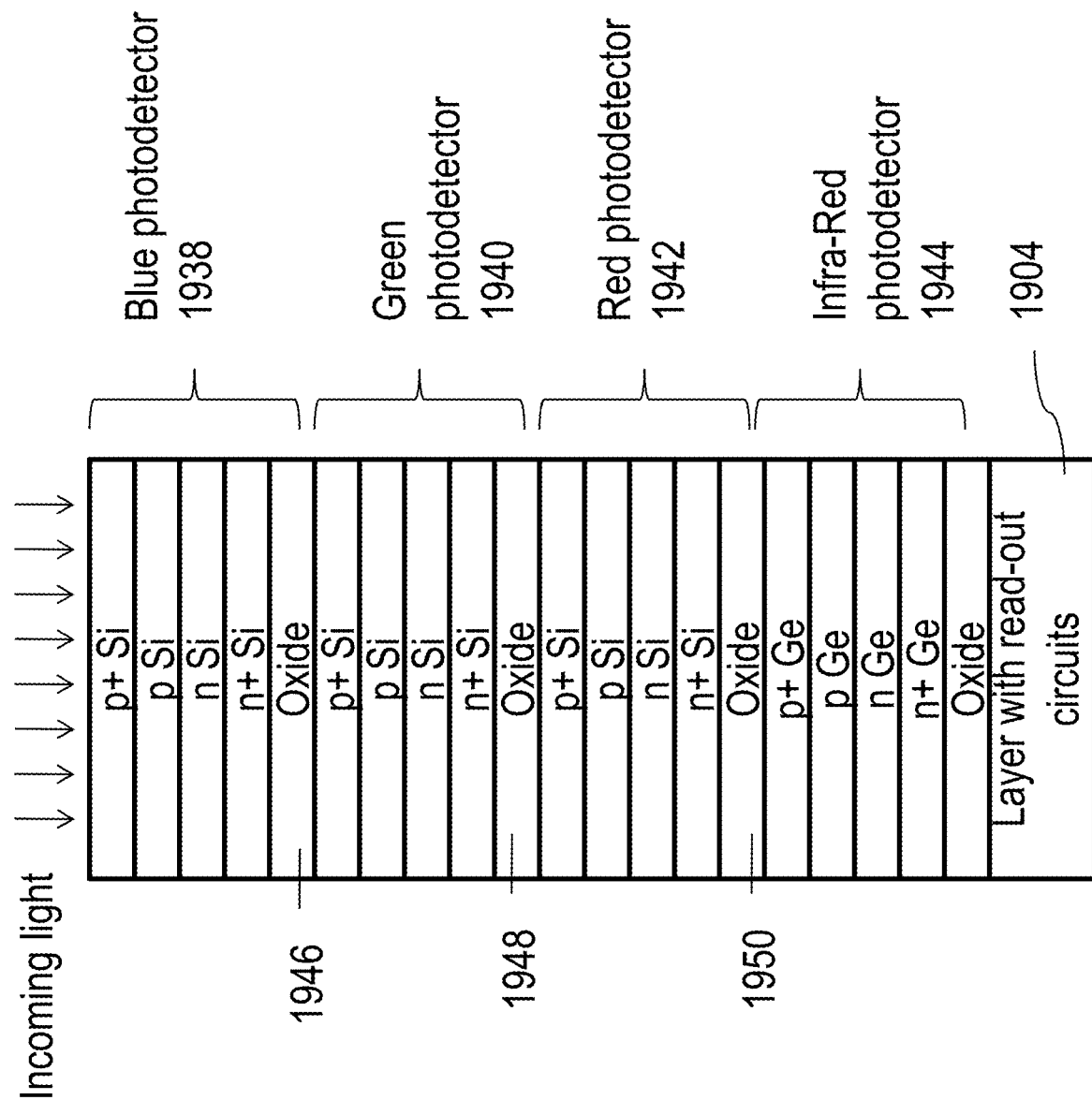

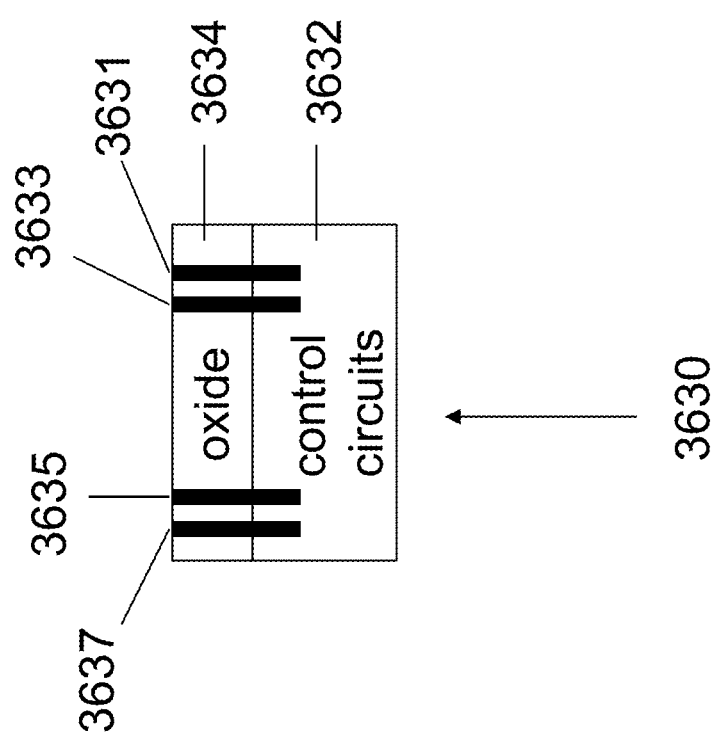

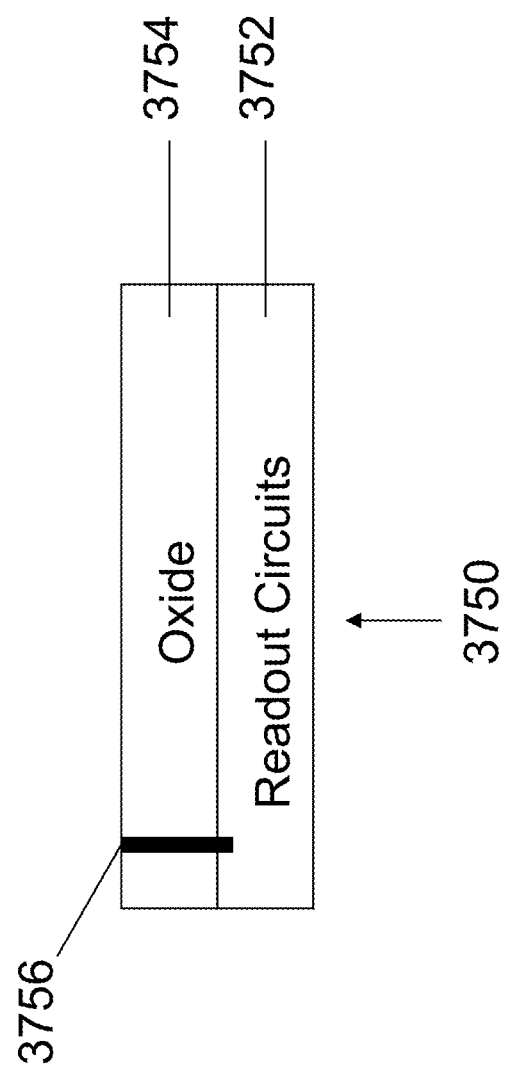

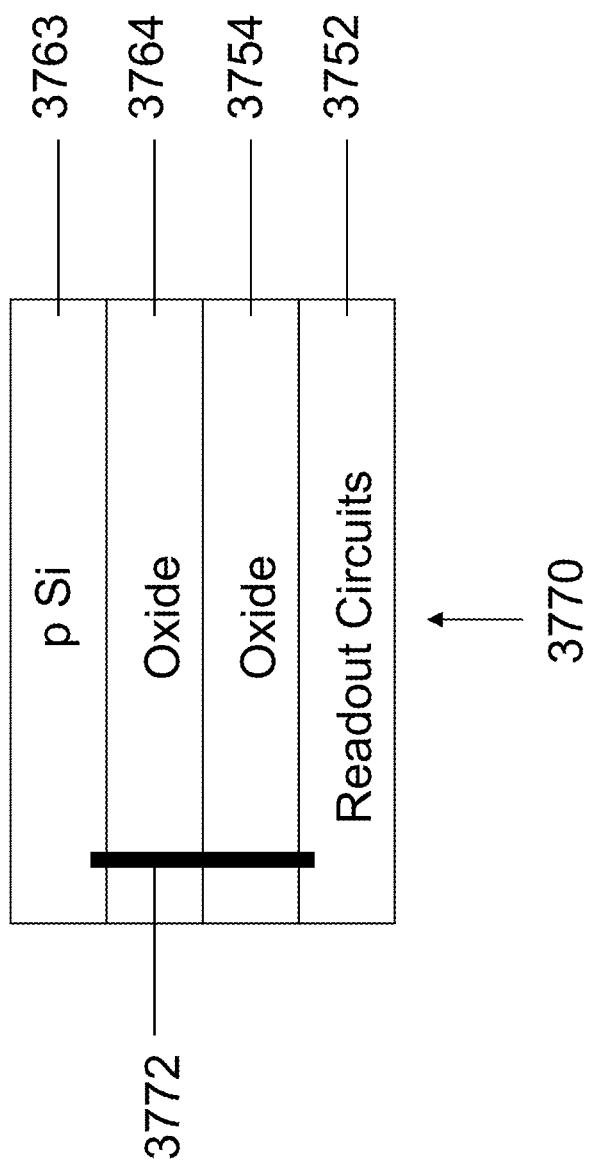

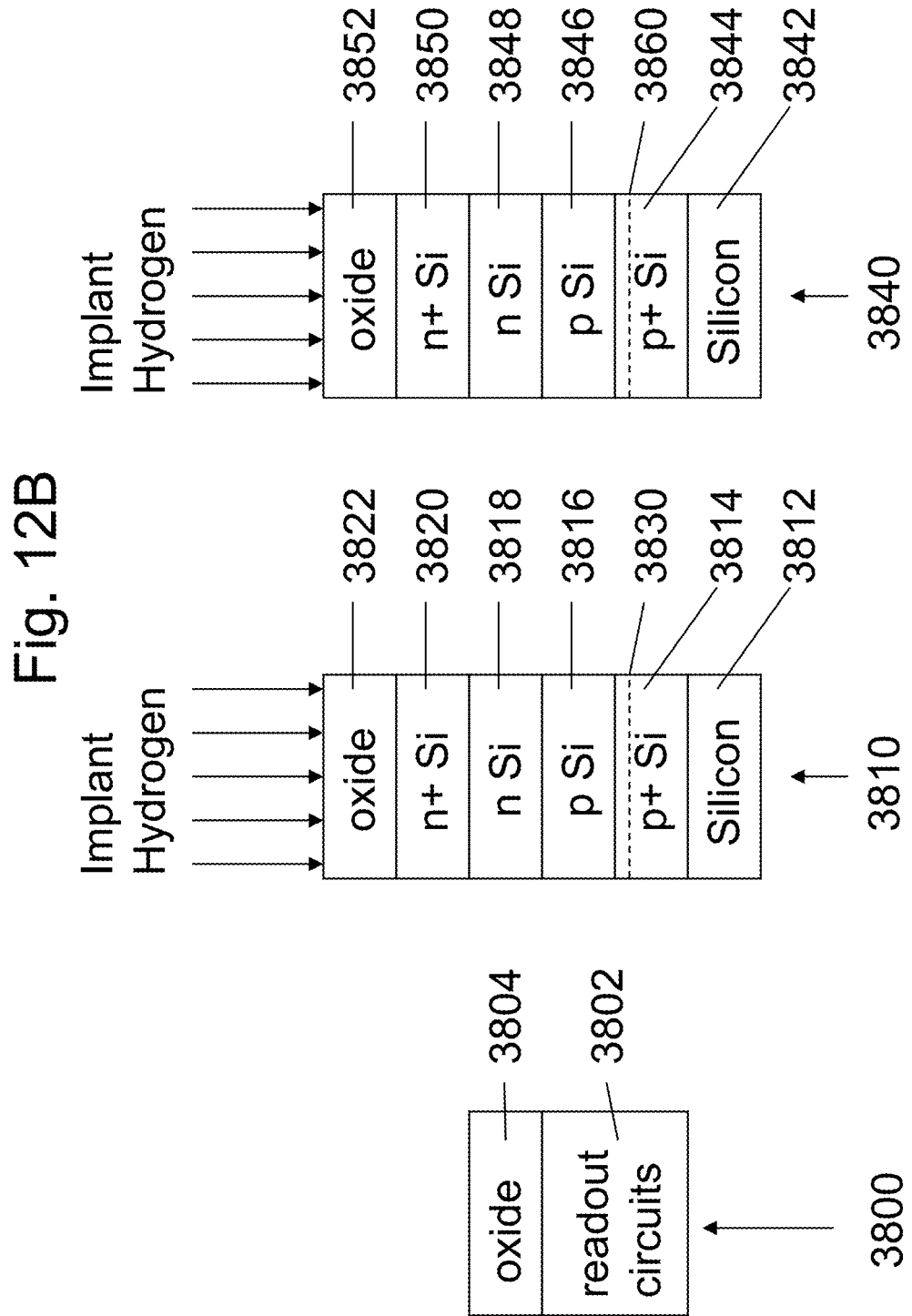

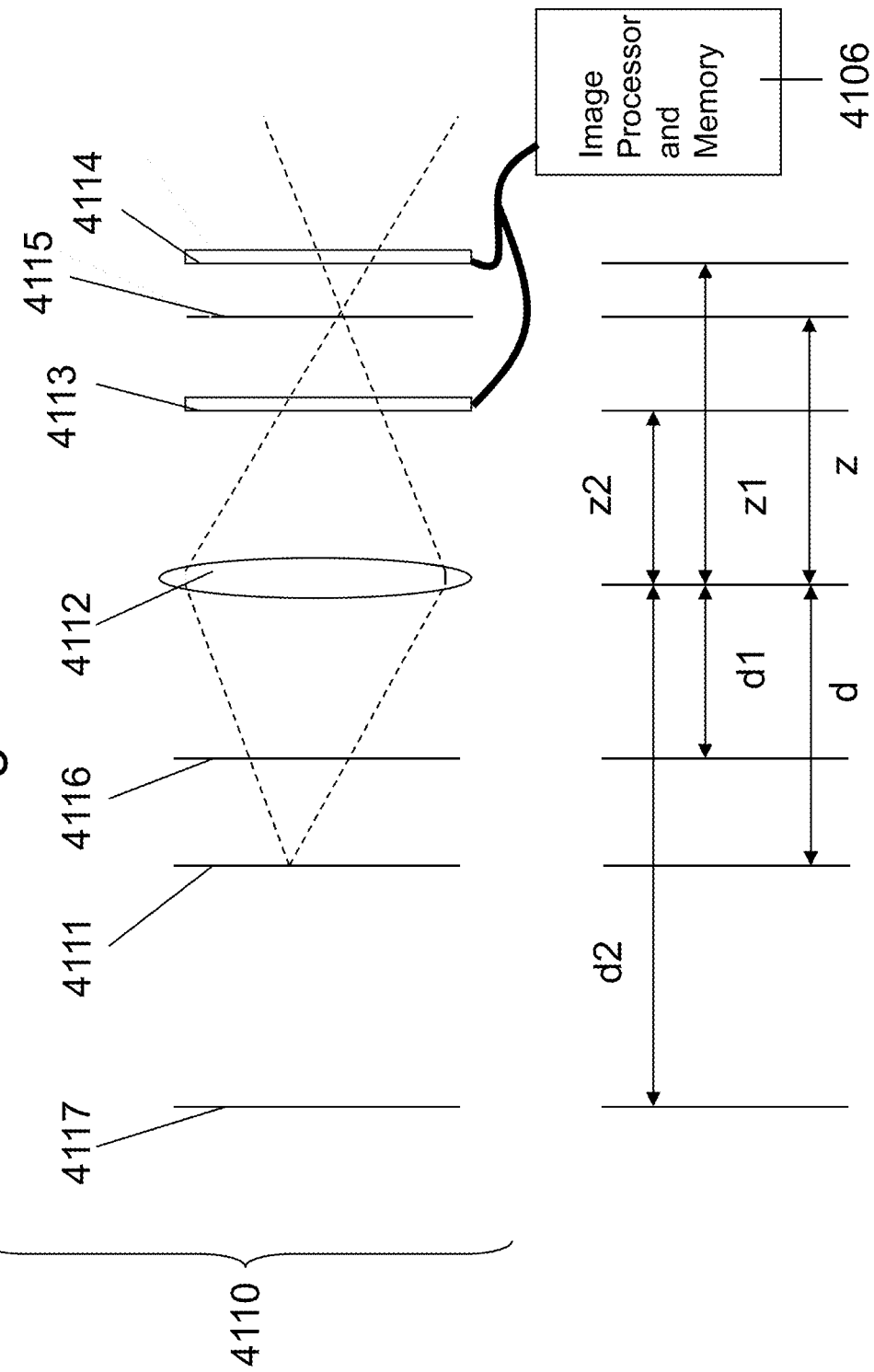

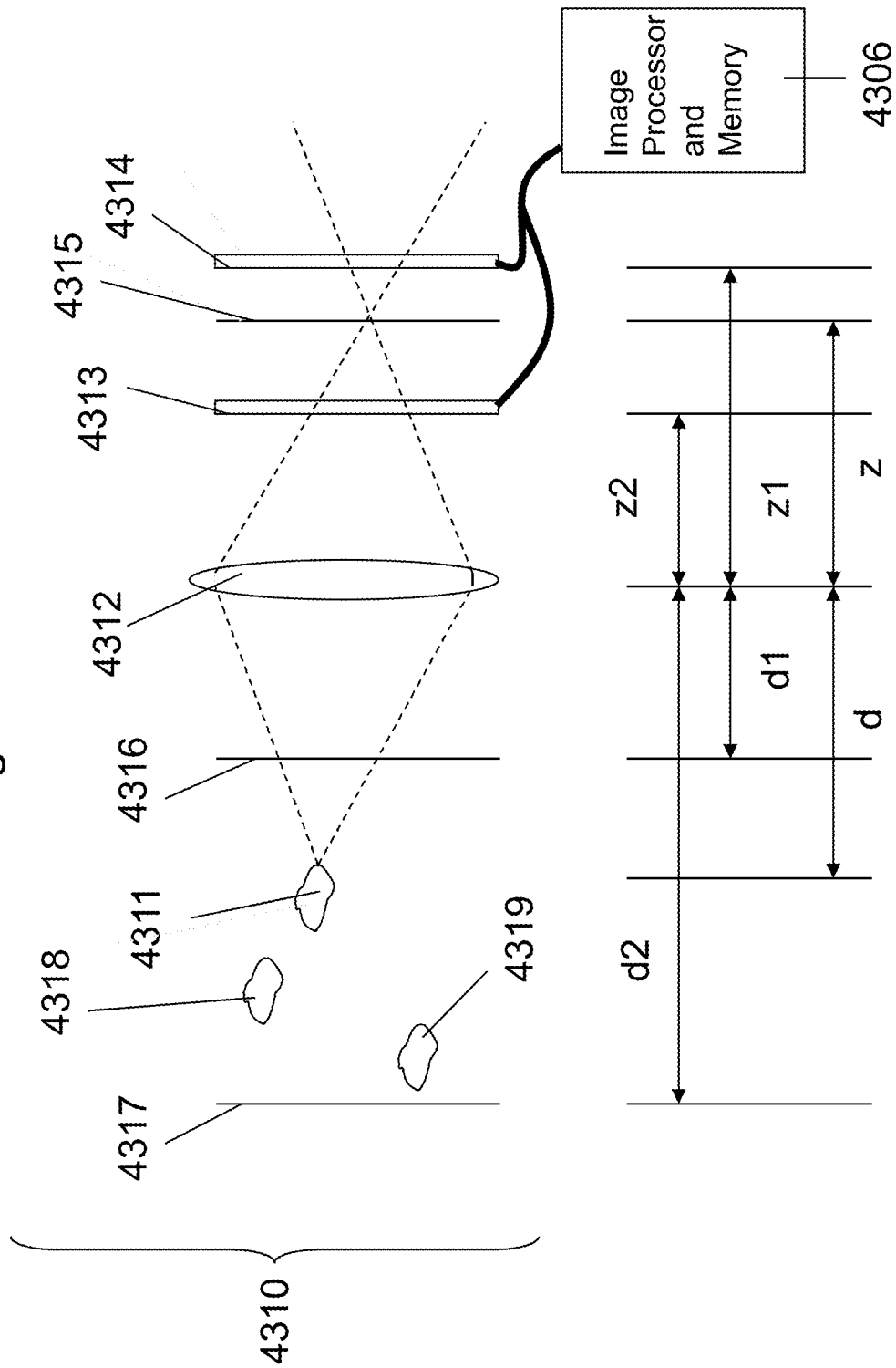

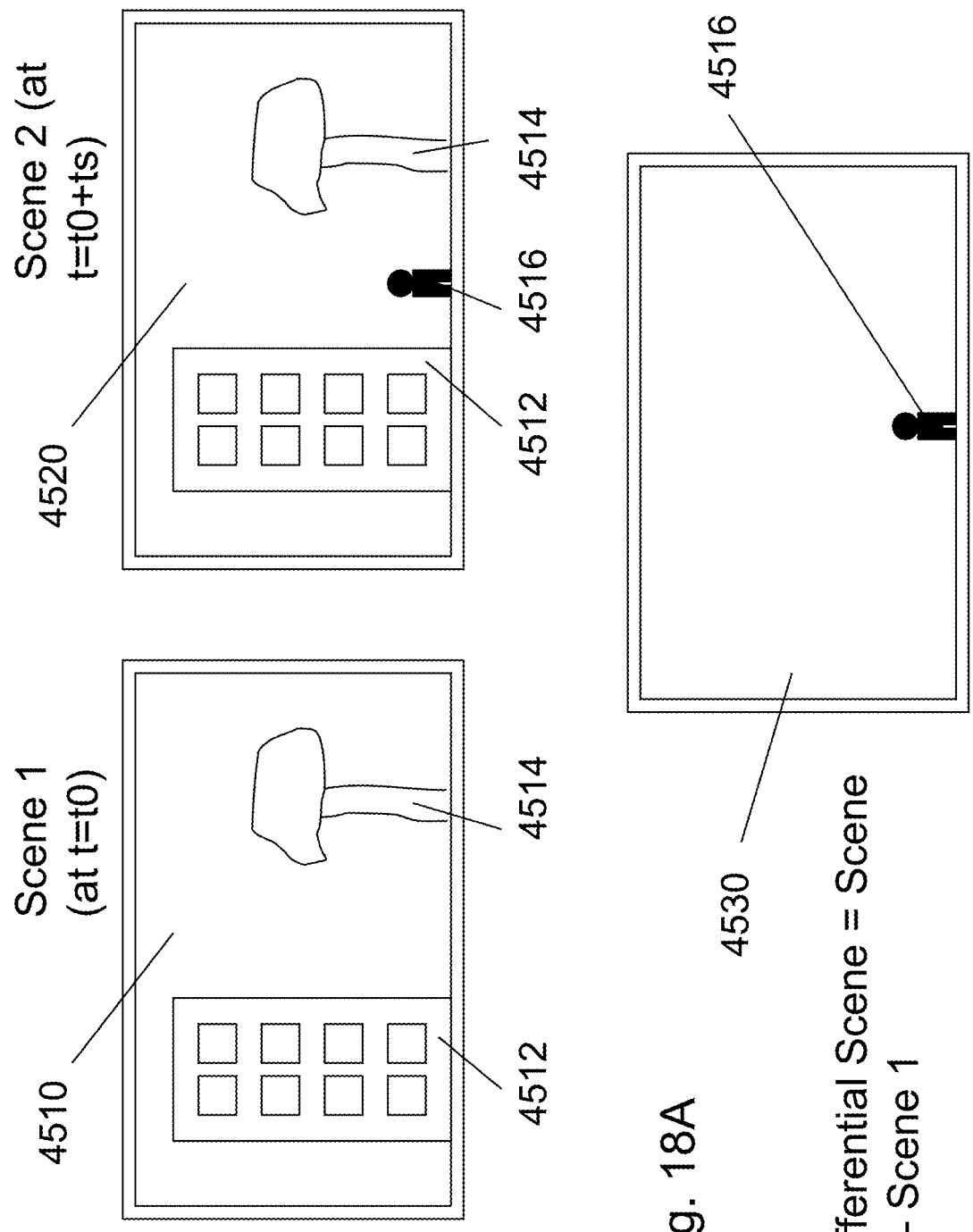

MULTILEVEL SEMICONDUCTOR DEVICE AND STRUCTURE WITH IMAGE SENSORS AND WAFER BONDING

CROSS-REFERENCE OF RELATED APPLICATION

This application is a continuation-in-part of U.S. patent application Ser. No. 18/432,035 filed on Feb. 4, 2024, which is a continuation-in-part of U.S. patent application Ser. No. 18/382,463 filed on Oct. 20, 2023, now U.S. Pat. No. 11,929,372 issued on Mar. 12, 2024; which is a continuation-in-part of U.S. patent application Ser. No. 18/141,975 filed on May 1, 2023, now U.S. Pat. No. 11,869,915 issued on Jan. 9, 2024; which is a continuation-in-part of U.S. patent application Ser. No. 18/105,881 filed on Feb. 6, 2023, now U.S. Pat. No. 11,855,114 issued on Dec. 26, 2023; which is a continuation-in-part of U.S. patent application Ser. No. 17/951,545 filed on Sep. 23, 2022, now U.S. Pat. No. 11,605,663 issued on Mar. 14, 2023; which is a continuation-in-part of U.S. patent application Ser. No. 17/844,687 filed on Jun. 20, 2022, now U.S. Pat. No. 11,488,997 issued on Nov. 1, 2022; which is a continuation-in-part of U.S. patent application Ser. No. 17/402,527 filed on Aug. 14, 2021, now U.S. Pat. No. 11,404,466 issued on Aug. 2, 2022; which is a continuation-in-part of U.S. patent application Ser. No. 17/317,894 filed on May 12. 2021, now U.S. Pat. No. 11,133,344 issued on Sep. 28, 2021; which is a continuation-in-part of U.S. patent application Ser. No. 17/143,956 filed on Jan. 7, 2021, now U.S. Pat. No. 11,043,523 issued on Jun. 22, 2021, which is a continuation-in-part of U.S. patent application Ser. No. 17/121,726 filed on Dec. 14, 2020, now U.S. Pat. No. 10,978,501 issued on Apr. 13, 2021; which is a continuation-in-part of U.S. patent application Ser. No. 17/027,217 filed on Sep. 21, 2020, now U.S. Pat. No. 10,943,934 issued on Mar. 9, 2021; which is a continuation-in-part of U.S. patent application Ser. No. 16/860,027 filed on Apr. 27, 2020, now U.S. Pat. No. 10,833,108 issued on Nov. 11, 2020; which is a continuation-in-part of U.S. patent application Ser. No. 15/920,499 filed on Mar. 14, 2018, now U.S. Pat. No. 10,679,977 issued on Jun. 9, 2020; which is a continuation-in-part of U.S. patent application Ser. No. 14/936,657 filed on Nov. 9, 2015, now U.S. Pat. No. 9,941,319 issued on Apr. 10, 2018; which is a continuation-in-part of U.S. patent application Ser. No. 13/274,161 filed on Oct. 14, 2011, now U.S. Pat. No. 9,197,804 issued on Nov. 24, 2015; and this application is a continuation-in-part of U.S. patent application Ser. No. 12/904,103 filed on Oct. 13, 2010, now U.S. Pat. No. 8,163,581 issued on Apr. 24, 2012; the entire contents of all of the preceding are incorporated herein by reference.

BACKGROUND OF THE INVENTION

(A) Field of the Invention

This invention describes applications of monolithic 3D integration to various disciplines, including but not limited to, for example, light-emitting diodes, displays, image-sensors and solar cells.

(B) Discussion of Background Art

Semiconductor and optoelectronic devices often require thin monocrystalline (or single-crystal) films deposited on a certain wafer. To enable this deposition, many techniques, generally referred to as layer transfer technologies, have been developed. These include:

(A) Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

(B) Porous silicon approaches such as ELTRAN: These are described in "Eltran, Novel SOI Wafer Technology", JSAP International, Number 4, July 2001 by T. Yonehara and K. Sakaguchi ("Yonehara").

(C) Lift-off with a temporary substrate, also referred to as epitaxial lift-off: This is described in "Epitaxial lift-off and its applications", 1993 Semicond. Sci. Technol. 8 1124 by P. Demeester, et al. ("Demeester").

(D) Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").

(E) Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Background on Image-Sensors

Image sensors are used in applications such as cameras. Red, blue, and green components of the incident light are sensed and stored in digital format. CMOS image sensors typically contain a photodetector and sensing circuitry. Almost all image sensors today have both the photodetector and sensing circuitry on the same chip. Since the area consumed by the sensing circuits is high, the photodetector cannot see the entire incident light, and image capture is not as efficient.

To tackle this problem, several researchers have proposed building the photodetectors and the sensing circuitry on separate chips and stacking them on top of each other. A publication that describes this method is "Megapixel CMOS image sensor fabricated in three-dimensional integrated circuit technology", Intl. Solid State Circuits Conference 2005 by Suntharalingam, V., Berger, R., et al. ("Suntharalingam"). These proposals use through-silicon via (TSV) technology where alignment is done in conjunction with bonding. However, pixel size is reaching the 1 µm range, and successfully processing TSVs in the 1 µm range or below is very difficult. This is due to alignment issues while bonding. For example, the International Technology Roadmap for Semiconductors (ITRS) suggests that the 2-4 µm TSV pitch will be the industry standard until 2012. A 2-4 μm pitch TSV will be too big for a sub-1 μm pixel. Therefore, novel techniques of stacking photodetectors and sensing circuitry are required.

A possible solution to this problem is given in "Setting up 3D Sequential Integration for Back-Illuminated CMOS Image Sensors with Highly Miniaturized Pixels with Low Temperature Fully-depleted SOI Transistors," IEDM, p. 1-4 (2008) by P. Coudrain et al. ("Coudrain"). In the publication, transistors are monolithically integrated on top of photodetectors. Unfortunately, transistor process temperatures reach 600° C. or more. This is not ideal for transistors (that require a higher thermal budget) and photodetectors (that may prefer a lower thermal budget).

Background on CCD Sensors

Image sensors based on Charge-Coupled Device (CCD) technology has been around for several decades. The CCD technology relies on a collect and shift scheme, wherein charges are collected in individual cells according to the luminosity of the light falling on each of them, then the charges are sequentially shifted towards one edge of the sensor where readout circuits read the sequence of charges one at a time.

The advantage of CCD technology is it has better light sensitivity since almost the entire CCD cell area is dedicated to light collecting, and the control and readout circuits are all on one edge not blocking the light. On the other hand, in a CMOS sensor, the photodiodes in each cell have to share space with the control and readout circuits adjacent to them, and so their size and light sensitivity are therefore limited.

The main issue with CCD technology is this sequential shifting of image information from cell to cell is slow and limits the speed and cell density of CCD image sensors. A potential solution is to put the readout circuits directly under each CCD cell, so that the information is read in parallel rather than in time sequence, thus removing the shifting delay entirely.

Background on High Dynamic Range (HDR) Sensors

Ever since the advent of commercial digital photography in the 1990s, achieving High Dynamic Range (HDR) imaging has been a goal for most camera manufacturers in their image sensors. The idea is to use various techniques to compensate for the lower dynamic range of image sensors relative to the human eye. The concept of HDR however, is not new. Combining multiple exposures of a single image to achieve a wide range of luminosity was actually pioneered in the 1850s by Gustave Le Gray to render seascapes showing both the bright sky and the dark sea. This was necessary to produce realistic photographic images as the film used at that time had exptremely low dynamic range compared to the human eye.

In digital cameras, the typical approach is to capture images using exposure bracketing, and then combining them into a single HDR image. The issue with this is that multiple exposures are performed over some period of time, and if there is movement of the camera or target during the time of the exposures, the final HDR image will reflect this by loss of sharpness. Moreover, multiple images may lead to large data in storage devices. Other methods use software algorithms to extract HDR information from a single exposure, but as they can only process information that is recordable by the sensor, there is a permanent loss of some details.

SUMMARY

In another aspect, a method using layer transfer for fabricating a CCD sensor with readout circuits underneath so as to collect image data from each cell in parallel, thus eliminating the shifting delay inherent in the traditional CCD charge transfer sequencing scheme.

In another aspect, a method using layer transfer for fabricating an image sensor consisting of one layer of photo-detectors with small light-sensitive areas, stacked on top of another layer of photo-detectors with larger light-sensitive areas.

In another aspect, a method using layer transfer for fabricating two image sensor arrays monolithically stacked on top of each other with an insulating layer between them and underlying control, readout, and memory circuits.

In another aspect, algorithms for reconstructing objects from images detected by a camera which includes a lens and two image sensor arrays of distinct distances from the lens.

In another aspect, a gesture remote control system using images detected by a camera which includes a lens and two image sensor arrays of distinct distances from the lens.

In another aspect, a surveillance camera system using images detected by a camera which includes a lens and two image sensor arrays of distinct distances from the lens.

In another aspect, a method of constructing a camera which includes a lens and two image sensor arrays of distinct effective distances from the lens, wherein images from the lens are split between the two image sensors by a beam-splitter.

In another aspect, a method of constructing a camera which includes a lens, an image sensor array, and a fast motor, wherein the fast motor actuates the image sensor's position relative to the lens so as to record images from the lens at distinct effective distances from the lens.

In another aspect, a camera system including, a first image sensor array and a second image sensor array wherein the first image sensor array is designed for a first focal plane in front of the camera, and the second image sensor array is designed for a second focal plane in front of the camera, wherein the distance to the first focal plane is substantially different than the distance to the second focal plane.

In another aspect, a camera system including, an image sensor sub system and a memory subsystem and a control subsystem wherein the camera is designed wherein the image sensor can provide the memory of at least a first image and a second image for the same scene in front of the camera, wherein the first image is for a first focal plane in front of the camera, and the second image is for a second focal plane in front of the camera, wherein the distance to the first focal plane is substantially different than the distance to the second focal plane.

In another aspect, a camera system including, a first image sensor array and a second image sensor array wherein the first image sensor array includes a first mono-crystallized silicon layer, and the second image sensor array includes a second mono-crystallized silicon layer, wherein between the first mono-crystallized silicon layer and second mono-crystallized silicon layer there is a thin isolation layer, wherein through the thin isolation layer there are a multiplicity conducting vias wherein the conducting vias radius is less than 400 nm.

In another aspect, a camera system including, a first image sensor array and a second image sensor array wherein the first image sensor array includes a first mono-crystallized silicon layer, and the second image sensor array includes a second mono-crystallized silicon layer, wherein between the first mono-crystallized silicon layer and second mono-crystallized silicon layer there is a thin isolation layer, wherein the second mono-crystallized silicon layer thickness is less than 400 nm.

In another aspect, an integrated device, the device comprising: a first level comprising a first mono-crystal layer, said first mono-crystal layer comprising a plurality of single crystal transistors and alignment marks; an overlaying oxide on top of said first level; a second level comprising a second mono-crystal layer, said second level overlaying said oxide, wherein said second mono-crystal layer comprises a plurality of first image sensors; and a third level overlaying said second level, wherein said third level comprises a plurality of second image sensors, wherein said second level is aligned to said alignment marks, wherein said second level is bonded to said first level, and wherein said bonded comprises an oxide to oxide bond.

In another aspect, an integrated device, the device comprising: a first level comprising a first mono-crystal layer, said first mono-crystal layer comprising a plurality of single crystal transistors and alignment marks; an overlaying oxide on top of said first level; a second level comprising a second mono-crystal layer, said second level overlaying said oxide, wherein said second mono-crystal layer comprises a plurality of first image sensors; and a third level overlaying said second level, wherein said third level comprises a plurality of second image sensors, and wherein said second level is bonded to said first level.

In another aspect, an integrated device, the device comprising: a first level comprising a first mono-crystal layer, said first mono-crystal layer comprising a plurality of single crystal transistors and alignment marks; an overlaying oxide on top of said first level; a second level comprising a second mono-crystal layer, said second level overlaying said oxide, wherein said second mono-crystal layer comprises a plurality of first image sensors; and a third level overlaying said second level, wherein said third level comprises a plurality of second image sensors, and wherein said second level is bonded to said first level.

In another aspect, an integrated device, the device comprising: a first level comprising a first mono-crystal layer, said first mono-crystal layer comprising a plurality of single crystal transistors; an overlaying oxide on top of said first level; a second level comprising a second mono-crystal layer, said second level overlaying said oxide, wherein said second mono-crystal layer comprises a plurality of first image sensors; and a third level overlaying said second level, wherein said third level comprises a plurality of second image sensors, wherein said second level is bonded to said first level, wherein said bonded comprises an oxide to oxide bond; and an isolation layer disposed between said second mono-crystal layer and said third level.

In another aspect, an integrated device, the device including: a first level including a first mono-crystal layer, the first level including a plurality of single crystal transistors; an overlaying oxide on top of the first level; a second level including a second mono-crystal layer, the second level overlaying the oxide, where the second mono-crystal layer includes a plurality of first image sensors; and a third level overlaying the second level, where the third level includes a plurality of second image sensors, and where the second level is bonded to the first level.

In another aspect, an integrated device, the device including: a first level including a first mono-crystal layer, where the first mono-crystal layer includes a plurality of single crystal transistors; an overlying oxide on top of the first level; a second level including a second mono-crystal layer, the second level overlaying the oxide; a third level overlaying the second level, where the third level includes a third mono-crystal layer including a plurality of image sensors, where the second level is bonded to the first level, and where the bonded includes oxide to oxide bonds; and an isolation layer disposed between the second mono-crystal layer and the third level.

In another aspect, an integrated device, the device including: a first level including a first mono-crystal layer, the first mono-crystal layer including a plurality of single crystal transistors; an overlaying oxide on top of the first level; a second level including a second mono-crystal layer, the second level overlaying the oxide, where the second mono-crystal layer includes a plurality of semiconductor devices; a third level overlaying the second level, where the third level includes a plurality of image sensors, where the second level is bonded to the first level, where the bonded includes an oxide to oxide bond; and an isolation layer disposed between the second mono-crystal layer and the third level.

In another aspect, an integrated device, the device including: a first level including a first mono-crystal layer, the first mono-crystal layer including a plurality of single crystal transistors; an overlaying oxide on top of the first level; a second level including a second mono-crystal layer, the second level overlaying the oxide, where the second mono-crystal layer includes a plurality of semiconductor devices; a third level overlaying the second level, where the third level includes a plurality of image sensors, where the device includes a plurality of recessed channel transistors, where the second level is bonded to the first level, where the bonded includes an oxide to oxide bond; and an isolation layer disposed between the second mono-crystal layer and the third level.

In another aspect, an integrated device, the device including: a first level including a first mono-crystal layer, the first mono-crystal layer including a plurality of single crystal transistors; an overlaying oxide on top of the first level; a second level including a second mono-crystal layer, the second level overlaying the oxide, where the second mono-crystal layer includes a plurality of semiconductor devices; a third level overlaying the second level, where the third level includes a plurality of image sensors, where the device includes memory circuits, where the second level is bonded to the first level, where the bonded includes an oxide to oxide bond; and an isolation layer disposed between the second mono-crystal layer and the third level.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of semiconductor devices; a third level overlaying the second level, where the third level includes a plurality of image sensors, where the first level includes a plurality of landing pads, where the second level is bonded to the first level, where the bonded includes an oxide to oxide bond; and an isolation layer disposed between the second mono-crystal layer and the third level.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of semiconductor devices; a third level overlaying the second level, where the third level includes a plurality of image sensors, where the second level is bonded to the first level, where at least one of the image sensors is directly connected to at least one of the plurality of pixel control circuits, where the bonded includes an oxide to oxide bond; and an isolation layer disposed between the second mono-crystal layer and the third level.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of semiconductor devices; a third level overlaying the second level, where the third level includes a plurality of image sensors, where the device includes memory circuits, where the second level is bonded to the first level, where the third level includes a third mono-crystal layer, where the bonded includes an oxide to oxide bond; and an isolation layer disposed between the second mono-crystal layer and the third level.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level, where the bonded includes an oxide to oxide bond; and a plurality of pixel control circuits, where each of the plurality of image sensors is directly connected to at least one of the plurality of pixel control circuits.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level, where the bonded includes an oxide to oxide bond, and where the integrated device includes a plurality of recessed channel transistors.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level, where the bonded includes an oxide to oxide bond, and where the integrated device includes a plurality of memory systems.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level, where the bonded includes an oxide to oxide bond; and a plurality of pixel control circuits, where each of the plurality of image sensors is directly connected to at least one of the plurality of pixel control circuits, and where the integrated device includes a plurality of memory circuits.

In another aspect, an integrated device, the device including: a first level including a first mono-crystal layer, the first mono-crystal layer including a plurality of single crystal transistors; an overlying oxide disposed on top of the first level; and a second level including a second mono-crystal layer, the second level overlaying the oxide, where the second mono-crystal layer includes a plurality of image sensors, where the second level is bonded to the first level, where the bonded includes an oxide to oxide bond, where the integrated device includes a plurality of memory circuits, and where the integrated device includes a plurality of recessed channel transistors.

In another aspect, an integrated device, the device including: a first level including a first mono-crystal layer, the first mono-crystal layer including a plurality of single crystal transistors; an overlying oxide disposed on top of the first level; and a second level including a second mono-crystal layer, the second level overlaying the oxide, where the second mono-crystal layer includes a plurality of image sensors, where the second level is bonded to the first level, where the bonded includes an oxide to oxide bond, and where the integrated device includes a plurality of memory circuits.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level with an oxide to oxide bond; a plurality of pixel control circuits; a plurality of memory circuits; and a third level disposed underneath the first level, where the third level includes a plurality of third transistors.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the plurality of image sensors are aligned to the plurality of single crystal transistors with a less than 400 nm alignment error, where the second level is bonded to the first level with an oxide to oxide bond; and a plurality of memory circuits.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide; a plurality of through layer vias, where a diameter the plurality of through layer vias is less than 400 nm, where the second mono-crystal layer includes a plurality of image sensors, where the second level is bonded to the first level with an oxide to oxide bond; and a plurality of memory circuits.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level including an oxide to oxide bond; a plurality of pixel control circuits; a third level disposed underneath the first level, where the third level includes a plurality of third transistors, where the plurality of third transistors each include a single crystal channel; and a plurality of memory circuits.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the plurality of image sensors are aligned to the plurality of single crystal transistors with a less than 400 nm alignment error, where the second level is bonded to the first level including an oxide to oxide bond; a plurality of memory circuits; and a carrier wafer used for processing of the device.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide; a plurality of through layer vias, where a diameter of the plurality of through layer vias is less than 400 nm, where the second mono-crystal layer includes a plurality of image sensors, where the second level is bonded to the first level including an oxide to oxide bond; where the plurality of image sensors are aligned to the plurality of single crystal transistors with a less than 400 nm alignment error, and a plurality of memory circuits.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level including an oxide to oxide bond; a plurality of pixel control circuits; a third level disposed underneath the first level, where the third level includes a plurality of third transistors, where the plurality of third transistors each include a single crystal channel; and a plurality of recessed channel transistors.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level including an oxide to oxide bond; a plurality of pixel control circuits; a third level disposed underneath the first level, where the third level includes a plurality of third transistors, where the plurality of third transistors each include a single crystal channel; and a plurality of metal gate transistors.

In another aspect, an integrated device, the device including: a first level including a first mono-crystal layer, the first mono-crystal layer including a plurality of single crystal transistors; an overlying oxide disposed on top of the first level; a second level including a second mono-crystal layer, the second level overlaying the oxide, where the second mono-crystal layer includes a plurality of image sensors, where the second level is bonded to the first level including an oxide to oxide bond; a plurality of pixel control circuits; a third level disposed underneath the first level, where the third level includes a plurality of third transistors, where the plurality of third transistors each include a single crystal channel, and where the plurality of image sensors is aligned to the plurality of single crystal transistors with a less than 600 nm alignment error; and a plurality of recessed channel transistors.

BRIEF DESCRIPTION OF THE DRAWINGS

Various embodiments of the invention will be understood and appreciated more fully from the following detailed description, taken in conjunction with the drawings in which:

FIG. 7A-7B illustrate an embodiment of this invention, where an image sensor that can detect both visible and infra-red light without any loss of resolution is constructed;

FIG. 10C-10G illustrate an embodiment of this invention where arrays of modulators are monolithically stacked using layer transfer processes;

FIG. 11C-11F illustrate an embodiment of this invention where a CCD sensor is monolithically stacked onto its control circuits using layer transfer, allowing for parallel readout of sensor data;

FIG. 12A-12D illustrate an embodiment of this invention where an image sensor with three layers is monolithically stacked, the first layer with photo-detectors of smaller light-sensitive region, the second layer with photo-detectors of larger light-sensitive region, and the third layer with readout circuits to collect sensor data;

FIG. 14A-14D illustrate an embodiment of this invention, where algorithms are described to reconstruct an object at a given distance from the lens imaged by a camera system that includes a lens and two image sensor arrays parallel to each other and to the lens, wherein each sensor array is of distinct distance from the lens;

FIG. 16A-16B illustrate an embodiment of this invention, where an algorithm is described to reconstruct multiple objects of unknown distances from the lens imaged by a camera system that includes a lens and two image sensor arrays parallel to each other and to the lens, wherein each sensor array is of distinct distance from the lens;

FIG. 18A-18B illustrate an embodiment of this invention, where a surveillance system tracks dynamic objects which are reconstructed by a camera system that includes a lens and two image sensor arrays parallel to each other and to the lens, where each sensor array is of distinct distance from the lens. An algorithm is described to time-step through multiple images and subtract images of static objects;

DETAILED DESCRIPTION

Embodiments of the present invention are now described with reference to FIGS. 1-19, it being appreciated that the figures illustrate the subject matter not to scale or to measure.

NuImager Technology

Layer transfer technology can also be advantageously utilized for constructing image sensors. Image sensors typically include photodetectors on each pixel to convert light energy to electrical signals. These electrical signals are sensed, amplified and stored as digital signals using transistor circuits.

Figure 1:
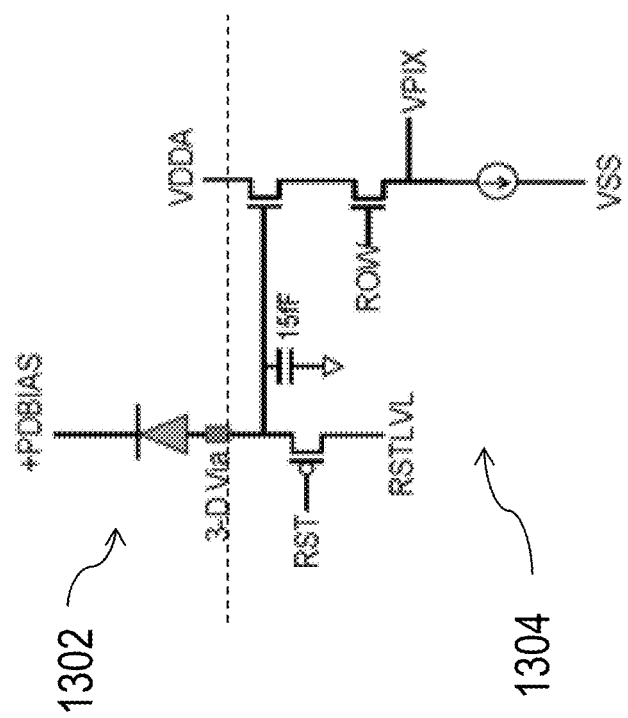
FIG. 1 illustrates a prior art image sensor stacking technology where connections between chips are aligned during bonding.

FIG. 1 shows prior art where through-silicon via (TSV) technology is utilized to connect photodetectors 1302 on one layer (tier) of silicon to transistor read-out circuits 1304 on another layer (tier) of silicon. Unfortunately, pixel sizes in today's image sensors are 1.1 μm or so. It is difficult to get through-silicon vias with size <1 μm due to alignment problems, leading to a diminished ability to utilize through-silicon via technology for future image sensors. In FIG. 1, essentially, transistors can be made for read-out circuits in one wafer, photodetectors can be made on another wafer, and then these wafers can be bonded together with connections made with through-silicon vias.

Figure 2:
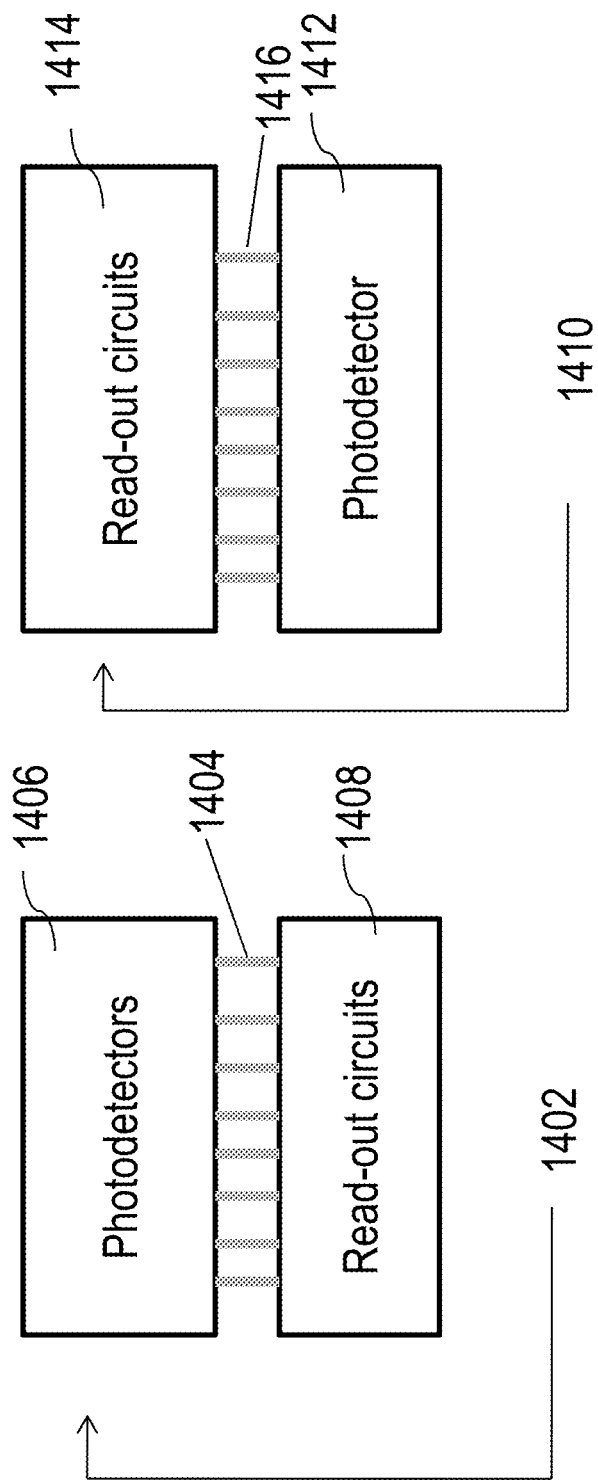
FIG. 2 describes two configurations for stacking photo-detectors and read-out circuits.

FIG. 2-9 describe some embodiments of this invention, where photodetector and read-out circuits are stacked monolithically with layer transfer. FIG. 2 shows two configurations for stacking photodetectors and read-out circuits. In one configuration, denoted as 1402, a photodetector layer 1406 is formed above read-out circuit layer 1408 with connections 1404 between these two layers. In another configuration, denoted as 1410, photodetectors 1412 may have read-out circuits 1414 formed above them, with connecting 1416 between these two layers.

FIG. 3A-3H describe an embodiment of this invention, where an image sensor includes a photodetector layer formed atop a read-out circuit layer using layer transfer. In this document, the photodetector layer is denoted as a p-n junction layer. However, any type of photodetector layer, such as a pin layer or some other type of photodetector can be used. The thickness of the photodetector layer is typically less than 5 μm. The process of forming the image sensor could include several steps that occur in a sequence from Step (A) to Step (H). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 3A:
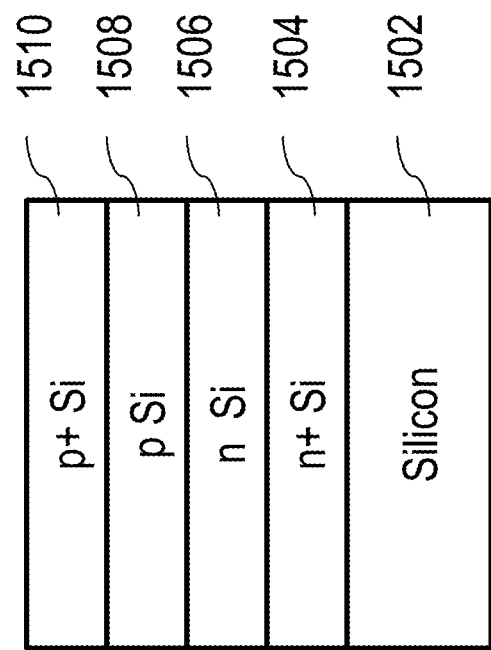
FIG. 3A-3H illustrate an embodiment of this invention, where a CMOS image sensor is formed by stacking a photodetector monolithically on top of read-out circuits using ion-cut technology.

Step (A) is illustrated in FIG. 3A. A silicon wafer 1502 is taken and a n+ Silicon layer 1504 is ion implanted. Following this, n layer 1506, p layer 1508 and p+ layer 1510 are formed epitaxially. It will be appreciated by one skilled in the art based on the present disclosure that there are various other procedures to form the structure shown in FIG. 3A. An anneal is then performed to activate dopants in various layers.

Figure 3B:
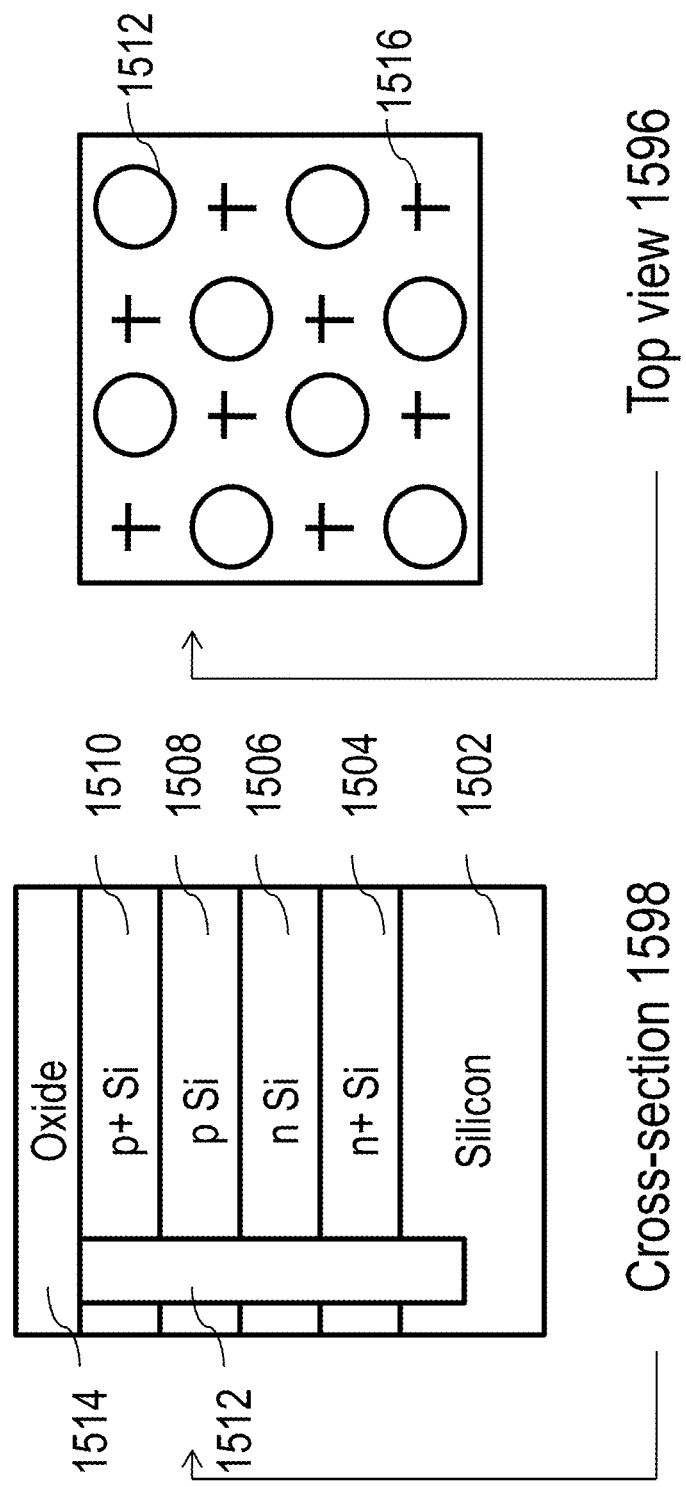

Step (B) is illustrated in FIG. 3B. Various elements in FIG. 3B such as 1502, 1504, 1506, 1508 and 1510 have been described previously. Using lithography and etch, a via is etched into the structure shown in FIG. 3A, filled with oxide and polished with CMP. The regions formed after this process are the oxide filled via 1512 and the oxide layer 1514. The oxide filled via 1512 may also be referred to as an oxide via or an oxide window region or oxide aperture. A cross-section of the structure is indicated by 1598 and a top view is indicated by 1596. 1516 indicates alignment marks and the oxide filled via 1512 is formed in place of some of the alignment marks printed on the wafer.

Figure 3C:
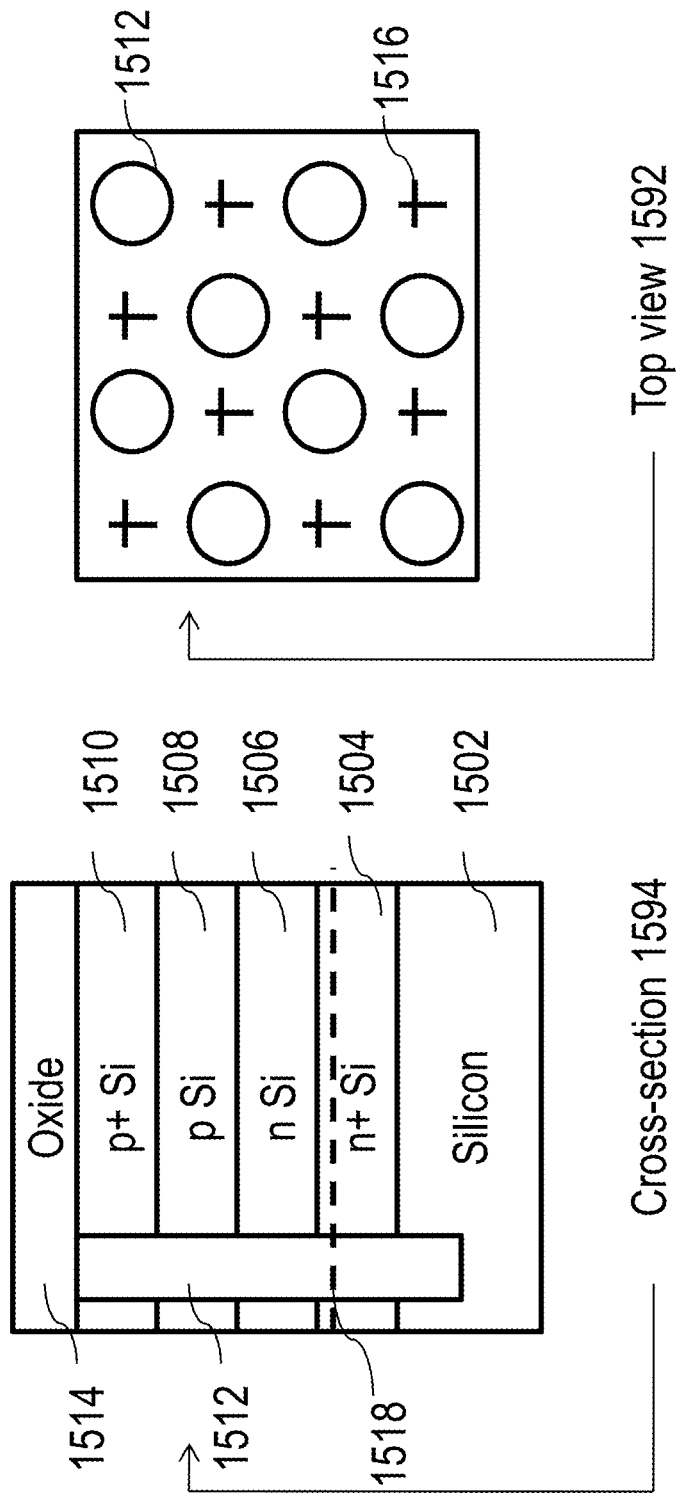

Step (C) is illustrated in FIG. 3C. Various elements in FIG. 3C such as 1502, 1504, 1506, 1508, 1510, 1512, 1514, and 1516 have been described previously. Hydrogen is implanted into the structure indicated in FIG. 3B at a certain depth indicated by dotted lines 1518 of FIG. 3C. Alternatively, Helium can be used as the implanted species. A cross-sectional view 1594 and a top view 1592 are shown.

Figure 3D:
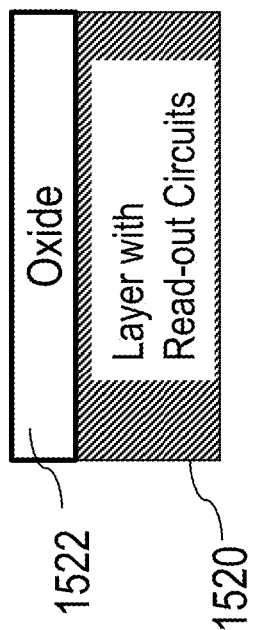

Step (D) is illustrated in FIG. 3D. A silicon wafer 1520 with read-out circuits (which includes wiring) processed on it is taken, and an oxide layer 1522 is deposited above it.

Figure 3E:
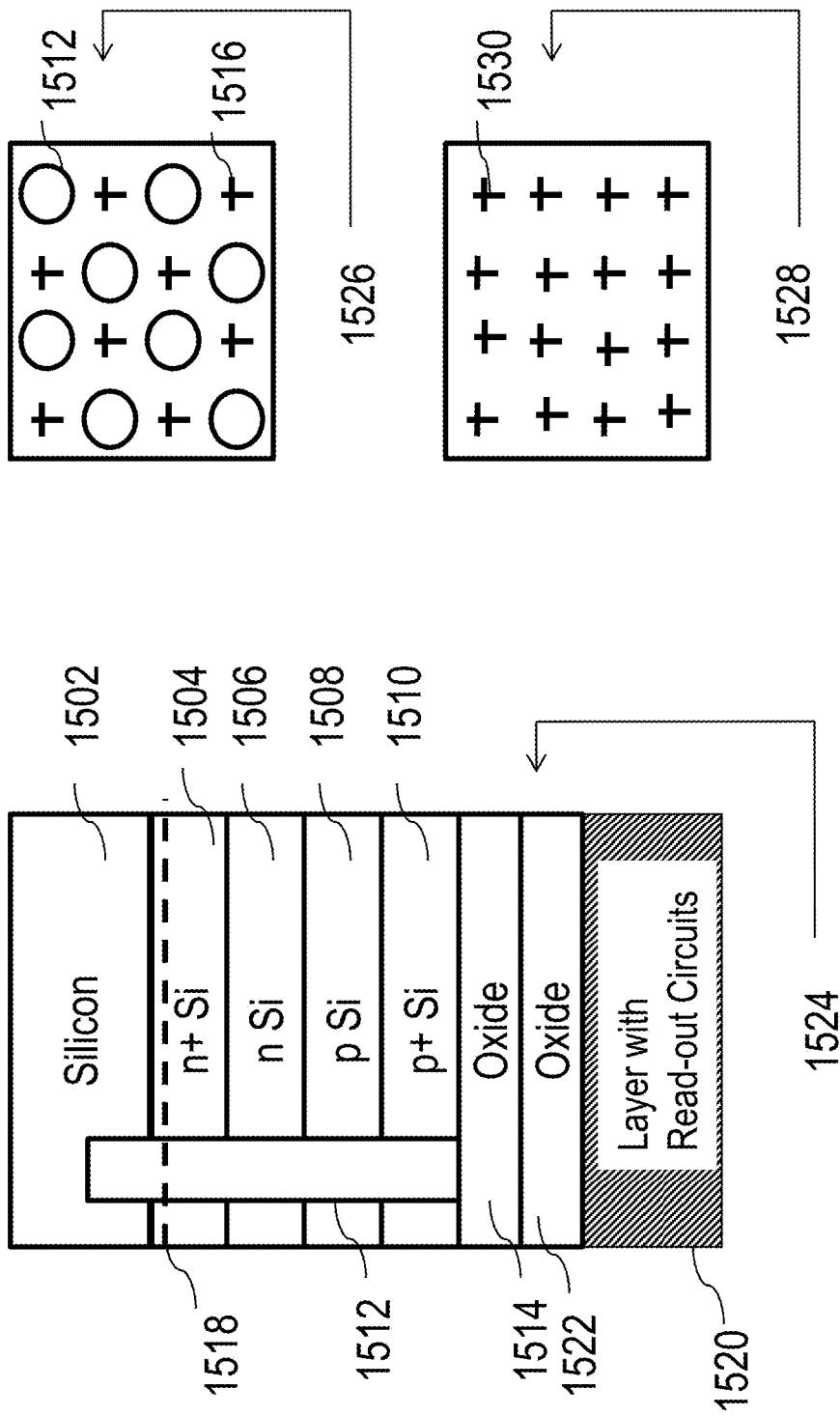

Step (E) is illustrated in FIG. 3E. The structure shown in FIG. 3C is flipped and bonded to the structure shown in FIG. 3D using oxide-to-oxide bonding of oxide layers 1514 and 1522. During this bonding procedure, alignment is done such that oxide vias 1512 (shown in the top view 1526 of the photodetector wafer) are above alignment marks (such as 1530) on the top view 1528 of the read-out circuit wafer. A cross-sectional view of the structure is shown with 1524. Various elements in FIG. 3E such as 1502, 1504, 1506, 1508, 1510, 1512, 1514, 1516, 1518, 1520, and 1522 have been described previously.

Figure 3F:
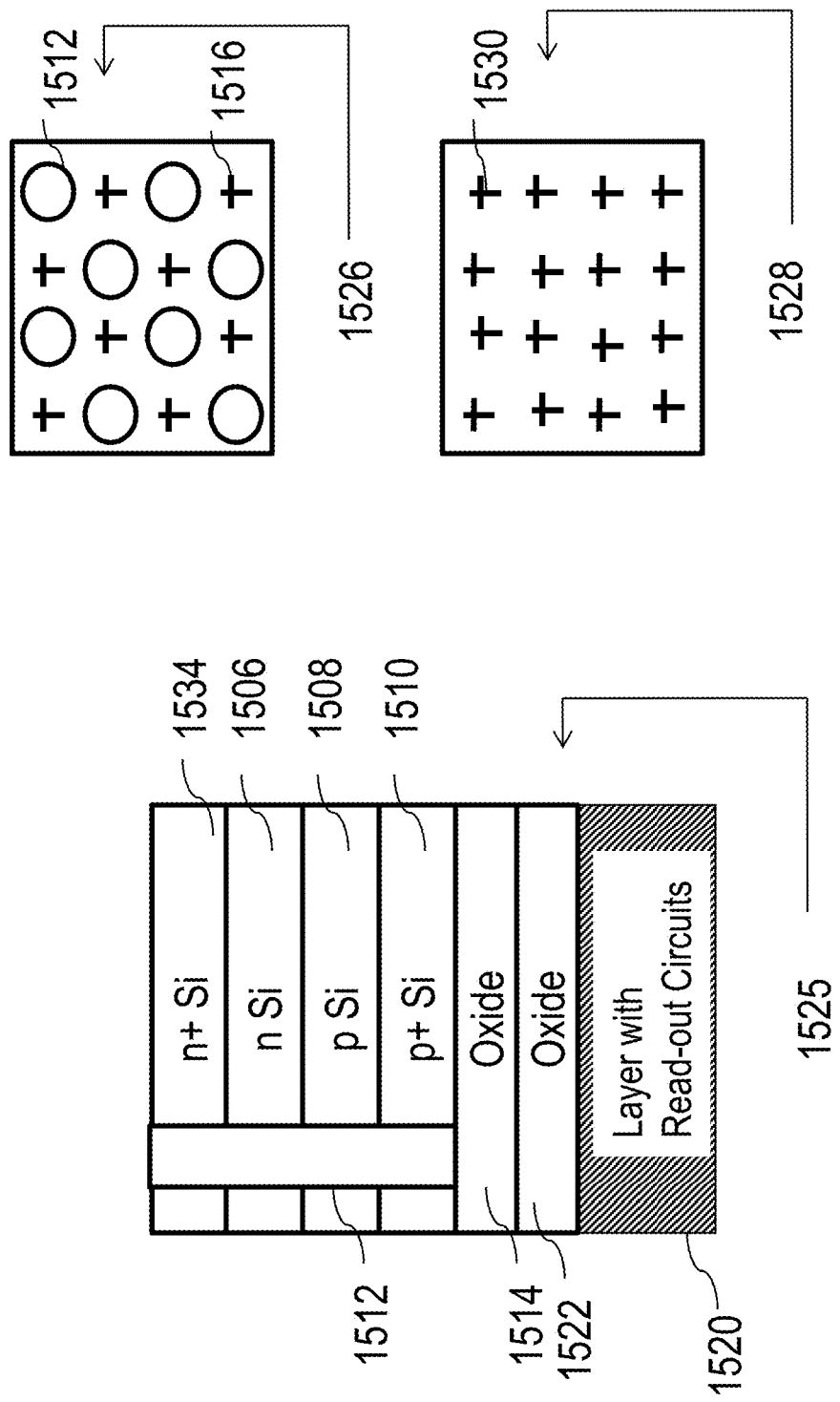

Step (F) is illustrated in FIG. 3F. The structure shown in FIG. 3E may be cleaved at its hydrogen plane 1518 preferably using a mechanical process. Alternatively, an anneal could be used for this purpose. A CMP process may be then done to planarize the surface resulting in a final n+ silicon layer indicated as 1534. 1525 depicts a cross-sectional view of the structure after the cleave and CMP process.

Various elements in FIG. 3F such as 1506, 1508, 1510, 1512, 1514, 1516, 1518, 1520, 1526, 1524, 1530, 1528, 1534 and 1522 have been described previously.

Figure 3G:
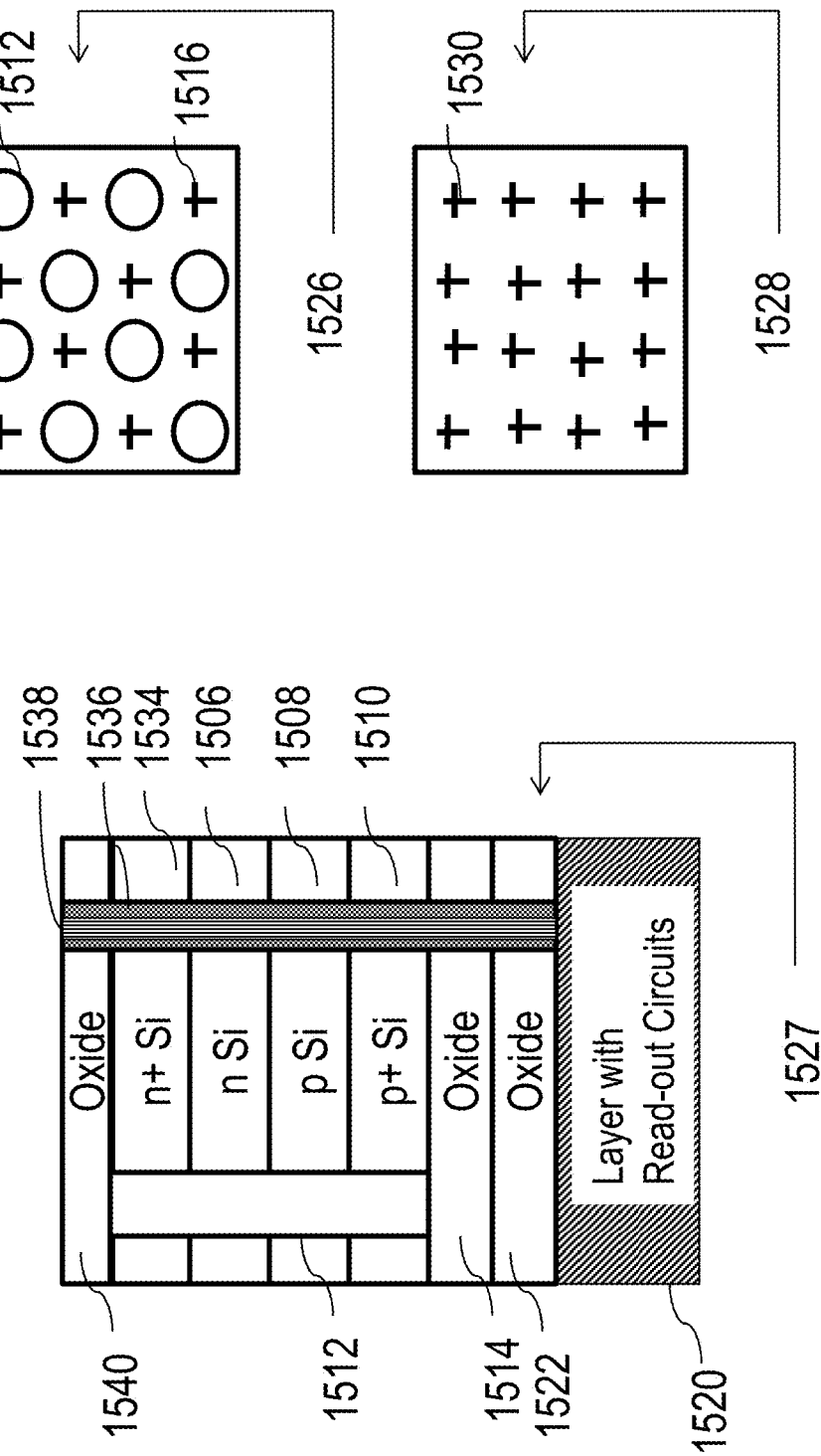

Step (G) is illustrated using FIG. 3G. Various elements in FIG. 3G such as 1506, 1508, 1510, 1512, 1514, 1516, 1518, 1520, 1526, 1524, 1530, 1528, 1534 and 1522 have been described previously. An oxide layer 1540 is deposited. Connections between the photodetector and read-out circuit wafers are formed with metal 1538 and an insulator covering 1536. These connections are formed well aligned to the read-out circuit layer 1520 by aligning to alignment marks 1530 on the read-out circuit layer 1520 through oxide vias 1512. 1527 depicts a cross-sectional view of the structure.

Figure 3H:
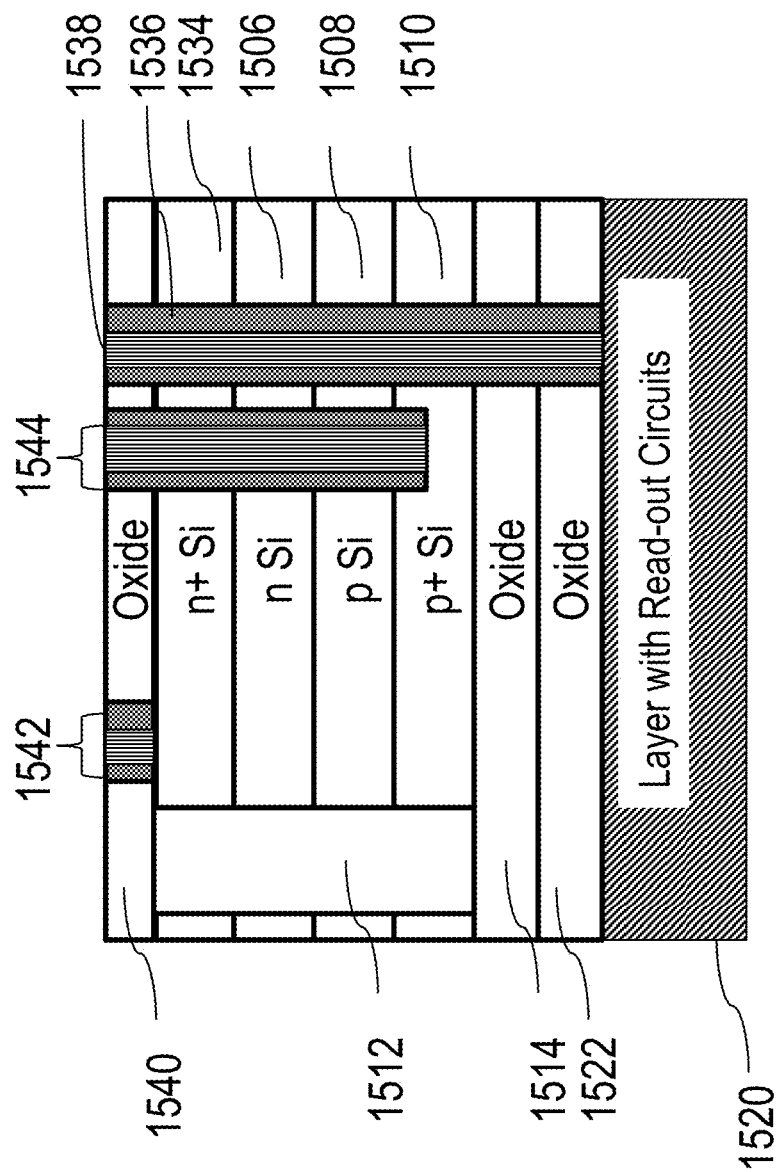
Figure 4:
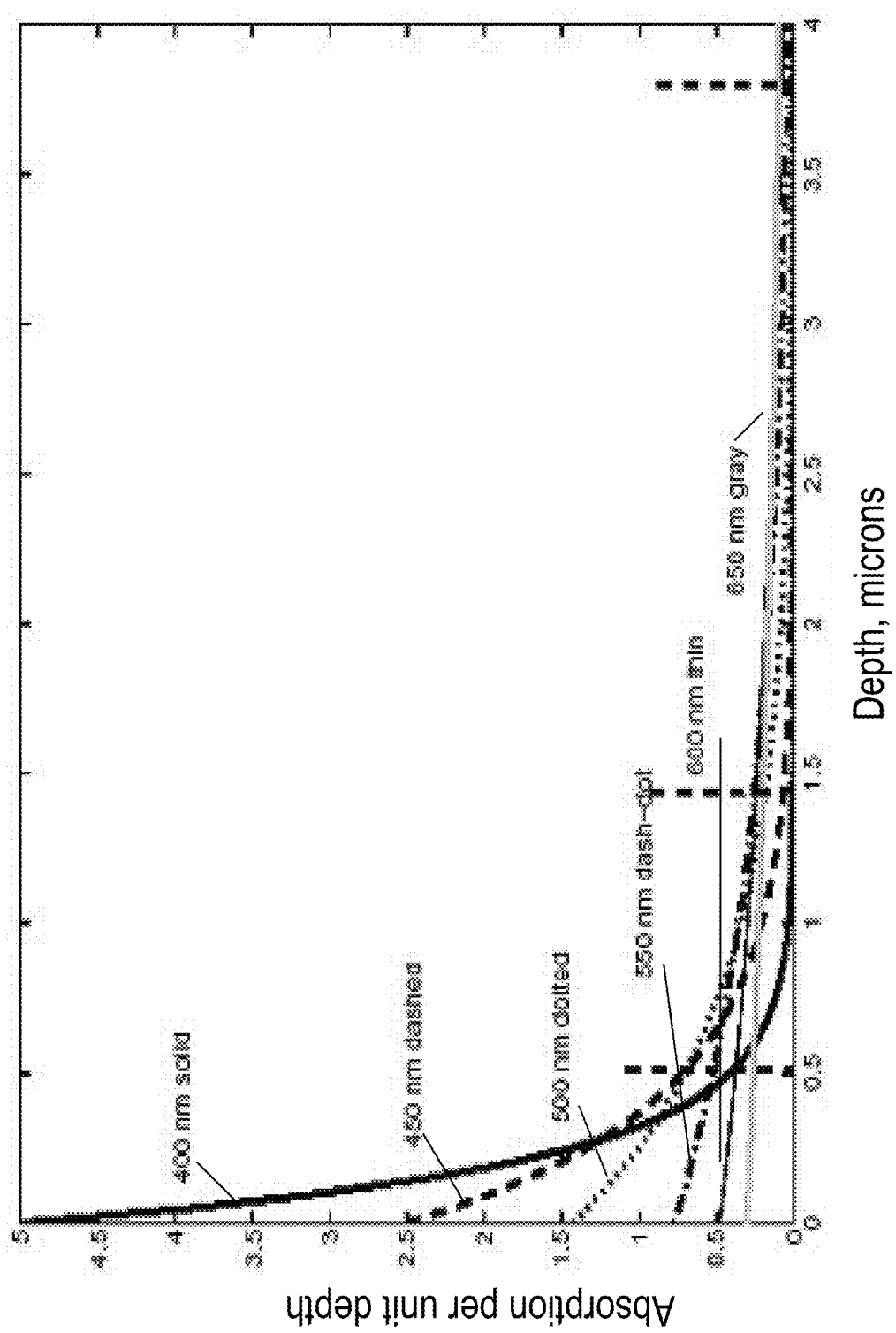
FIG. 4 illustrates the absorption process of different wavelengths of light at different depths in silicon image sensors.

Step (H) is illustrated in FIG. 3H. Connections are made to the terminals of the photodetector and are indicated as 1542 and 1544. Various elements of FIG. 3H such as 1520, 1522, 1512, 1514, 1510, 1508, 1506, 1534, 1536, 1538, 1540, 1542, and 1544 have been described previously. Contacts and interconnects for connecting terminals of the photodetector to read-out circuits are then done, following which a packaging process is conducted.

FIG. 3A-3G show a process where oxide vias may be used to look through photodetector layers to observe alignment marks on the read-out circuit wafer below it. However, if the thickness of the silicon on the photodetector layer is <100-400 nm, the silicon wafer is thin enough that one can look through it without requiring oxide vias. A process similar to FIG. 3A-G where the silicon thickness for the photodetector is <100-400 nm represents another embodiment of this invention. In that embodiment, oxide vias may not be constructed and one could look right through the photodetector layer to observe alignment marks of the read-out circuit layer. This may help making well-aligned through-silicon connections between various layers.

As mentioned previously, FIG. 3A-3G illustrate a process where oxide vias constructed before layer transfer are used to look through photodetector layers to observe alignment marks on the read-out circuit wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme are formed. This order of sequences may enable observation of alignment marks on the bottom read-out circuit wafer by looking through the photodetector wafer.

While Silicon has been suggested as the material for the photodetector layer of FIG. 3A-G, Germanium could be used in an alternative embodiment. The advantage of Germanium is that it is sensitive to infra-red wavelengths as well. However, Germanium also suffers from high dark current.

While FIG. 3A-G described a single p-n junction as the photodetector, it will be obvious to one skilled in the art based on the present disclosure that multiple p-n junctions can be formed one on top of each other, as described in "Color Separation in an Active Pixel Cell Imaging Array Using a Triple-Well Structure," U.S. Pat. No. 5,965,875, 1999 by R. Merrill and in "Trends in CMOS Image Sensor Technology and Design," International Electron Devices Meeting Digest of Technical Papers, 2002 by A. El-Gamal. This concept relies on the fact that different wavelengths of light penetrate to different thicknesses of silicon, as described in FIG. 4. It can be observed in FIG. 4 that near the surface 400 nm wavelength light has much higher absorption per unit depth than 450 nm-650 nm wavelength light. On the other hand, at a depth of 0.5 µm, 500 nm light has a higher absorption per unit depth than 400 nm light. An advantage of this approach is that one does not require separate filters (and area) for green, red and blue light; all these different colors/wavelengths of light can be detected with different p-n junctions stacked atop each other. So, the net area required for detecting three different colors of light is reduced, leading to an improvement of resolution.

Figure 5A:
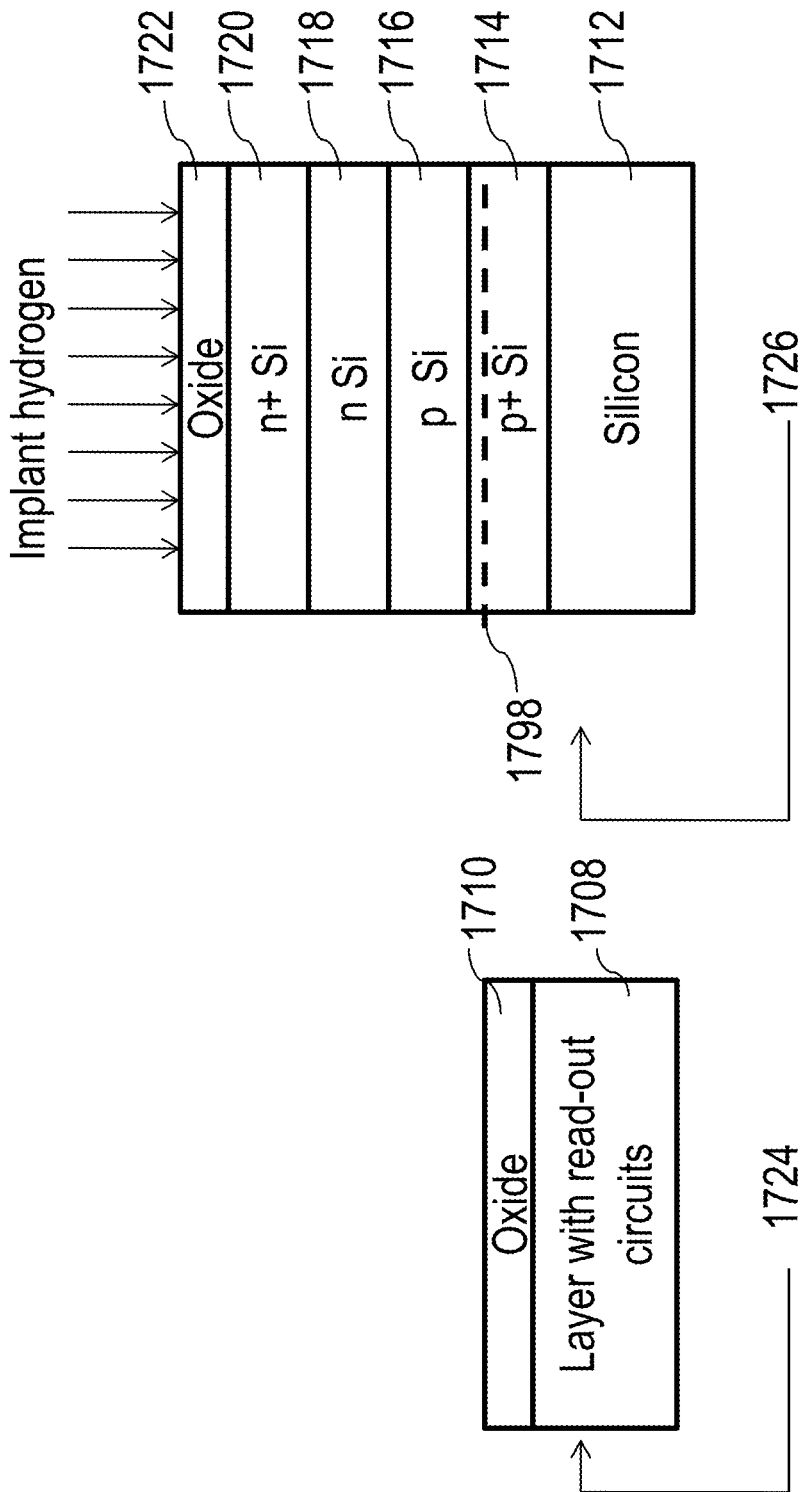
FIG. 5A-5B illustrate an embodiment of this invention, where red, green and blue photodetectors are stacked monolithically atop read-out circuits using ion-cut technology (for an image sensor)
Figure 5B:
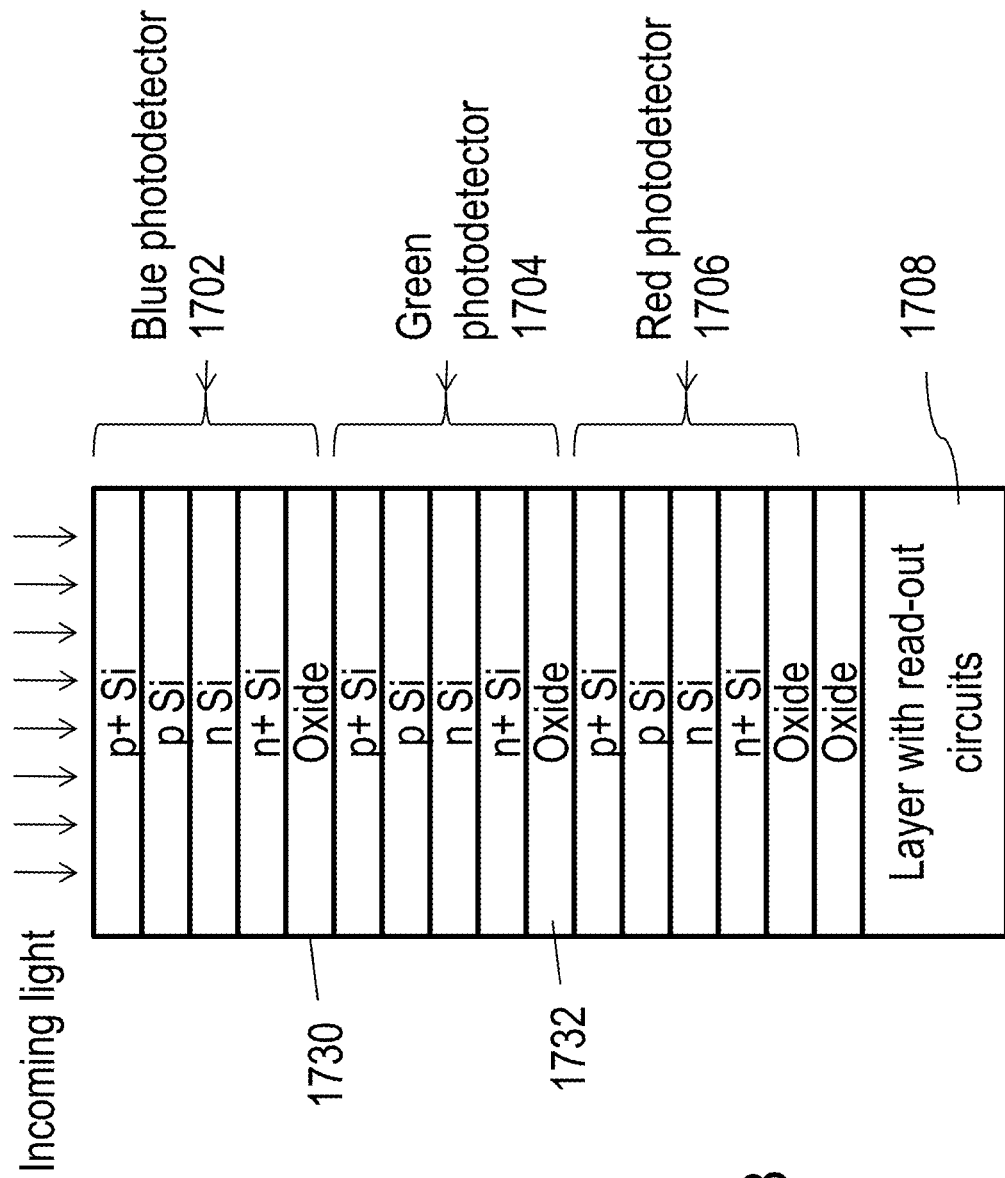

FIG. 5A-5B illustrate an embodiment of this invention, where red, green, and blue photodetectors are stacked monolithically atop read-out circuits using ion-cut technology (for an image sensor). Therefore, a smart layer transfer technique is utilized. FIG. 5A shows the first step for constructing this image sensor. 1724 shows a cross-sectional view of 1708, a silicon wafer with read-out circuits constructed on it, above which an oxide layer 1710 is deposited. 1726 shows the cross-sectional view of another wafer 1712 which has a p+ Silicon layer 1714, a p Silicon layer 1716, a n Silicon layer 1718, a n+ Silicon layer 1720, and an oxide layer 1722. These layers are formed using procedures similar to those described in FIG. 3A-G. An anneal is then performed to activate dopants in various layers. Hydrogen is implanted in the wafer at a certain depth depicted by 1798. FIG. 5B shows the structure of the image sensor before contact formation. Three layers of p+pnn+ silicon (each corresponding to a color band and similar to the one depicted in 1726 in FIG. 5A) are layer transferred sequentially atop the silicon wafer with read-out circuits (depicted by 1724 in FIG. 5A). Three different layer transfer steps may be used for this purpose. Procedures for layer transfer and alignment for forming the image sensor in FIG. 5B are similar to procedures used for constructing the image sensor shown in FIGS. 15A-G. Each of the three layers of p+pnn+ silicon senses a different wavelength of light. For example, blue light is detected by blue photodetector 1702, green light is detected by green photodetector 1704, and red light is detected by red photodetector 1706. Contacts, metallization, packaging and other steps are done to the structure shown in FIG. 5B to form an image sensor. The oxides 1730 and 1732 could be either transparent conducting oxides or silicon dioxide. Use of transparent conducting oxides could allow fewer contacts to be formed.

Figure 6A:
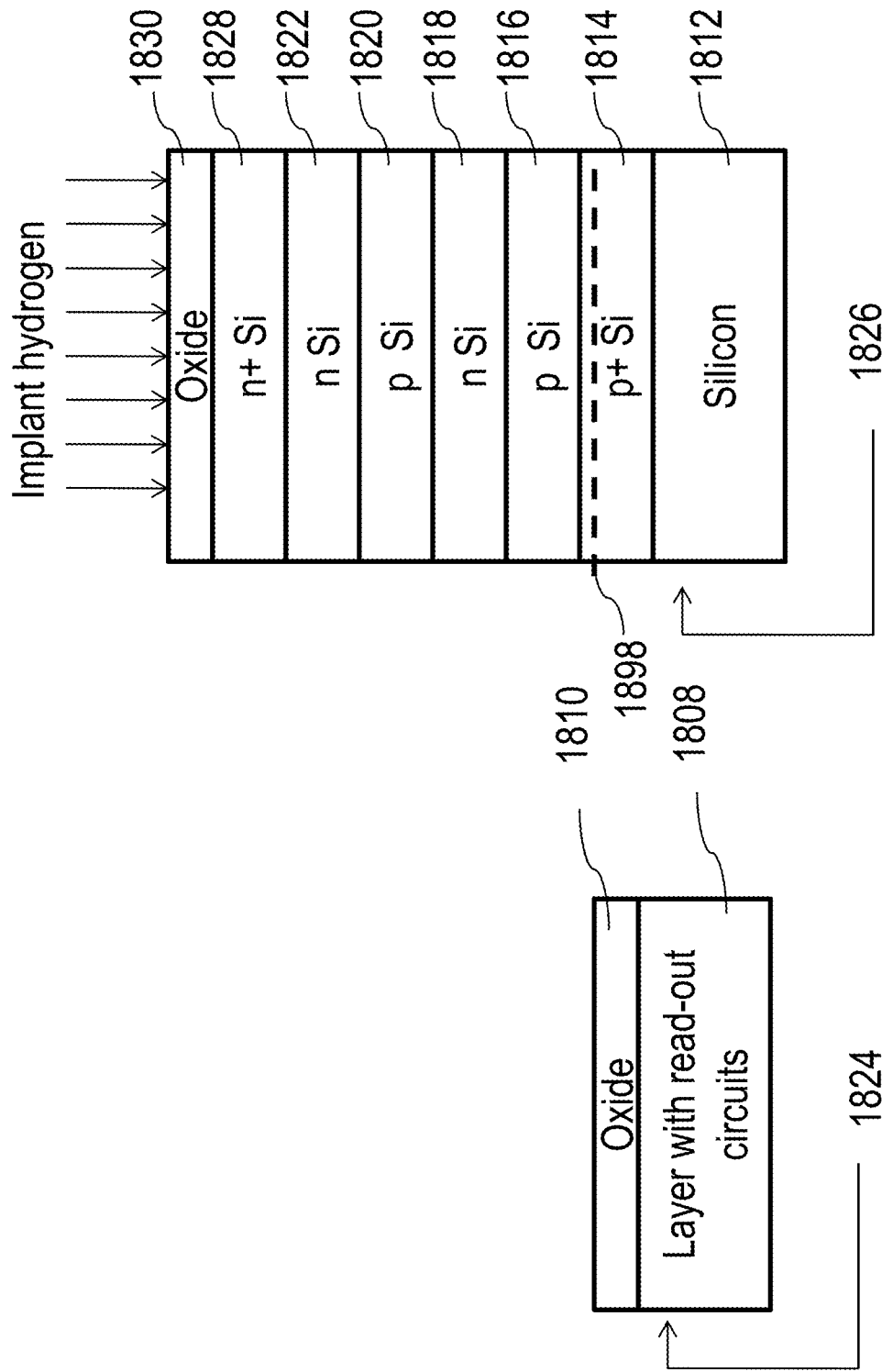
FIG. 6A-6B illustrate an embodiment of this invention, where red, green and blue photodetectors are stacked monolithically atop read-out circuits using ion-cut technology for a different configuration (for an image sensor)
Figure 6B:
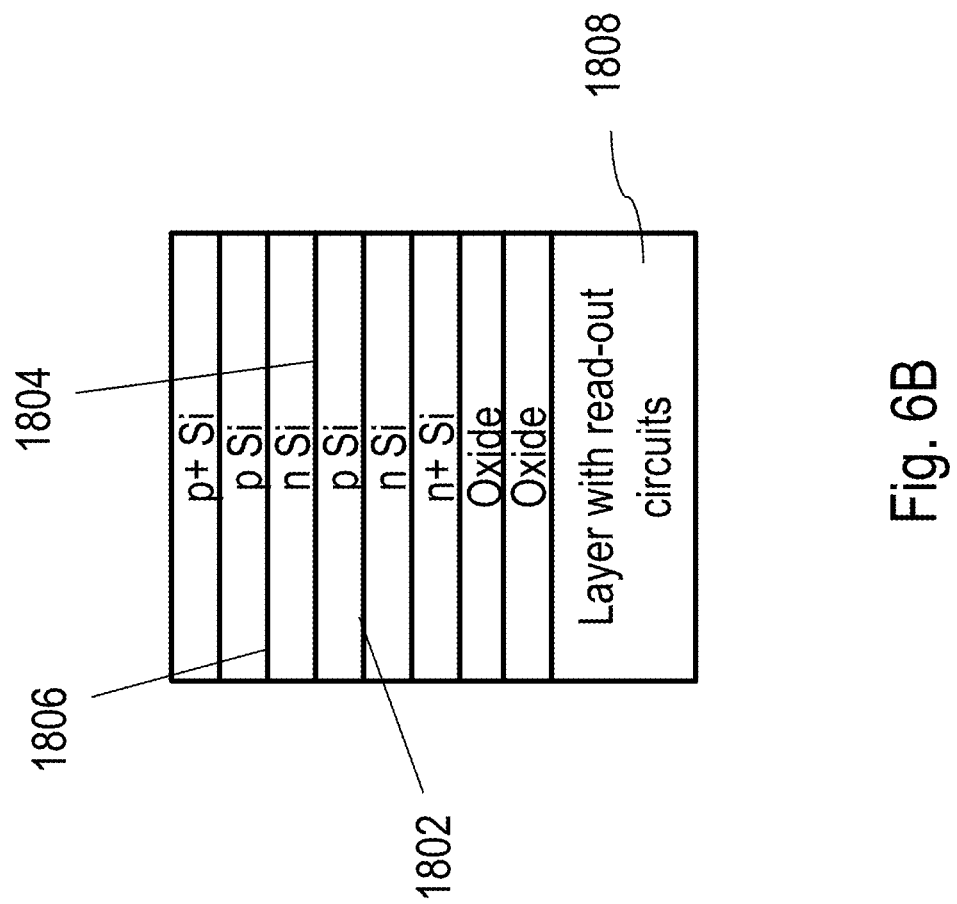

FIG. 6A-6B show another embodiment of this invention, where red, green and blue photodetectors are stacked monolithically atop read-out circuits using ion-cut technology (for an image sensor) using a different configuration. Therefore, a smart layer transfer technique is utilized. FIG. 6A shows the first step for constructing this image sensor. 1824 shows a cross-section of 1808, a silicon wafer with read-out circuits constructed on it, above which an oxide layer 1810 is deposited. 1826 shows the cross-sectional view of another wafer 1812 which has a p+ Silicon layer 1814, a p Silicon layer 1816, a n Silicon layer 1818, a p Silicon layer 1820, a n Silicon layer 1822, a n+ Silicon layer 1828 and an oxide layer 1830. These layers may be formed using procedures similar to those described in FIG. 3A-3G. An anneal is then performed to activate dopants in various layers. Hydrogen is implanted in the wafer at a certain depth depicted by 1898. FIG. 6B shows the structure of the image sensor before contact formation. A layer of p+pnpnn+ (similar to the one depicted in 1826 in FIG. 6A) is layer transferred sequentially atop the silicon wafer with read-out circuits (depicted by 1824 in FIG. 6A). Procedures for layer transfer and alignment for forming the image sensor in FIG. 6B are similar to procedures used for constructing the image sensor shown in FIG. 3A-3G. Contacts, metallization, packaging and other steps are done to the structure shown in FIG. 6B to form an image sensor. Three different pn junctions, denoted by 1802, 1804 and 1806 may be formed in the image sensor to detect different wavelengths of light.

Figure 7A:
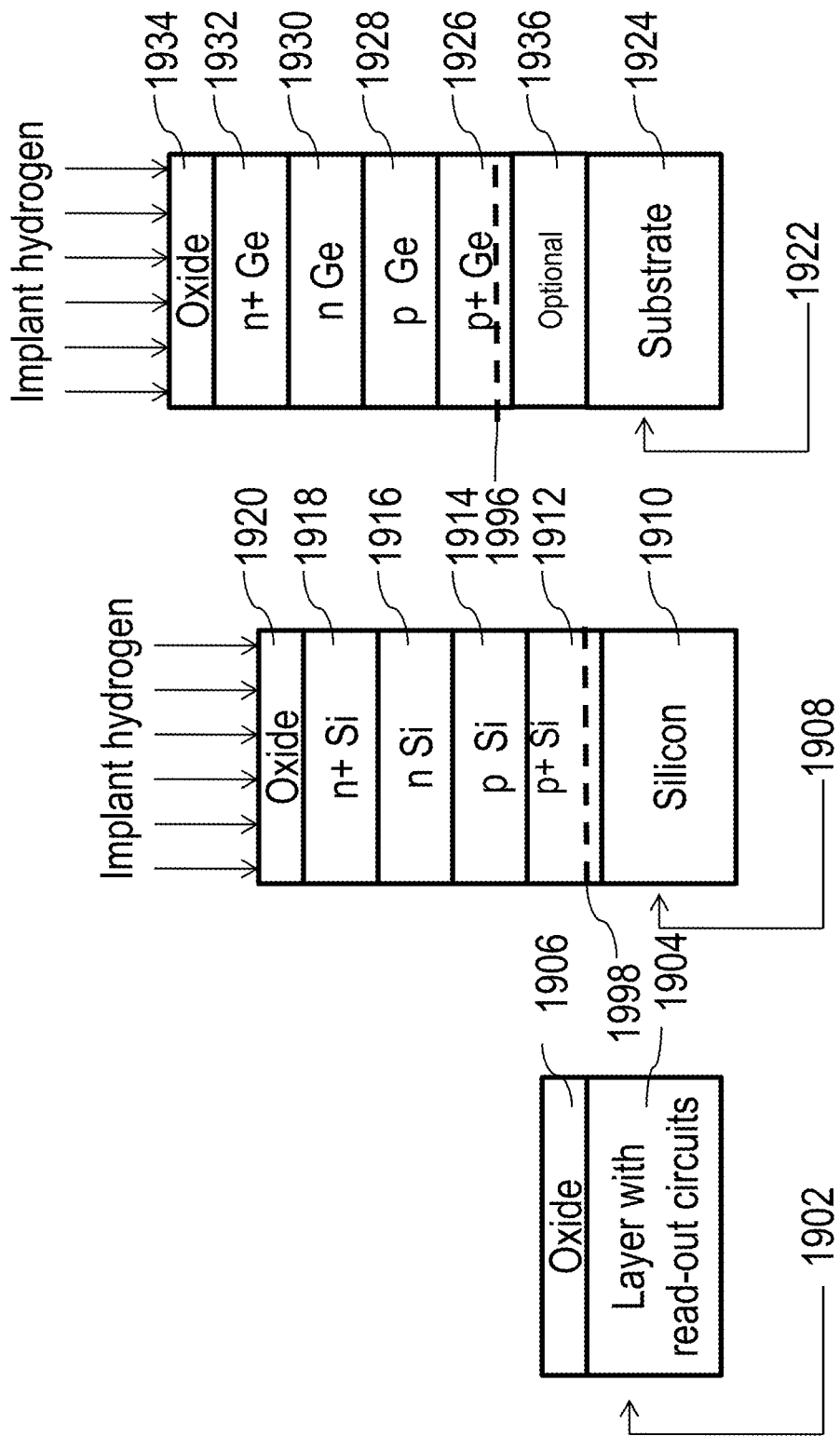

FIG. 7A-7B show another embodiment of this invention, where an image sensor that can detect both visible and infra-red light is depicted. Such image sensors could be useful for taking photographs in both day and night settings (without necessarily requiring a flash). This embodiment makes use of the fact that while silicon is not sensitive to infra-red light, other materials such as Germanium and Indium Gallium Arsenide are. A smart layer transfer technique is utilized for this embodiment. FIG. 7A shows the first step for constructing this image sensor. 1902 shows a cross-sectional view of 1904, a silicon wafer with read-out circuits constructed on it, above which an oxide layer 1906 is deposited. 1908 shows the cross-sectional view of another wafer 1910 which has a p+ Silicon layer 1912, a p Silicon layer 1914, a n Silicon layer 1916, a n+ Silicon layer 1918 and an oxide layer 1720. These layers may be formed using procedures similar to those described in FIG. 3A-3G. An anneal is then performed to activate dopants in various layers. Hydrogen is implanted in the wafer at a certain depth depicted by 1998. 1922 shows the cross-sectional view of another wafer which has a substrate 1924, an optional buffer layer 1936, a p+ Germanium layer 1926, a p Germanium layer 1928, a n Germanium layer 1932, a n+ Germanium layer 1932 and an oxide layer 1934. These layers are formed using procedures similar to those described in FIGS. 3A-3G. An anneal is then performed to activate dopants in various layers. Hydrogen is implanted in the wafer at a certain depth depicted by 1996. Examples of materials used for the structure 1922 include a Germanium substrate for 1924, no buffer layer and multiple Germanium layers. Alternatively, a Indium Phosphide substrate could be used for 1924 when the layers 1926, 1924, 1922 and 1920 are constructed of InGaAs instead of Germanium. FIG. 7B shows the structure of this embodiment of the invention before contacts and metallization are constructed. The p+pnn+ Germanium layers of structure 1922 of FIG. 7A are layer transferred atop the read-out circuit layer of structure 1902. This is done using smart layer transfer procedures similar to those described in respect to FIG. 3A-3G. Following this, multiple p+pnn+ layers similar to those used in structure 1908 are layer transferred atop the read-out circuit layer and Germanium photodetector layer (using three different layer transfer steps). This, again, is done using procedures similar to those described in FIG. 3A-3G. The structure shown in FIG. 7B therefore has a layer of read-out circuits 1904, above which an infra-red photodetector 1944, a red photodetector 1942, a green photodetector 1940 and a blue photodetector 1938 are present. Procedures for layer transfer and alignment for forming the image sensor in FIG. 7B are similar to procedures used for constructing the image sensor shown in FIG. 3A-3G. Each of the p+pnn+ layers senses a different wavelength of light. Contacts, metallization, packaging and other steps are done to the structure shown in FIG. 7B to form an image sensor. The oxides 1946, 1948, and 1950 could be either transparent conducting oxides or silicon dioxide. Use of transparent conducting oxides could allow fewer contacts to be formed.

Figure 8A:
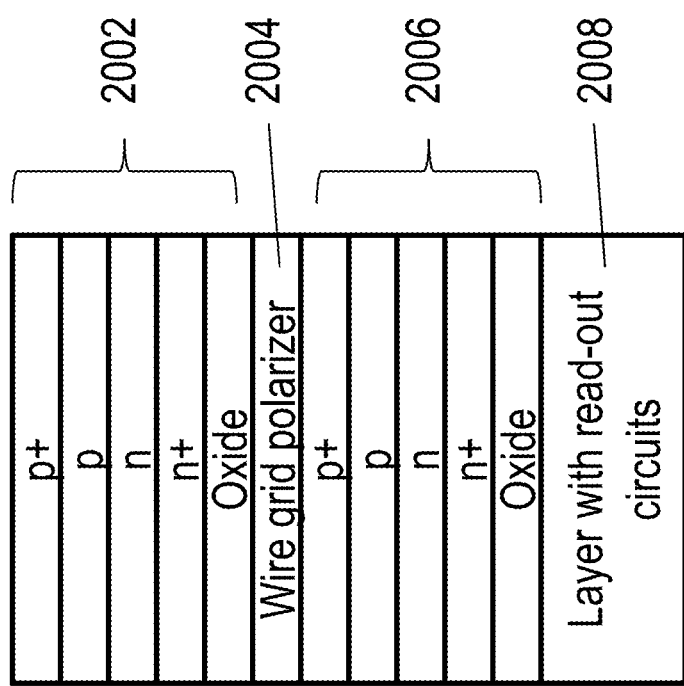
FIG. 8A illustrates an embodiment of this invention, where polarization of incoming light is detected.

FIG. 8A describes another embodiment of this invention, where polarization of incoming light can be detected. The p-n junction photodetector 2006 detects light that has passed through a wire grid polarizer 2004. Details of wire grid polarizers are described in "Fabrication of a 50 nm half-pitch wire grid polarizer using nanoimprint lithography." Nanotechnology 16 (9): 1874-1877, 2005 by Ahn, S. W.; K. D. Lee, J. S. Kim, S. H. Kim, J. D. Park, S. H. Lee, P. W. Yoon. The wire grid polarizer 2004 absorbs one plane of polarization of the incident light, and may enable detection of other planes of polarization by the p-n junction photodetector 2006. The p-n junction photodetector 2002 detects all planes of polarization for the incident light, while 2006 detects the planes of polarization that are not absorbed by the wire grid polarizer 2004. One can thereby determine polarization information from incoming light by combining results from photodetectors 2002 and 2006. The device described in FIG. 8A can be fabricated by first constructing a silicon wafer with transistor circuits 2008, following which the p-n junction photodetector 2006 can be constructed with the low-temperature layer transfer techniques described in FIG. 3A-3G. Following this construction of p-n junction photodetector 2006, the wire grid polarizer 2004 may be constructed using standard integrated circuit metallization methods. The photodetector 2002 can then be constructed by another low-temperature layer transfer process as described in FIG. 3A-3G. One skilled in the art, based on the present disclosure, can appreciate that low-temperature layer transfer techniques are critical to build this device, since semiconductor layers in 2002 are built atop metallization layers required for the wire grid polarizer 2004. Thickness of the photodetector layers 2002 and 2006 may be preferably less than 5 μm. An example with polarization detection where the photodetector has other pre-processed optical interaction layers (such as a wire grid polarizer) has been described herein. However, other devices for determining parameters of incoming light (such as phase) may be constructed with layer transfer techniques.

Figure 8B:
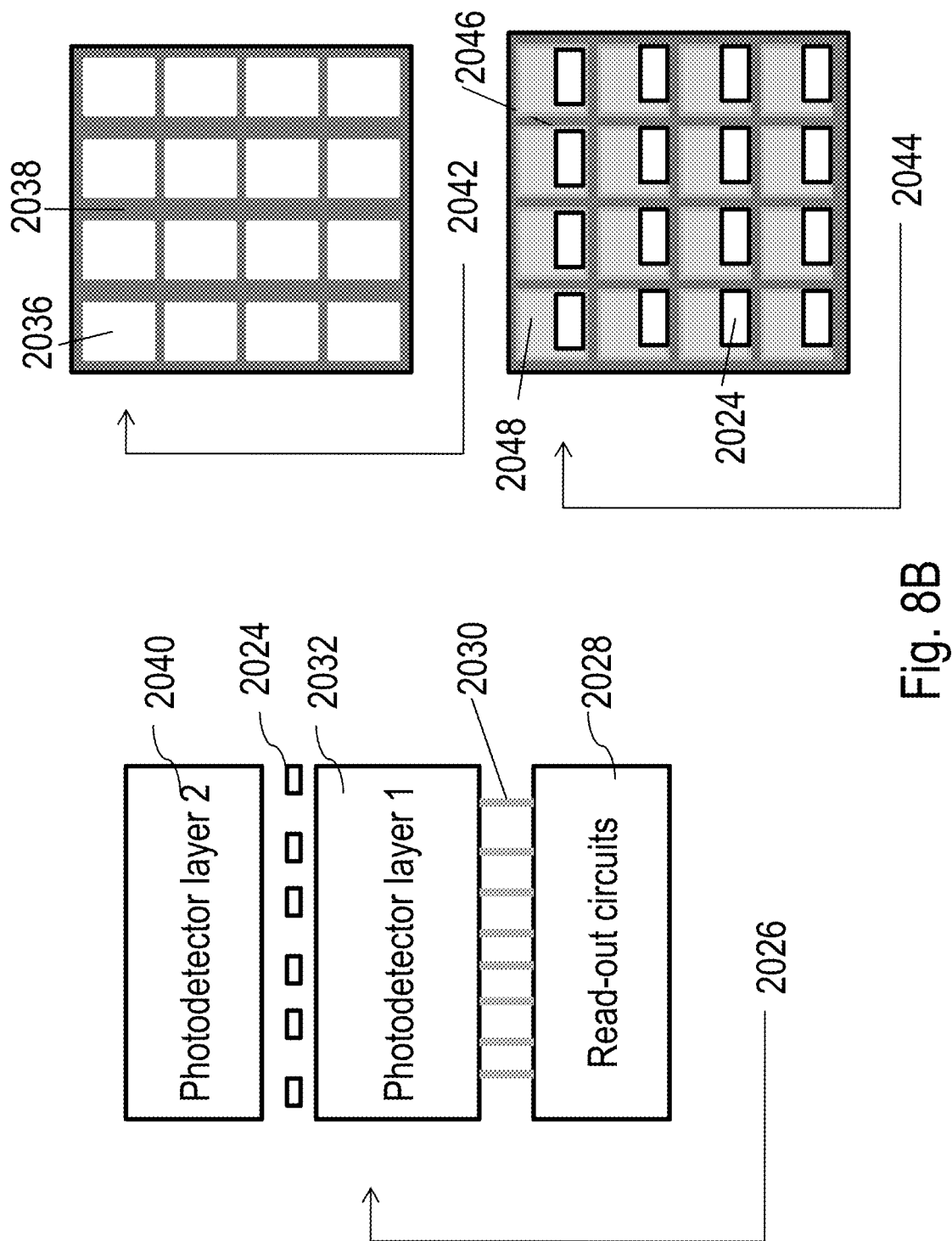
FIG. 8B illustrates another embodiment of this invention, where an image sensor with high dynamic range is constructed.

One of the common issues with taking photographs with image sensors is that in scenes with both bright and dark areas, while the exposure duration or shutter time could be set high enough to get enough photons in the dark areas to reduce noise, picture quality in bright areas degrades due to saturation of the photodetectors' characteristics. This issue is with the dynamic range of the image sensor, i.e. there is a tradeoff between picture quality in dark and bright areas. FIG. 8B shows an embodiment of this invention, where higher dynamic range can be reached. According the embodiment of FIG. 8B, two layers of photodetectors 2032 and 2040, could be stacked atop a read-out circuit layer 2028. 2026 is a schematic of the architecture. Connections 2030 run between the photodetector layers 2032 and 2040 and the read-out circuit layer 2028. 2024 are reflective metal lines that block light from reaching part of the bottom photodetector layer 2032. 2042 is a top view of the photodetector layer 2040. Photodetectors 2036 could be present, with isolation regions 2038 between them. 2044 is a top view of the photodetector layer 2032 and the metal lines 2024. Photodetectors 2048 are present, with isolation regions 2046 between them. A portion of the photodetectors 2048 can be seen to be blocked by metal lines 2024. Brighter portions of an image can be captured with photodetectors 2048, while darker portions of an image can be captured with photodetectors 2036. The metal lines 2024 positioned in the stack may substantially reduce the number of photons (from brighter portions of the image) reaching the bottom photodetectors 2048. This reduction in number of photons reaching the bottom photodetectors 2048 helps keep the dynamic range high. Read-out signals coming from both dark and bright portions of the photodetectors could be used to get the final picture from the image sensor.

Figure 9:
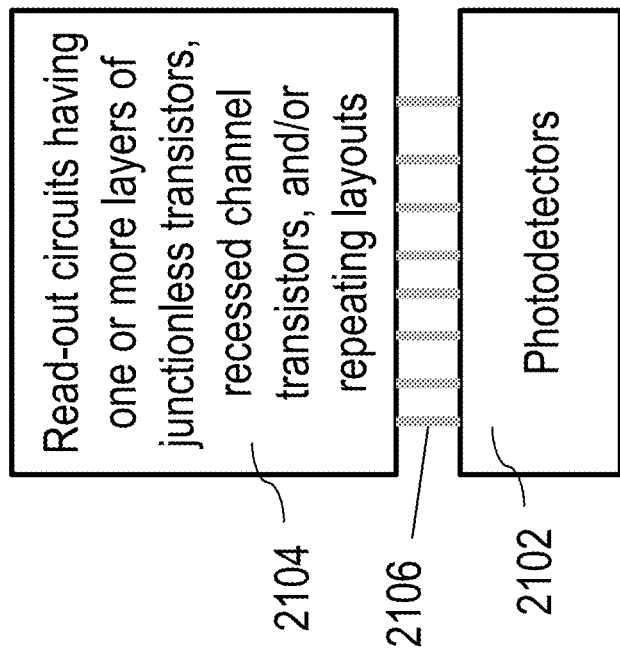
FIG. 9 illustrates an embodiment of this invention, where read-out circuits are constructed monolithically above photodetectors in an image sensor.

FIG. 9 illustrates another embodiment of this invention where a read-out circuit layer 2104 is monolithically stacked above the photodetector layer 2102 at a temperature approximately less than 400° C. Connections 2106 are formed between these two layers. Procedures for stacking high-quality monocrystalline transistor circuits and wires at temperatures approximately less than 400° C. using layer transfer are described in pending U.S. patent application Ser. No. 12/901,890, now U.S. Pat. No. 8,026,521, by the inventors of this patent application, the contents of which are incorporated by reference. The stacked layers could use junction-less transistors, recessed channel transistors, repeating layouts or other devices/techniques described in U.S. patent application Ser. No. 12/901,890 the content of which is incorporated by reference. The embodiments of this invention described in FIG. 2-FIG. 9 may share a few common features. They can have multiple stacked (or overlying) layers, use one or more photodetector layers (terms photodetector layers and image sensor layers are often used interchangeably), thickness of at least one of the stacked layers is less than 5 microns and construction can be done with smart layer transfer techniques and are stacking is done at temperatures approximately less than 450° C.

Confocal 3D Microscopy with Screen Made of Stacked Arrays of Modulators

Confocal Microscopy is a method by which 3D image information from a specimen is preserved. Typically, confocal microscopy is used in conjunction with the technique of inducing florescence from the specimen by shining laser light upon it. The laser light is absorbed by the specimen which then re-emits the light at a lower energy level (longer wavelength). This secondary light or florescence is then imaged by the confocal microscopy system.

Figure 10A:
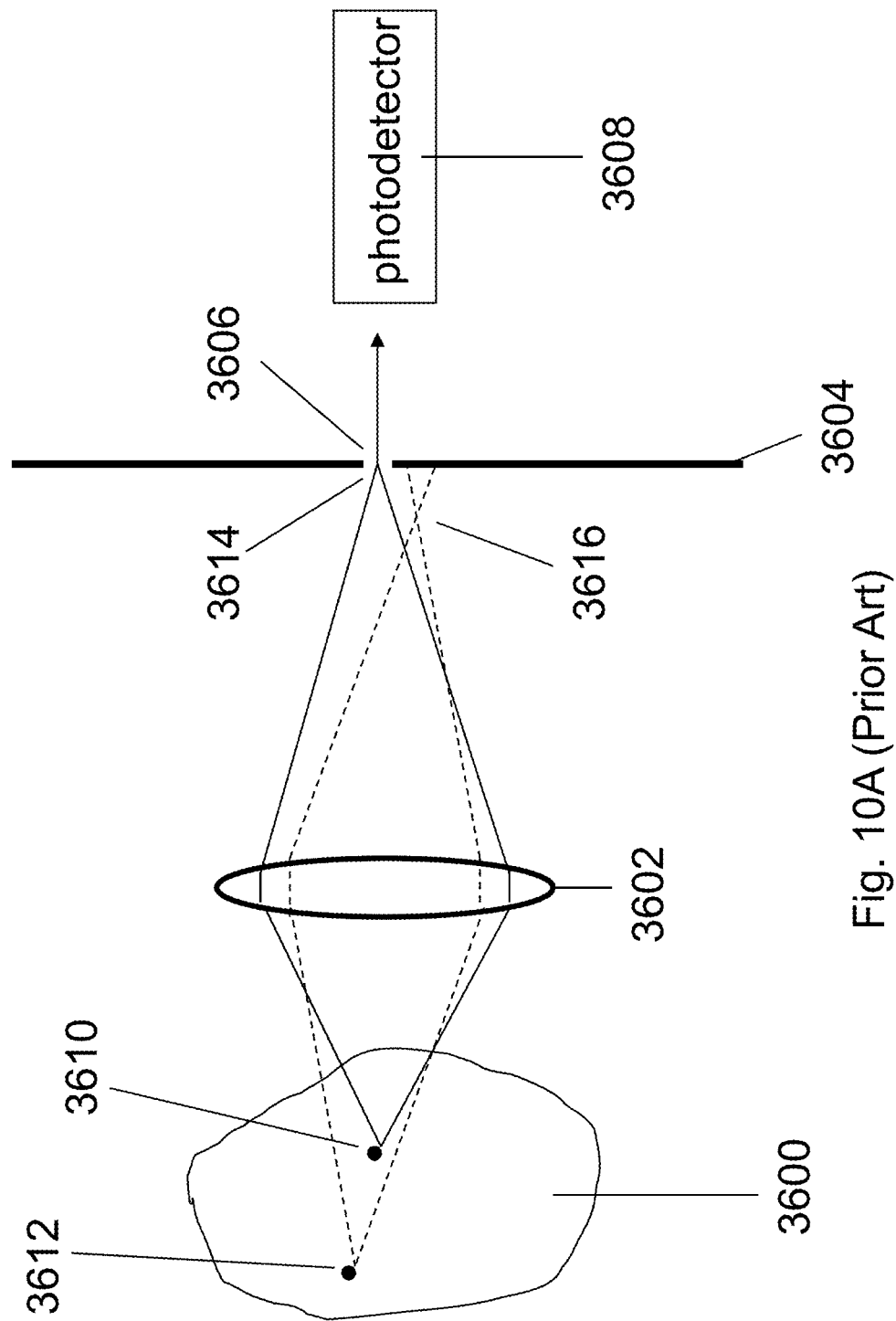
FIG. 10A-10B illustrate a comparison between a typical confocal microscopy technique (prior art) and another confocal microscopy technique with an electronic screen constructed with stacks of modulators.

FIG. 10A illustrates a side cross-sectional view of a typical microscopy system, wherein the specimen 3600 has been stimulated by laser light (not shown). A lens or lens system 3602 is placed between the specimen and a screen 3604 that has an aperture 3606. Behind the screen, a photo-detector 3608 detects light that has come through the aperture 3606. A point on the specimen 3610, will produce a reciprocal image at the point 3614, which converges at the aperture 3606. The light originally from 3610 then passes through the aperture 3606 and subsequently detected by the photo-detector 3608. Another point on the specimen 3612, will produce a reciprocal image at the point 3616, which converges away from the aperture 3606. Thus, the screen 3604 blocks the light originally from 3612 and so is not sensed by the photo-detector.

By moving the screen and its aperture up, down, left, right, forward, and backward, light from specific points of the specimen are detected and so a 3D image of the specimen can then be reconstructed. Conversely, one may also move the specimen in the same manner instead of the screen to achieve the same objective of scanning the specimen.

The issue with such a scanning scheme is that mechanical scanning is slow and requires more space to allow for the movements. An alternative is to replace the screen with a 3D array of optical modulators that control the passage of light, thus allowing much faster scanning through electronic control.

Figure 10B:
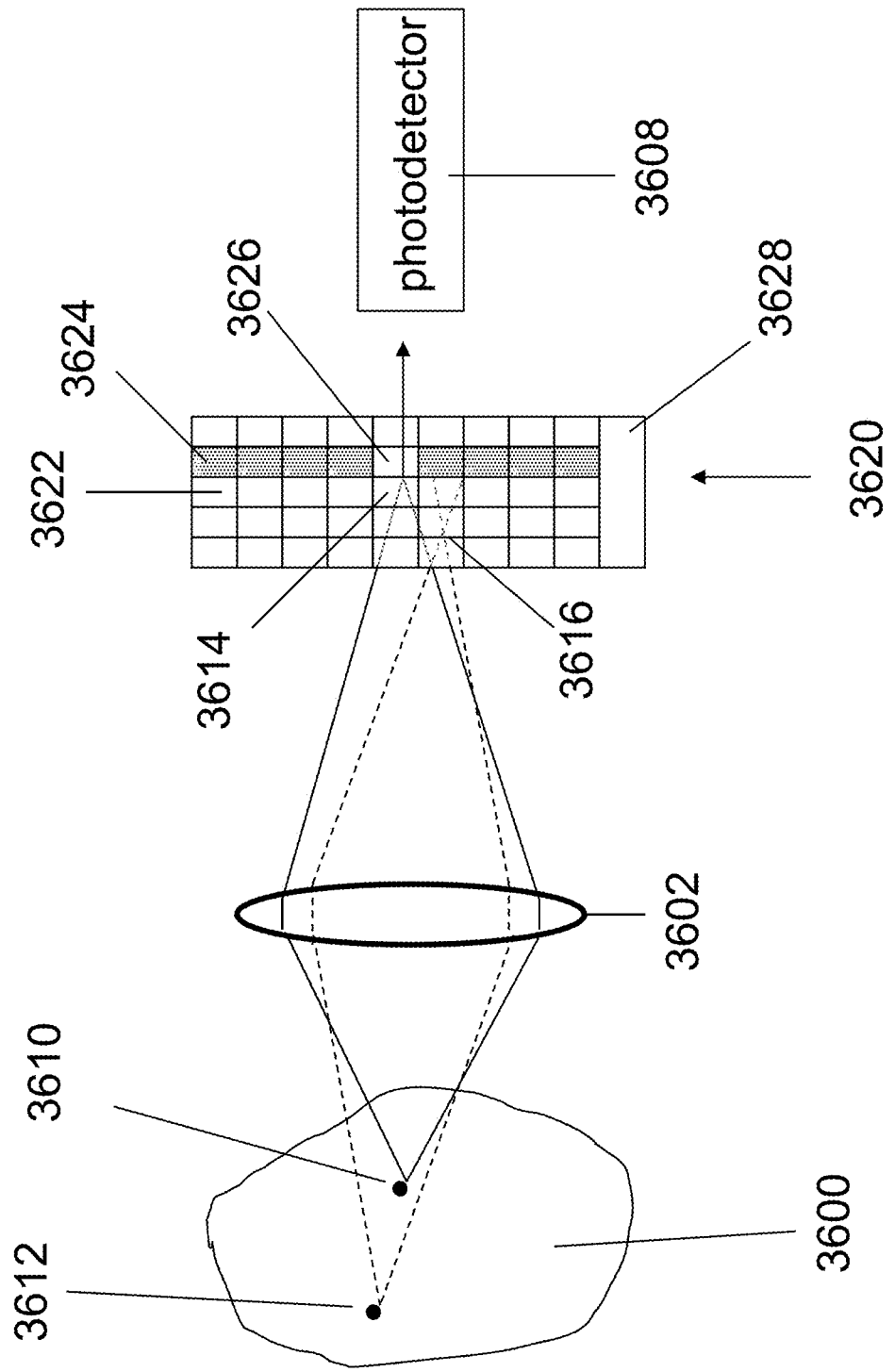

FIG. 10B illustrates confocal microscopy system implemented with a fixed 3D array of optical modulators 3620, where 3600, 3602, 3608, 3610, 3612, 3614, and 3616 are as previously described. The modulators are designed to block and pass the light at a particular wavelength range expected from the florescence of the specimen. By turning on certain arrays of modulators along a plane perpendicular to the lens, for example modulator 3624, which block the light, an effective screen is formed. By leaving the others off, for example modulator 3622, which let the light through, the position of the electronic screen with respect to the lens can be electronically controlled back and forth. The aperture 3626 is formed by leaving a single modulator on the modulator screen stack turned off to allow light through. The aperture 3626 can then be electronically controlled by the control circuits 3628 to scan through the area of the electronic screen by simple selective turning-off of a single modulator on the plane of the electronic screen.

In such manner, a 3D image can be scanned and reconstructed from the images detected by the electronic scanning of the aperture.

Layer transfer technology may be utilized for constructing the layers for a 3D optical modulator array system. A 3D optical modulator system may contain control circuits, and a stack of optical modulators.

FIGS. 36C-36G illustrate an embodiment of this invention, where the control circuit layer 3630, and optical modulator layers 3640 and 3660 are stacked monolithically with layer transfer processes. For purposes of illustration, two optical modulator layers are demonstrated here, but the invention is not limited to such, and may contain as many optical modulator layers as needed.

The process of forming the 3D optical modulator array may include several steps that occur in a sequence from Step A to Step E. Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A): FIG. 10C illustrates the step for making contacts and interconnects (not shown) for connecting terminals of the optical modulators, such as p contacts 3635 and 3637 and n contacts 3631 and 3633, to control circuits 3632 in the silicon wafer substrate. Thus control circuit layer 3630 is formed.

Figure 10D:
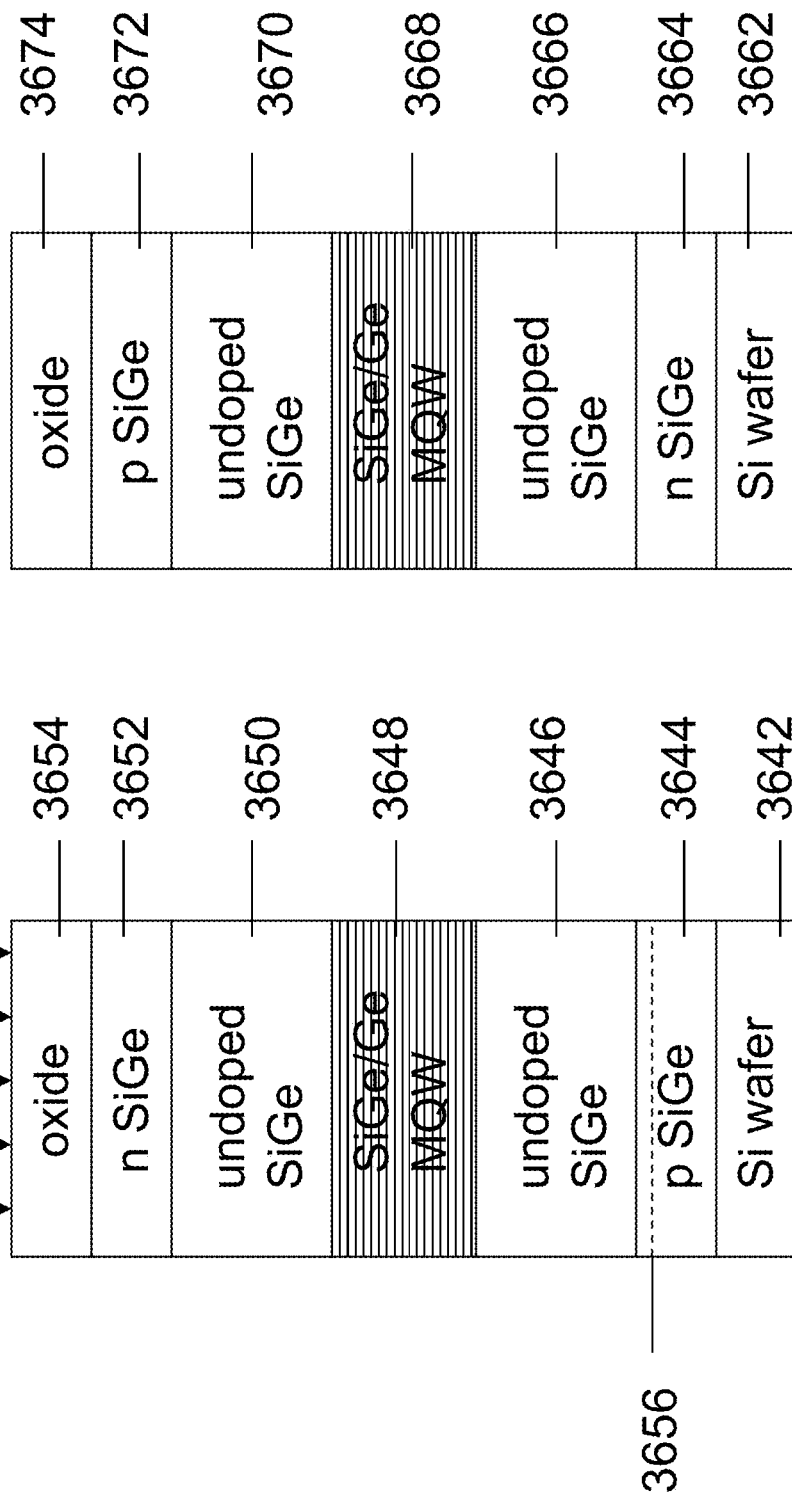

Step (B): FIG. 10D illustrates the cross-sectional views of silicon wafer 3642 and silicon wafer 3662 containing optical modulator 3640 and optical modulator 3660 respectively. The optical modulator 3640 may include silicon wafer 3642, a p-doped Silicon-Germanium (SiGe) layer 3644, an undoped SiGe layer 3646, a SiGe Multiple Quantum Well layer 3648, an undoped SiGe layer 3650, a n-doped SiGe layer 3652, and an oxide layer 3654. These layers may be formed using procedures similar to those described in FIG. 32C. An anneal may then be performed to activate dopants in various layers. Hydrogen may be implanted in the wafer at a certain depth depicted by dashed line 3656. The optical modulator 3660 may include silicon wafer 3662, a n-doped Silicon-Germanium (SiGe) layer 3664, an undoped SiGe layer 3666, a SiGe Multiple Quantum Well layer 3668, an undoped SiGe layer 3670, a p-doped SiGe layer 3672, and an oxide layer 3674. These layers may be formed using procedures similar to those described in FIG. 32C. An anneal may then be performed to activate dopants in various layers.

Figure 10E:
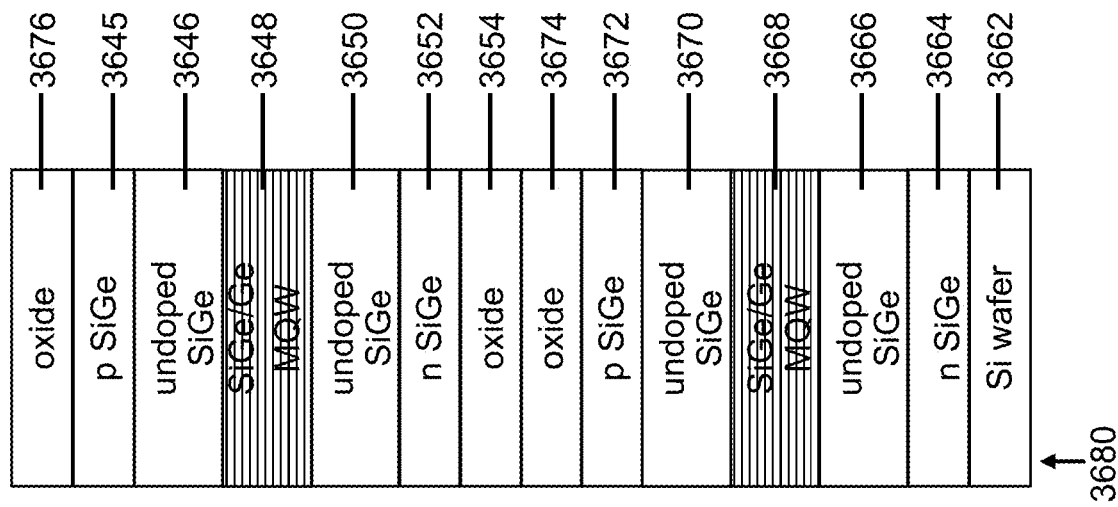

Step (C): FIG. 10E illustrates the two optical modulator layers formed by layer transfer. The optical modulator layer 3640 may be layer transferred atop the silicon wafer 3662 with optical modulator layer 3660 wherein oxide layer 3654 may be bonded to oxide layer 3674, and the p-SiGe layer 3645 may be a result of the cleave and polish operations. Procedures for layer transfer and alignment for forming the structure in FIG. 10E are similar to procedures used for constructing the optical modulator layer shown in FIG. 32C of parent Ser. No. 13/272,161, now U.S. Pat. No. 9,197,804. An oxide layer 3676 may be deposited on top of the p-SiGe layer 3645.

Figure 10F:
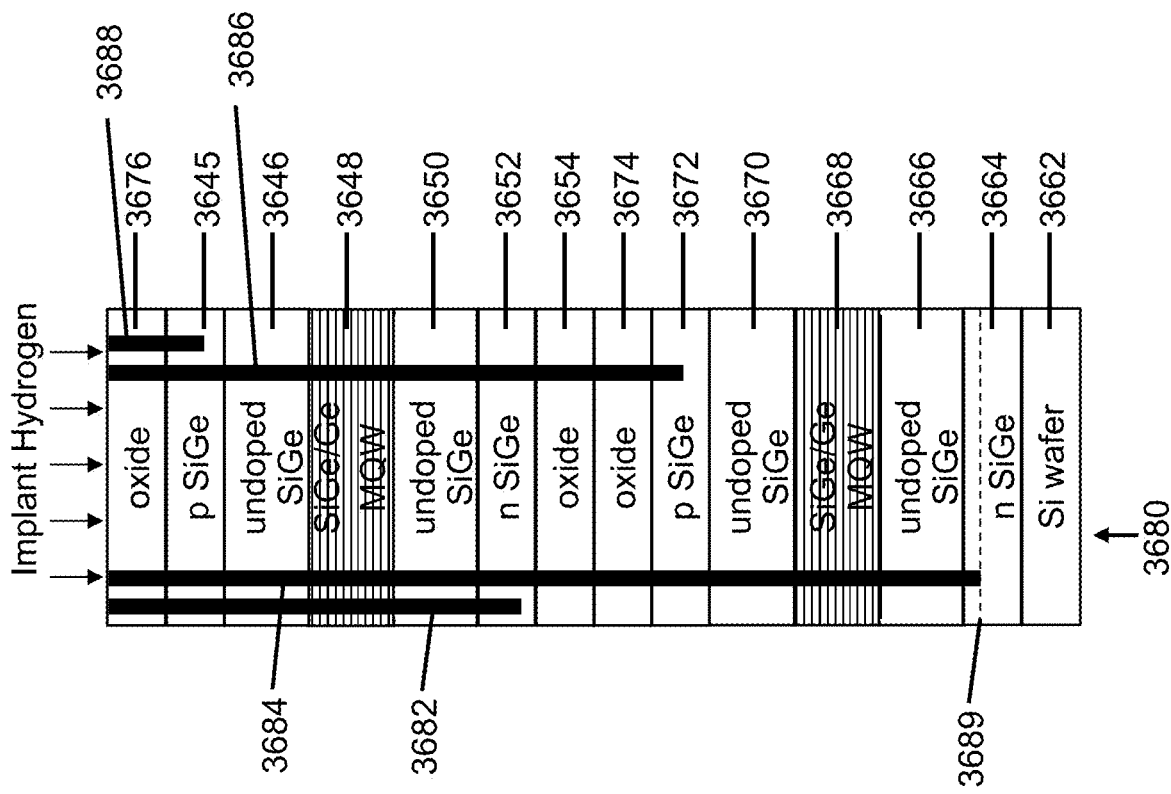

Step (D) is illustrated in FIG. 10F. Connections are made to the terminals of the optical modulators by lithographic, etch, and fill operations similar to those described in FIGS. 3A-3G and are indicated as p contacts 3682 and 3684, and n contacts 3686 and 3688. Various elements of FIG. 10F such as 3645, 3646, 3648, 3650, 3652, 3654, 3662, 3664, 3666, 3668, 3670, 3672, 3674, and 3676 have been described previously.

As described previously, FIGS. 3A-3G illustrate a process where oxide vias constructed before layer transfer may be used to look through one optical modulator layers to observe alignment marks on the other optical modulator wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme may be formed. This order of sequences may enable observation of alignment marks on the bottom control circuit wafer by looking through the optical modulator wafer.

Hydrogen may be implanted in the wafer at a certain depth depicted by dashed line 3689.

Steps (B)-(D) may be repeated as often as needed to stack as many optical modulator layers as necessary.

Figure 10G:
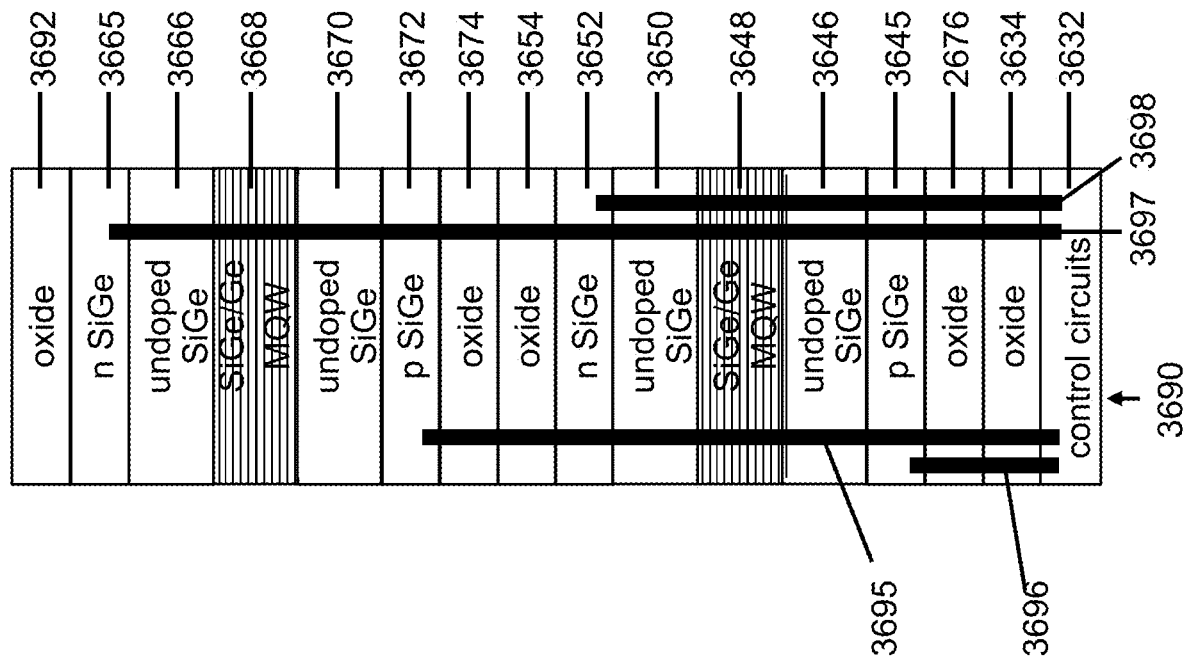

Step (E) is illustrated in FIG. 10G. The two-layer optical modulator stack 3680 may be layer transferred atop the silicon wafer with control circuit layer 3630 to form the structure 3690, wherein oxide layer 3634 may be bonded to oxide layer 3676, and the n-SiGe layer 3665 may be a result of the cleave and polish operations. Procedures for layer transfer and alignment for forming the structure in FIG. 10G are similar to procedures used for constructing the optical modulator layer shown in FIG. 32C of parent Ser. No. 13/272, 161, now U.S. Pat. No. 9,197,804. An oxide layer 3692 may be deposited on top of the n-SiGe layer 3665. As previously in Step (C), alignments are made to the terminals of the optical modulators and control circuits to form the connections to the p contacts 3695 and 3696, and to the n contacts 3697 and 3698. The functionality of the optical modulators may be tested at this point.

Various elements of FIG. 10G such as 3632, 3634, 3645, 3646, 3648, 3650, 3652, 3654, 3665, 3666, 3668, 3670, 3672, 3674, and 3676 have been described previously.

Persons of ordinary skill in the art will appreciate that while Silicon and Germanium have been suggested as the material for the optical modulator layers of FIG. 10D, any other appropriate III-V semiconductor material like GaAs, InGaAsP could be utilized. Moreover, the optical modulator layer 3650 is denoted as a p-i-MQW-i-n layer; however, a single quantum well configuration could be used instead of a multiple quantum well configuration such as the shown multiple quantum well layers 3648 and 3668. Furthermore, the thickness of the optical modulator layer may be typically less than approximately 100 nm, but may also be greater. Thus the invention is to be limited only by the appended claims.

CCD Sensor with Parallel Readout Circuits

The main issue with CCD technology is the sequential shifting of image information from cell to cell is slow and limits the speed and cell density of CCD image sensors. A potential solution is to put the readout circuits directly under each CCD cell, so that the information is read in parallel rather than in time sequence, thus removing the shifting delay entirely.

Figure 11A:
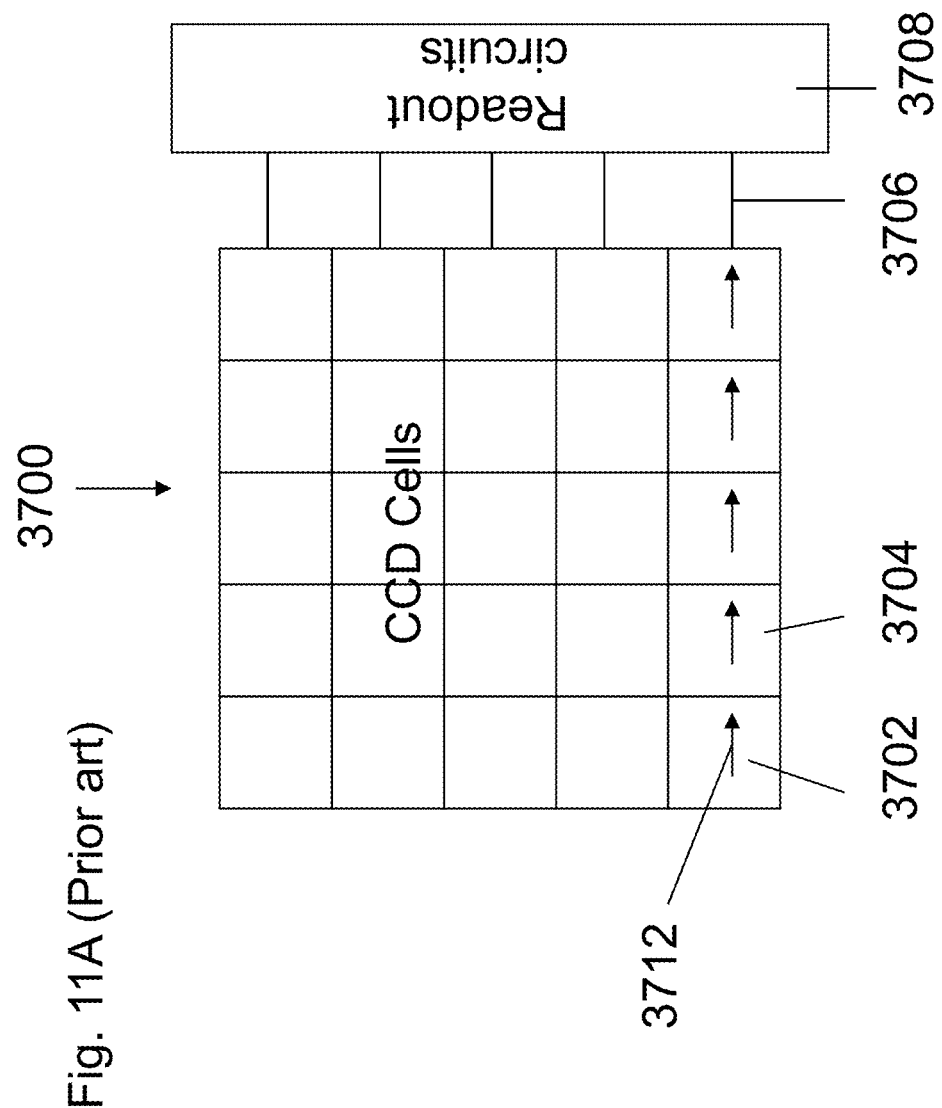
FIG. 11A-11B illustrate the operational processes behind using an array of CCDs as an image sensor (prior art)

FIG. 11A illustrates a typical CCD system; where there is a CCD array 3700 exposed to light, readout circuits 3708, and connections to the readout circuits 3706. The movement 3712 of the charges from CCD cell 3702 to CCD cell 3704 and so on is shown for instance.

Figure 11B:
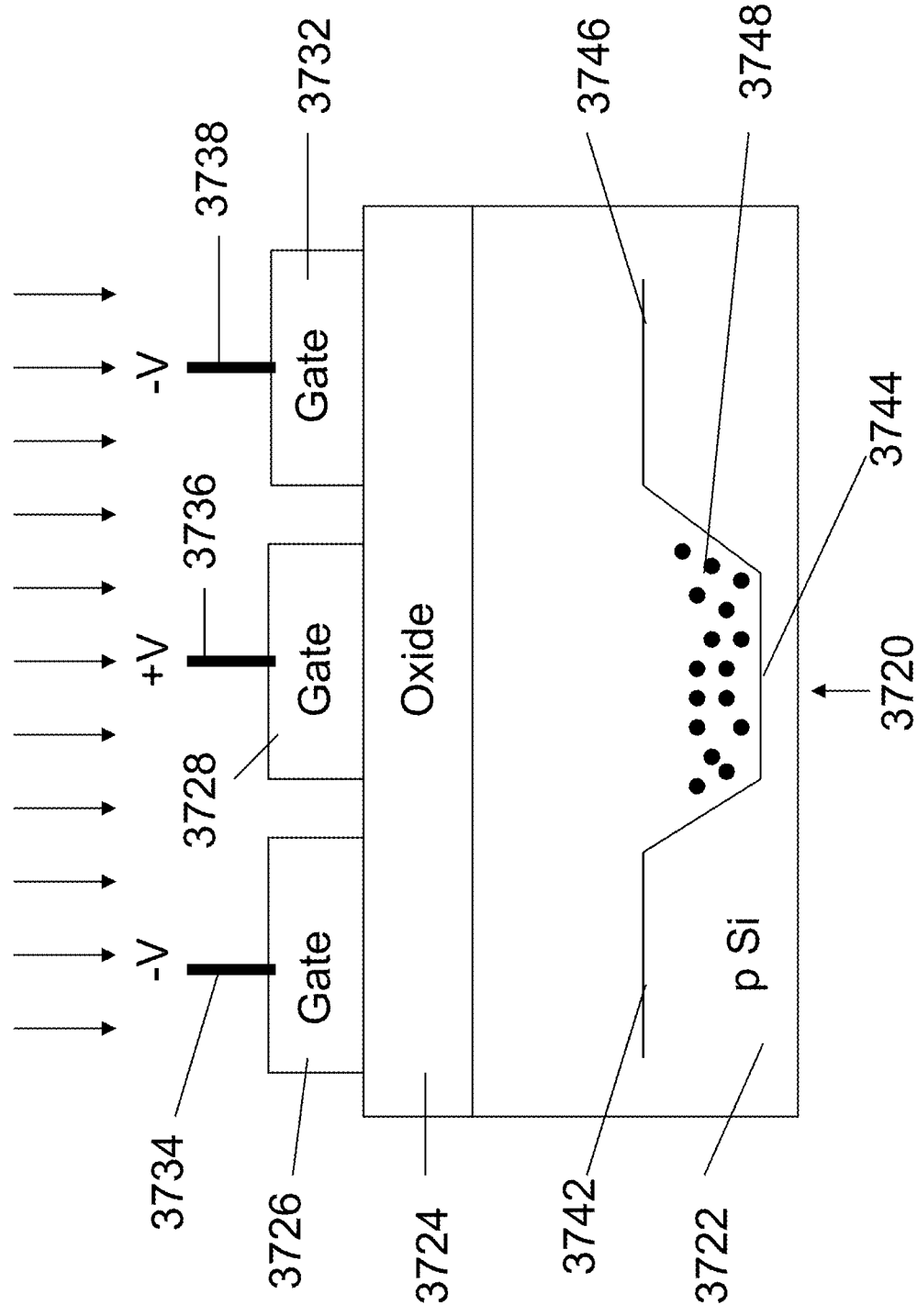

FIG. 11B illustrates a typical CCD structure 3720 shown here as a set of three adjacent MOS capacitor devices with corresponding gates 3726, 3728, and 3732. For this demonstration, electrons are chosen as the charges of operation, and so a p-type Si substrate 3722 is used. An incident light generates electron-hole pairs in the p-type Si substrate 3722. On top of the substrate is an oxide layer 3724, and above this are three separate gates 3726, 3728, 3732, with respective contacts 3734, 3736, 3738. In this demonstration, by applying negative voltage biases to contacts 3734 and 3738, electron potential barriers 3742 and 3746 are formed in the p-type Si substrate 3722 underneath gates 3726 and 3732. By applying positive voltage bias to contact 3736, an electron potential well 3744 is formed in the p-type Si substrate 3722 underneath gate 3728. Electrons 3748 can then be collected underneath gate 3728 under these bias conditions. By a time sequence of positive and negative voltage biases on gates 3726, 3728, and 3738, the existence or non-existence of charges under specific gates can be transmitted to adjacent gates by the method known as charge shifting.

Instead of shifting charges one-by-one, the data can be read in parallel by a readout circuit constructed underneath the CCD sensor. Layer transfer technology may be utilized for constructing the layers for a stacked CCD with underlying readout circuits.

FIGS. 11C-11F illustrate an embodiment of this invention, where the readout circuit layer 3750, and CCD layer 3760 are stacked monolithically with layer transfer.

The process of forming the CCD-control circuit stack may include several steps that occur in a sequence from Step A to Step D. Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 11D:
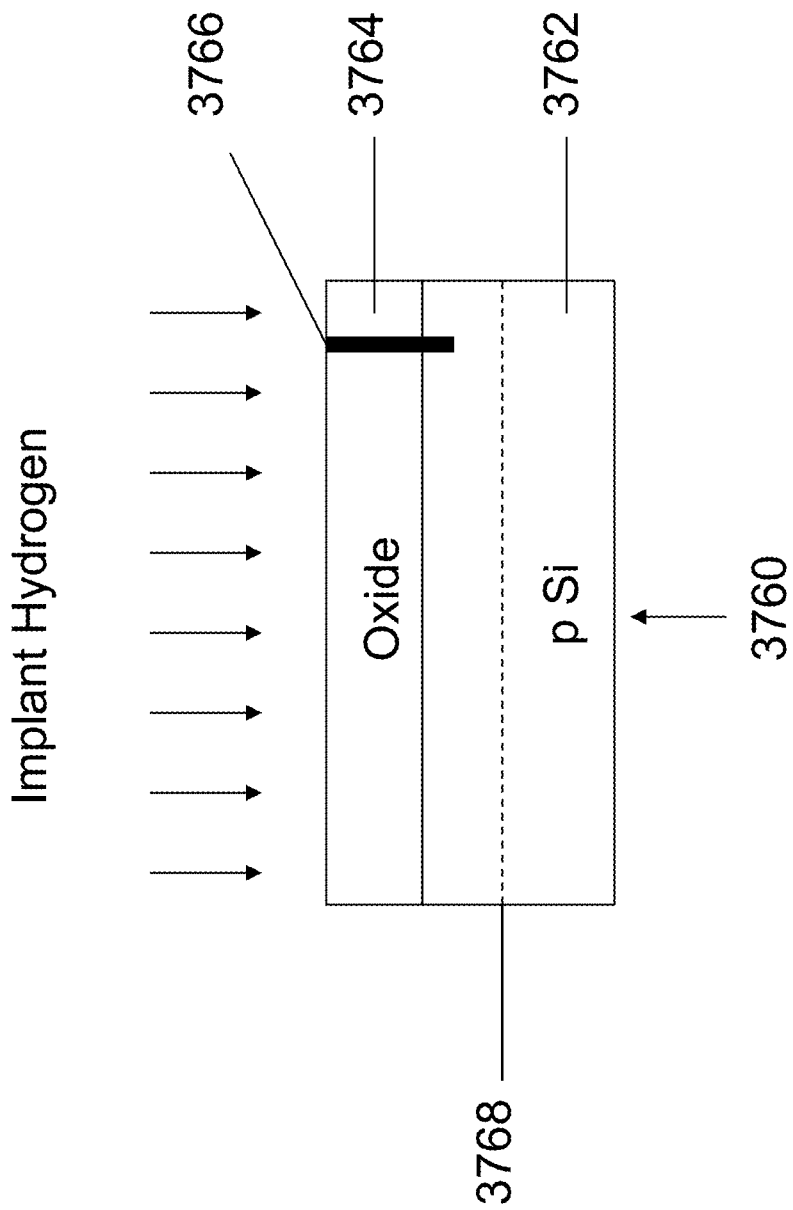

Step (A): FIG. 11C illustrates the step for making contacts, such as contact 3756, and interconnects (not shown) for connecting the p-type substrate 3762 of the CCD cell to the readout circuits 3752 in the silicon wafer substrate. Thus readout circuit layer 3750 is formed. Step (B): FIG. 11D illustrates the cross-sectional view of a Silicon wafer with p-type substrate 3762 and oxide layer 3764. An implant and anneal process for CCD cell optimization may then be performed to deposit and activate dopants at various sites of the p-type Si substrate 3762. Hydrogen may be implanted in the wafer at a certain depth depicted by dashed line 3768.

A connections is made to the p-type Si substrate 3762 by lithographic, etch, and fill operations similar to those described in FIG. 3A-3G and is indicated here as 3766.

Step (C) is illustrated in FIG. 11E. The Si wafer 3760 may be layer transferred atop the silicon wafer with readout circuit layer 3750 to form the structure 3770, wherein oxide layer 3754 may be bonded to oxide layer 3764, and the p-Si layer 3763 may be a result of the cleave and polish operations. Alignments are made to the terminals of the p-Si layer 3763 and readout circuit layer 3752 to form the connection 3772 between the two layers.

As described previously, FIG. 3A-3G illustrate a process where oxide vias constructed before layer transfer may be used to look through one optical modulator layers to observe alignment marks on the other optical modulator wafer below it. However, an alternative embodiment of this invention may involve constructing oxide vias after layer transfer. Essentially, after layer transfer of structures without oxide vias, oxide vias whose diameters are larger than the maximum misalignment of the bonding/alignment scheme may be formed. This order of sequences may enable observation of alignment marks on the bottom control circuit wafer by looking through the optical modulator wafer.

Various elements of FIG. 11E such as 3752, 3754, and 3764 have been described previously.

Figure 11F:
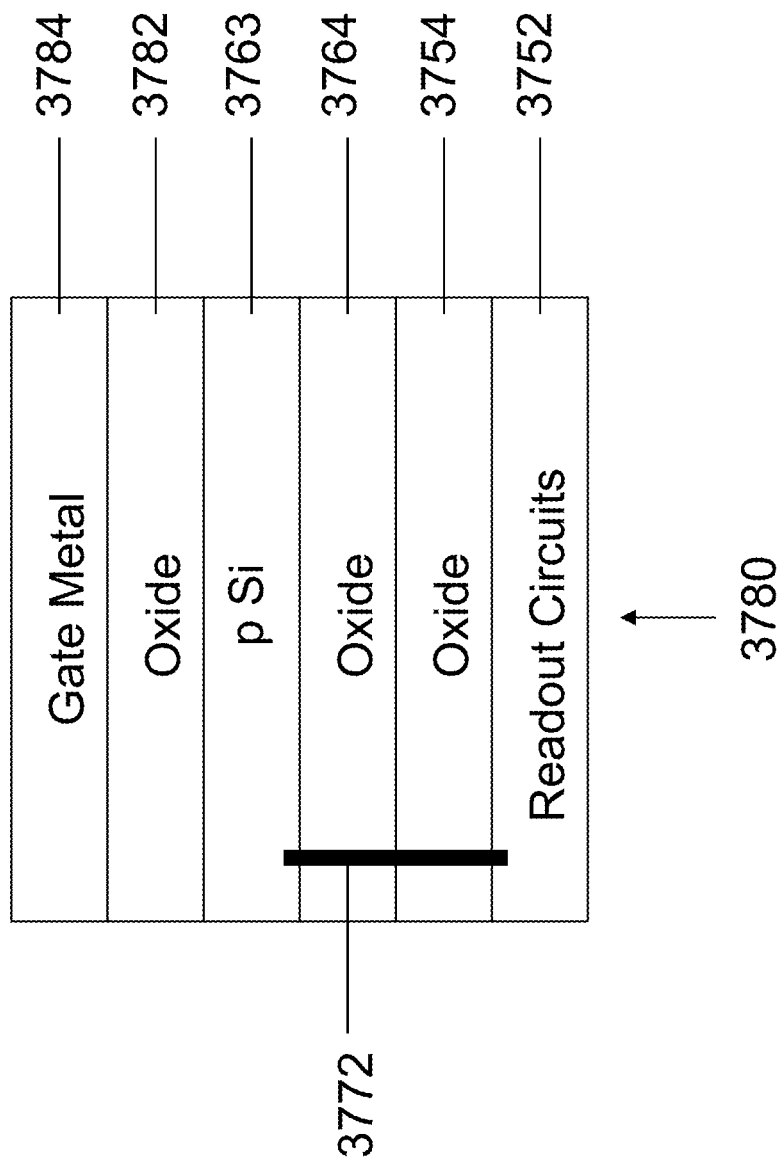

Step (D) is illustrated in FIG. 11F, where an oxide layer 3782 is grown on top of the previous stack 3770 to act as a gate dielectric, and gate metal layer 3784 is deposited by using a lithographic mask on the oxide layer 3782 to form the MOS gates of the CCD cells. Thus stacked CCD with underlying readout circuits 3780 may be formed. Various elements of FIG. 11F such as 3752, 3754, 3763, 3764, and 3772 have been described previously.

Persons of ordinary skill in the art will appreciate that while Silicon has been suggested as the material for the CCD substrate layers of FIG. 11D, any other appropriate semiconductor material like Ge, InGaAsP could be utilized. The doping of such material may also vary from p-type to n-type depending on whether the charges to be collected are electrons or holes respectively. Moreover, additional implants and structural modifications may be performed to optimize the charge collection within the substrate. Thus the invention is to be limited only by the appended claims.

Stacked High Dynamic Range (HDR) Sensor

In digital cameras, the typical approach is to capture images using exposure bracketing, and then combining them into a single HDR image. The issue with this is that multiple exposures are performed over some period of time, and if there is movement of the camera or target during the time of the exposures, the final HDR image will reflect this by loss of sharpness. Moreover, multiple images may lead to large data in storage devices. Other methods may use software algorithms to extract HDR information from a single exposure, but as they can only process information that is recordable by the sensor, there is a permanent loss of some details.

A solution may be to use image sensors that have HDR capability. A single layer of photo-detectors within the image sensor is hard-pressed to achieve this. In the case where the light-collecting area is small, the photo-detector is capable of detecting minute amounts of photocurrent but may saturate quicker, whereas when the light-collecting area is large, the photo-detector is capable of handling large amounts of light, but may not be able to detect small photocurrents. Combining them by stacking allows a photo-detector cell to have the capability to detect both low and high luminosity without saturating.

Figure 12A:
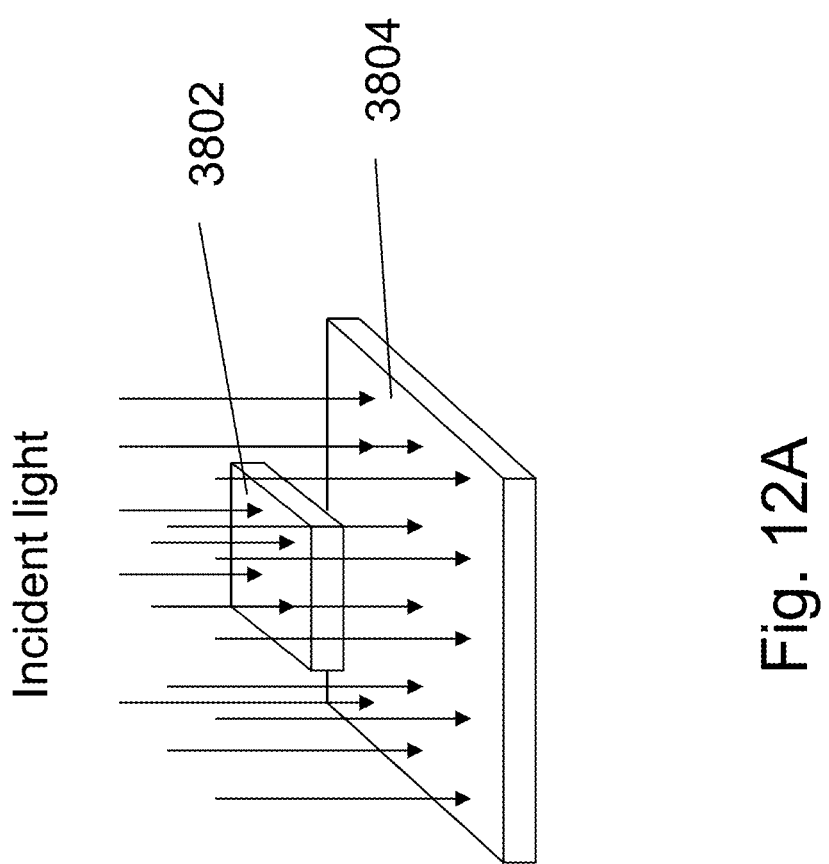

FIG. 12A illustrates the of stacking smaller photo-detector 3802 which collects less light and is more sensitive than larger photo-detector 3804, on top of the larger photo-detector 3804 which collects more light and is less prone to saturation than the smaller photo-detector 3802.

Figure 12C:
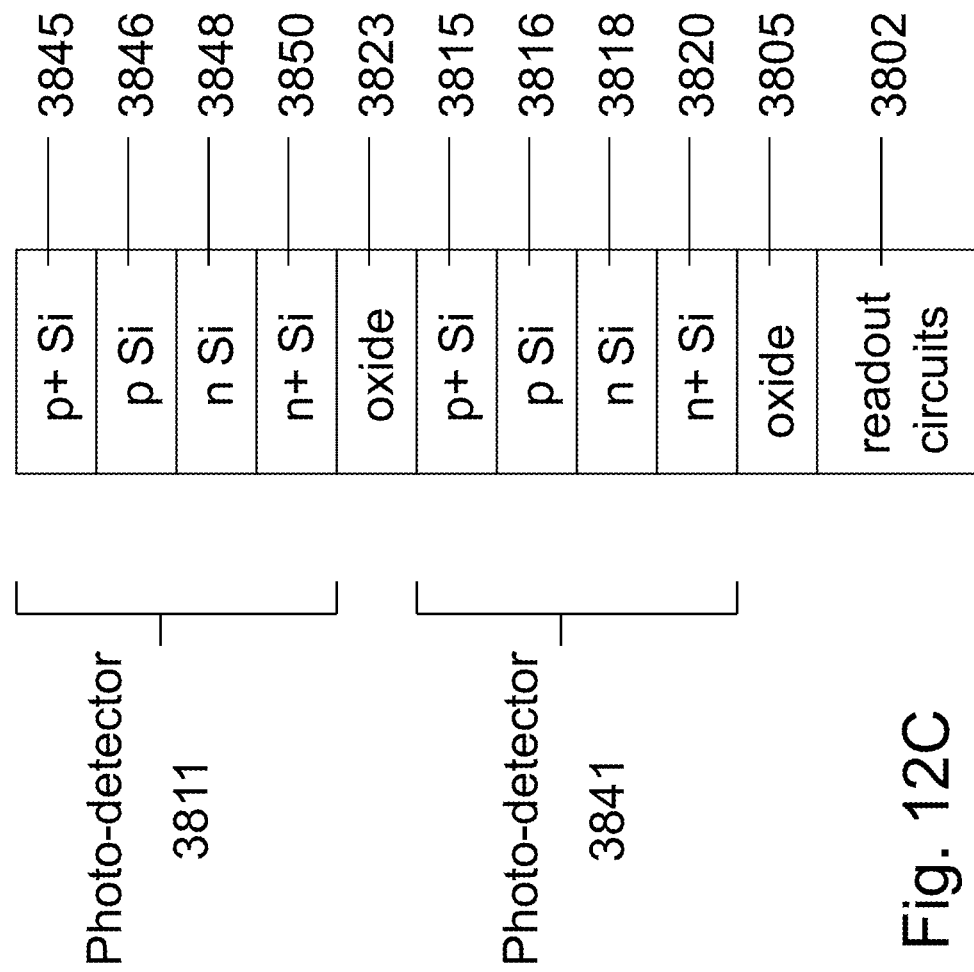
Figure 12D:
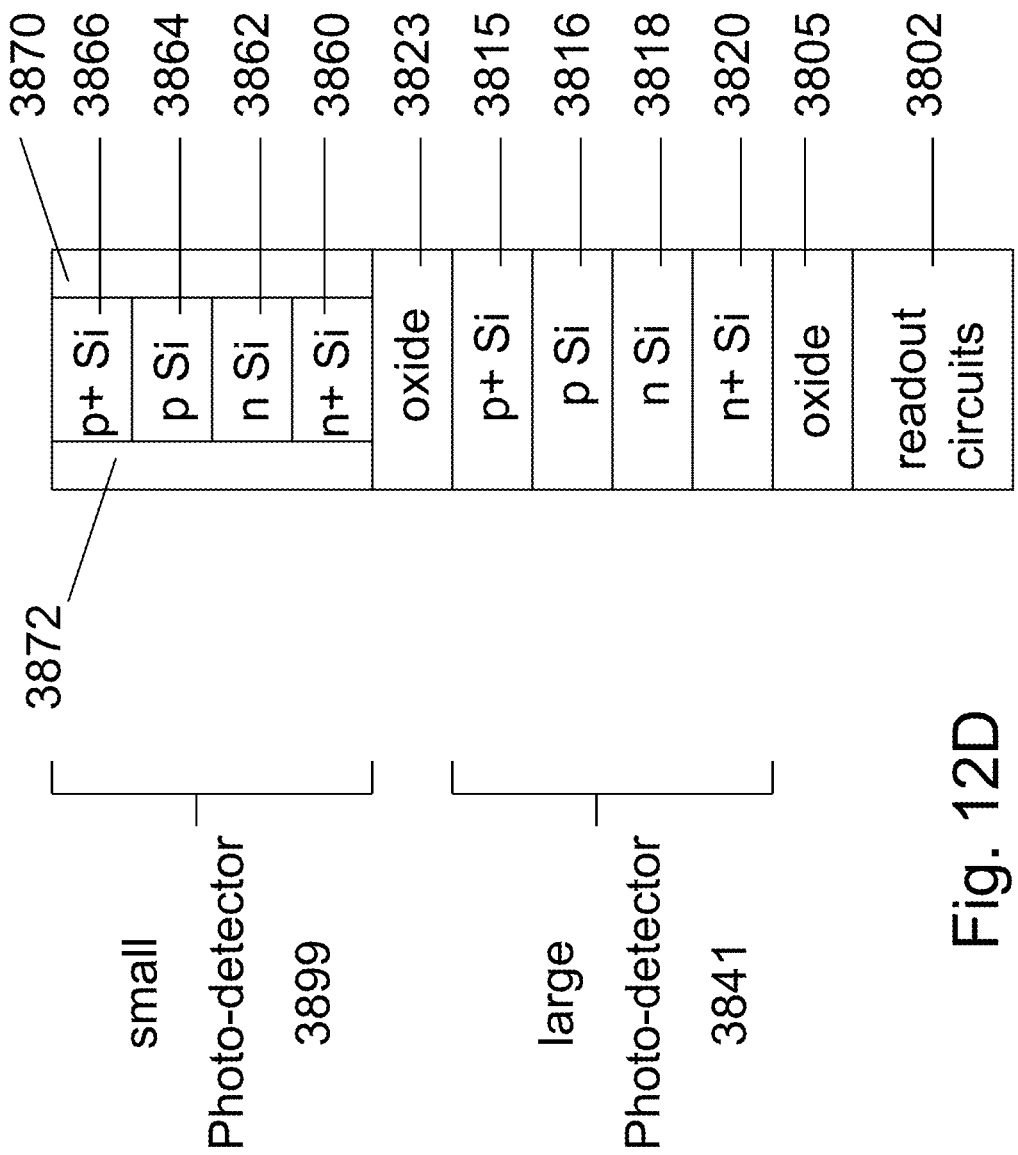

FIG. 12B-12D illustrate an embodiment of the invention, where layer transfer technology may be utilized for constructing the layers for an HDR image sensor with underlying readout circuits. The process of forming the HDR image sensor may include several steps that may occur in a sequence from Step A to Step C.

Step (A): FIG. 12B illustrates the first step for constructing this image sensor. Read out silicon wafer 3800 may include read-out circuits 3802 constructed on it, above which an oxide layer 3804 may be deposited. Silicon wafer structure 3810 may include substrate 3812, p+ Silicon layer 3814, p Silicon layer 3816, n Silicon layer 3818, n+ Silicon layer 3820 and oxide layer 3822. These layers may be formed using procedures similar to those described in FIGS. 15A-G. An anneal may then performed to activate dopants in the layers. Hydrogen may be implanted in the wafer at a certain depth depicted by dashed line 3830. Another Silicon wafer structure 3840 may include substrate 3842, p+ Silicon layer 3844, a p Silicon layer 3846, n Silicon layer 3848, n+ Silicon layer 3850 and oxide layer 3852. These layers may be formed using procedures similar to those described in FIG. 3A-3G. An anneal may then be performed to activate dopants in various layers. Hydrogen may be implanted in the wafer at a certain depth depicted by dashed line 3860.

Step (B): FIG. 12C illustrates the structure of this embodiment of the invention before contacts and metallization are constructed. The p+pnn+ Silicon layers of Silicon wafer structure 3810 of FIG. 12B may be layer transferred atop the read-out circuit layer of read out silicon wafer 3800. This may be done using ion-cut layer transfer procedures similar to those described in respect to FIG. 3A-G. Following this, the p+pnn+ silicon layers of another Silicon wafer structure 3840 may be layer transferred atop the Read out silicon wafer 3800 and the p+pnn+ Silicon layers of Silicon wafer structure 3810. This may be done using procedures similar to those described in FIG. 3A-3G. The structure shown in FIG. 12C therefore has a layer of read-out circuits 3802, above which a top photo-detector 3811, and another photo-detector 3841 are present. Procedures for layer transfer and alignment for forming the image sensor in FIG. 12C are similar to procedures used for constructing the image sensor shown in FIG. 3A-3G. Oxide layers 3805 and 3823 may be the results of oxide-to-oxide bonding. p+ Si layers 3815 and 3845 may be results of the cleave and polish operations from the ion-cut layer transfer processes. Various elements of FIG. 12C such as 3802, 3816, 3818, 3820, 3846, 3848, and 3850 have been described previously.

Step (C): FIG. 12D illustrates the process performed on the top photo-detector 3811 to reduce its effective image sensor cell area. The edges of top photo-detector 3811 may be lithographically defined, etched, then filled with oxide, which is transparent to visible light. n+ Si layer 3860, n Si layer 3862, p Si layer 3864, p+ Si layer 3866, and oxide layers 3870 and 3872 may be results of this processing, thus forming small photo-detector 3899. Various elements of FIG. 12D such as 3802, 3805, 3815, 3816, 3818, 3820, and 3823 have been described previously. Contacts, metallization, packaging and other steps (not shown) as described elsewhere herein may done to the structure shown in FIG. 12D to form the HDR image sensor. The three mono-crystalline silicon layers, small photo-detector 3899, large photo-detector 3899, and read-out circuits 3802, may be electrically connected by conducting vias that may have a radius less than about 400 nm due to the thin layers being layer transferred. This may be accomplished with processing described herein and in US patent application 2011/0121366.

Persons of ordinary skill in the art will appreciate that while Silicon has been suggested as the material for the HDR photo-detector layers of FIG. 12D, any other appropriate semiconductor material like Ge, could be utilized. Moreover, additional implants and structural modifications may be performed to optimize the charge collection within the photo-detectors. Thus the invention is to be limited only by the appended claims.

2-Sensor Camera System

Figure 13A:
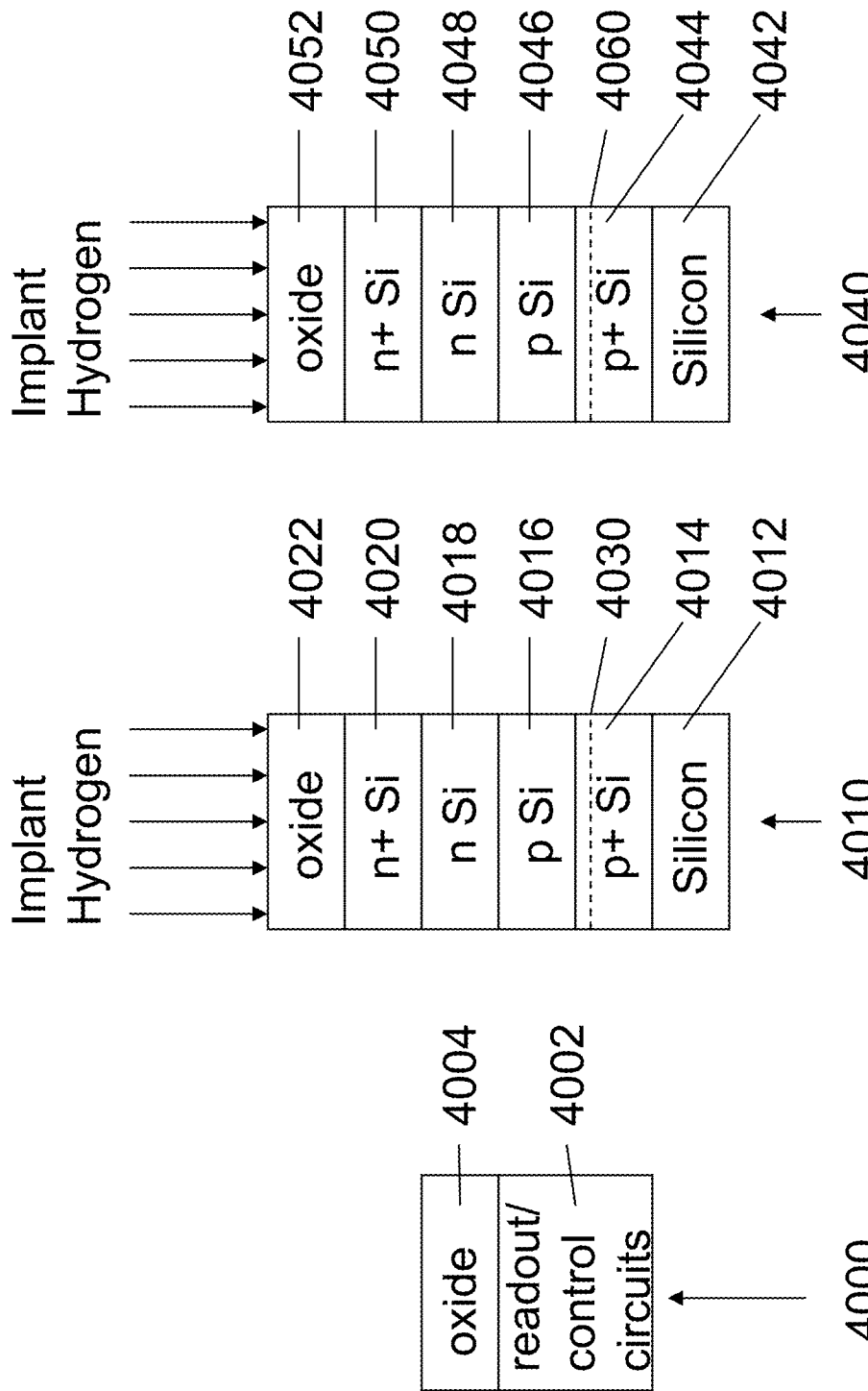
FIG. 13A-13C illustrate an embodiment of this invention, where two image sensor arrays are monolithically stacked on top of each other with an insulating layer between them using layer transfer processes.
Figure 13B:
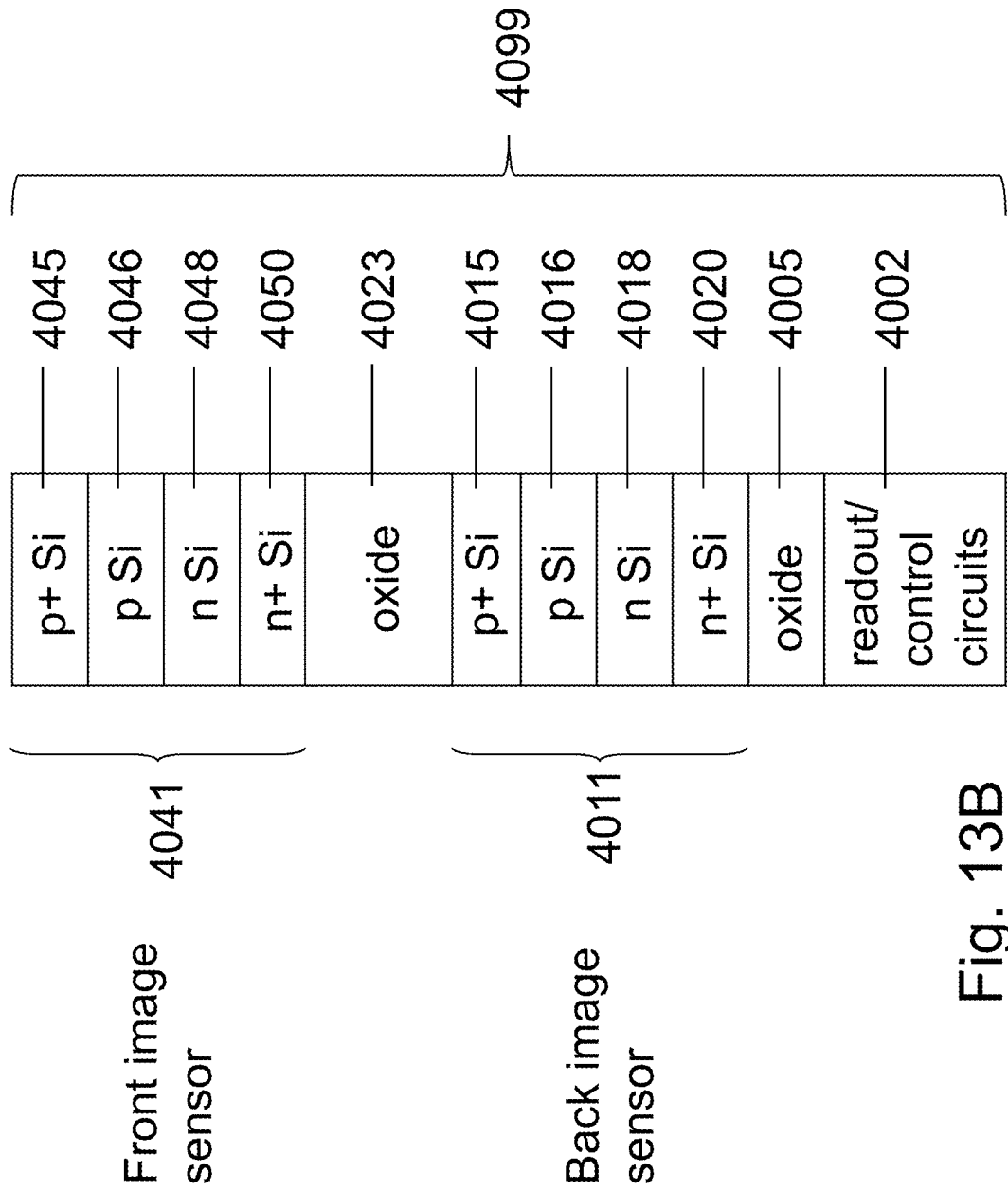

FIG. 13A-13B illustrate an embodiment of the invention, where layer transfer technology may be utilized for constructing the layers for an image sensor chip that may include two image sensor arrays in parallel planes to each other with an isolation layer between each of the two image sensor arrays, and between the two image sensor arrays and the underlying readout/control circuits. The process of forming the two-image sensor chip may include several steps that may occur in a sequence from Step A to Step B.

Step (A): FIG. 13A illustrates the first step for constructing the image sensor chip. Read-out circuit layer structure 4000 may include a mono-crystalline silicon wafer with readout/control circuits 4002 constructed on it, above which an oxide layer 4004 may be deposited. Structure 4010 may include another mono-crystalline silicon wafer with substrate 4012, p+ Silicon layer 4014, p Silicon layer 4016, n Silicon layer 4018, n+ Silicon layer 4020 and oxide layer 4022. These layers may be formed using procedures similar to those described in FIG. 3A-3G. An anneal may be performed to activate dopants. Hydrogen may be implanted into p+ Silicon layer 4014 at a certain depth depicted by dashed line 4030. Layer structure 4040 may include another mono-crystalline silicon wafer with substrate 4042, p+ Silicon layer 4044, a p Silicon layer 4046, n Silicon layer 4048, n+ Silicon layer 4050 and oxide layer 4052. These layers may be formed using procedures similar to those described in FIG. 3A-3G. An anneal may be performed to activate dopants. Hydrogen may be implanted in p+ Silicon layer 4044 at a certain depth depicted by dashed line 4060.

Step (B): FIG. 13B illustrates the structure of the embodiment of the invention before contacts and metallization are constructed. The p+pnn+ Silicon layers of structure 4010 of FIG. 13B may be layer transferred atop the read-out circuit layer structure 4000. This may be done using smart layer transfer procedures similar to those described in respect to FIG. 3A-3G. Following this, the p+pnn+ silicon layers of layer structure 4040 may be layer transferred atop the read-out circuit layer structure 4000 layer and the p+pnn+ Silicon layers of structure 4010. This may be done using procedures similar to those described in FIGS. 15A-G. The structure shown in FIG. 13B therefore has a layer of read-out circuits 4002, above which a photo-detector back image sensor 4011, and another photo-detector front image sensor 4041 may be present. Procedures for layer transfer and alignment for forming the image sensor in FIG. 13B are similar to procedures used for constructing the image sensor shown in FIG. 3A-3G. Oxide layers 4005 and 4023 may be the results of oxide-to-oxide bonding and the ion-cut processing. In addition, oxide layer 4023 may form the isolation layer separating back image sensor 4011 and front image sensor 4041 and may require careful calibration of its thickness, which may range from about 10 micro-meters to about 400 micro-meters. The material for the isolation layer may be chosen such that it has a large enough bandgap that will let substantially all wavelengths of visible light through to the back image sensor 4011. p+ Si layers 4015 and 4045 may be results of the cleave and polish operations from the layer transfer processes. Various elements of FIG. 13C such as 4002, 4016, 4018, 4020, 4046, 4048, and 4050 have been described previously. Thus image sensor chip 4099 is formed. Back image sensor 4011 and front image sensor 4041 may each have thicknesses of less than about 2 microns, less than about 1 micron, less than about 400 nm and/or less than about 200 nm. Front image sensor 4041 may typically be thinner than back image sensor 4011. Base wafer substrate 4012 and substrate 4042 may be reused to create portions of another or additional image sensor chip.

Figure 13C:
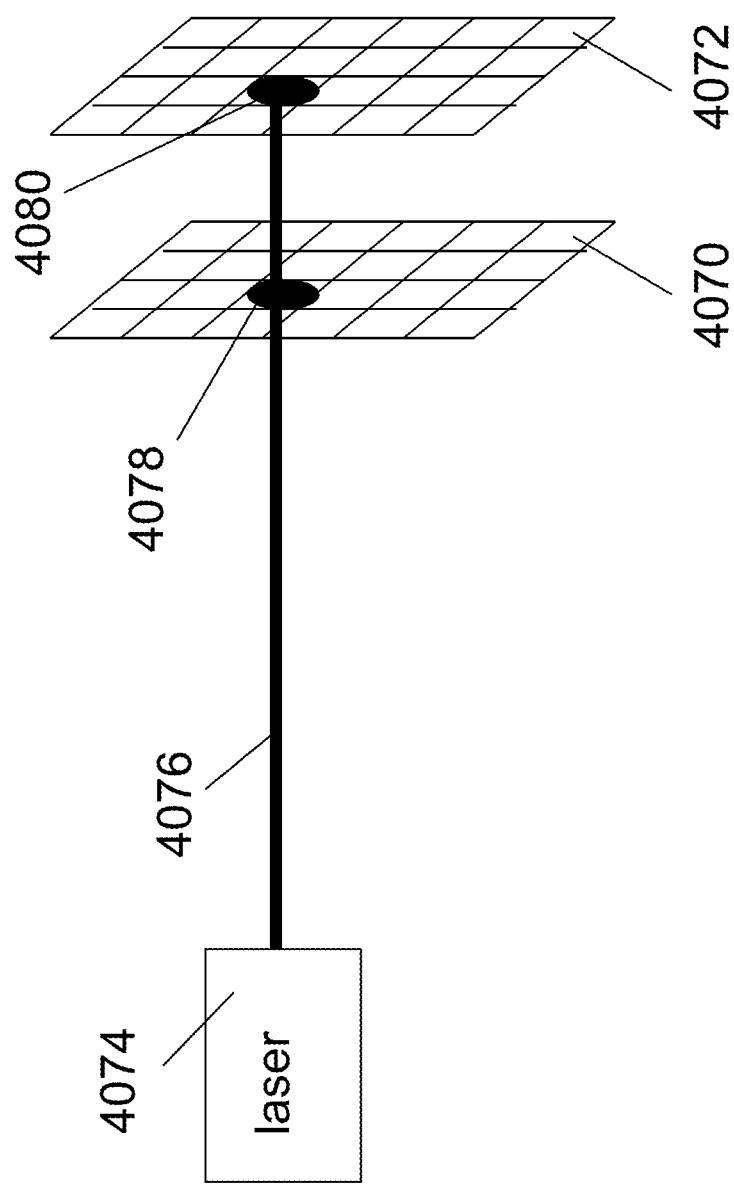

FIG. 13C illustrates a method by which pixel alignment between the two sensor arrays may be checked. A laser device 4074 projects a laser beam 4076 with a diameter smaller than the size of the pixel elements of front image sensor 4070 and back image sensor 4072. The laser beam 4076 may be of a wavelength that is detectable by that of the front image sensor 4070 and back image sensor 4072, and may be in a direction perpendicular to the two sensors. A particular photo-detector 4078 on front image sensor 4070 detects the laser beam 4076. As only part of the laser beam 4076 may be absorbed, the remainder will continue onto photo-detector 4080 on back image sensor 4072 which detects the attenuated laser beam 4076. If the location of photo-detector 4078 on front image sensor 4070 corresponds to the location of photo-detector 4080 on back image sensor 4072, they are determined to be in alignment. Otherwise, adjustments on one of the image sensors may be performed to achieve alignment. The process may be repeated for a sampling of more photo-detector sites throughout the image sensors 4070 and 4072 where the chosen sites may be near the edges of the front image sensor 4070 and back image sensor 4072, and may form the vertices of a triangle, square or other polygons as to ensure that alignment is guaranteed throughout front image sensor 4070 and back image sensor 4072. The alignment process may also be used to determine an accurate measure of the distance between the two sensors by timing the arrival of the laser light, which may be pulsed, onto each of the sensors.

Persons of ordinary skill in the art will appreciate that while Silicon has been suggested as the material for the photo-detector layers of FIG. 13A-13B, any other appropriate semiconductor material such as, for example, Ge, could be utilized. For example, materials with different bandgaps could be used for each of the image sensor arrays so as to have sensitivities to different optical spectra or optical spectrum. Furthermore, the geometric structure of the photodetectors may also be altered independently so as to allow each one to have different optical intensity saturation levels. Moreover, additional implants and structural modifications may be performed to optimize the charge collection within the photo-detectors. Further, adjustments in the alignment of the photo-detectors may be performed virtually, as part of a software program and memory with offsets. Thus the invention is to be limited only by the appended claims.

FIG. 14A illustrates an embodiment of the invention, where an imaging system 4110 may include a lens 4112 with focal length f and aperture of size R, a front image sensor 4113 set at distance z2 from the lens 4112 on its image side (the location of which corresponds to the image focal plane of another plane 4117 at distance d2 from the lens 4112 on its real side), a back image sensor 4114 set at a distance z1 from the lens 4112 on its image side (the location of which corresponds to the image focal plane of another plane 4116 at distance d1 from the lens 4112 on its real side). The real workspace on the real side of the lens 4112 may be bounded by the plane 4116 and plane 4117 at distances d1 and d2 respectively from the lens 4112 on the real side. The images collected from front image sensor 4113 and back image sensor 4114 may be processed and stored by an integrated image processor and memory system 4106, which may be connected to the image sensor arrays front image sensor 4113 and back image sensor 4114. For example, a plane or slice 4111 of a scene in the workspace bounded by plane 4117 and plane 4116 may have a corresponding image focal plane 4115 on the image side of lens 4112, which may lie between front image sensor 4113 and back image sensor 4114. Front image sensor 4113 and back image sensor 4114 may be parallel with respect to each other. The term imaging system may also be referred to as a camera system, or an optical imaging system, herein.

For reconstructing images on planes on either side of the lens 4112, image mapping may be performed using algorithms from Fourier optics utilizing the Fourier transform, available through commercial packages such as the MATLAB Image Processing Toolbox. It will be useful to recall here the Lens-maker's equation which states that for an object on a plane at a distance o from a lens of focal length f where f<<o, the focal image plane of the object will lie at a distance i on the opposite side of the lens according to the equation: $1/o + 1/i = 1/f$.

Figure 14B:
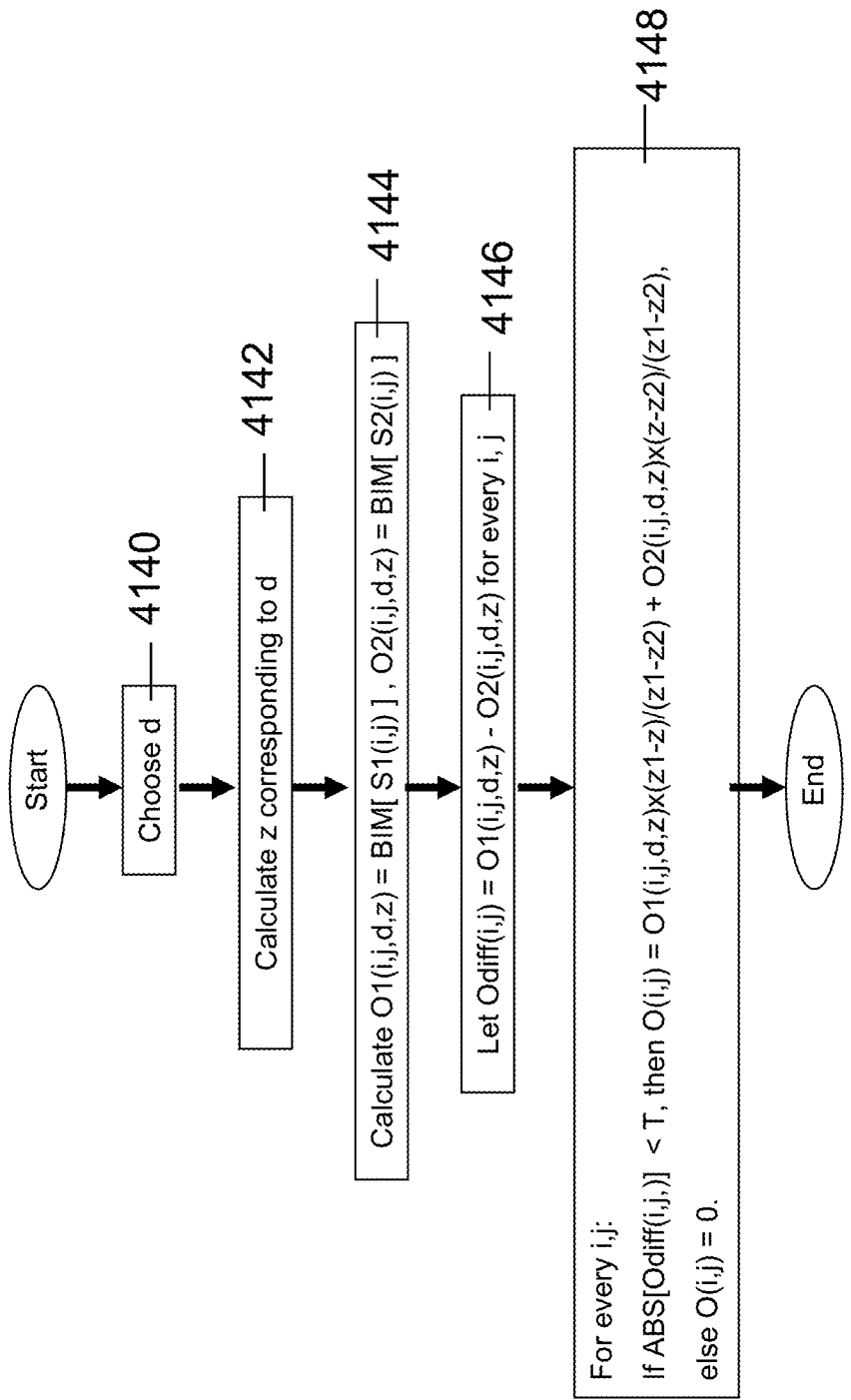

For the image reconstruction algorithms discussed herein, the following notations will be used:
d:=distance from lens on real side
d0:=initial distance from lens on real side
z:=distance from lens on image side
s:=space step interval
f(s):=nonlinear step interval e.g. $f(s)=s^n$
t:=time
t0:=starting time
ts:=time step interval
S1(i,j):=matrix data of image detected on front image sensor 4113
S2(i,j):=matrix data of image detected on back image sensor 4114
O(i,j):=reconstructed image from S1 and S2
OS(i,j):=stored reconstructed data O(i,j)
S1(i,j,t):=stored matrix data of image detected on front image sensor 4113 at time t
S2(i,j,t):=stored matrix data of image detected on back image sensor 4114 at time t FIM(O, d, z):=forward image mapping (FIM) operation from an image O on the real side of the lens 4312 at distance d from lens 4312 to the image side of the lens 4312 at a distance z from lens 4312
BIM(O, d, z):=backward image mapping (BIM) operation from an image O on the image side of the lens 4312 at distance z from lens 4312 to the real side of the lens 4312 at a distance d from lens 4312
I1(i,j,d,z1):=FIM operation of object matrix upon S1(i,j) at specified d, and z=z1
I2(i,j,d,z2):=FIM operation of object matrix upon S2(i,j) at specified d, and z=z2
IS1(i,j):=stored I1 data
IS2(i,j):=stored I2 data
O1(i,j,d,z1):=BIM operation on S1(i,j) at specified d, z=z1
O2(i,j,d,z2):=BIM operation on S2(i,j) at specified d, and z=z2
Odiff(i,j):=O1(i,j,d,z)−O2(i,j,d,z) for every i, j
Odiff(i,j,k):=O1(i,j,d,z)−O2(i,j,d,z) for every i, j with k as the iteration variable if values are to be stored
ABS[a]:=absolute value operation on a scalar a
NORM[A]:=A matrix norm operation (for example, a 2-norm)
GET_SHARP[A]:=extract object within image data that exhibits the most contrast compared to its surroundings.
T:=error tolerance between the corresponding elements of 2 matrices
E:=error tolerance of any scalar comparison
FFT(M):=fast fourier transform operation on a matrix M
IFFT(M):=inverse fast fourier transform operation on a matrix M
OF(i,j):=O(i,j) in Fourier space
OF1(i,j):=O1(i,j) in Fourier space
OF2(i,j):=O2(i,j) in Fourier space
OFdiff(i,j):=OF1(i,j,d,z)−OF2(i,j,d,z) for every i, j FIG. 14B illustrates an algorithm by which a plane of distance d from the lens 4112 is chosen
by the viewer and the image on that plane may be reconstructed and is outlined here as Algorithm 41A:
Step A (4140): choose d>>f, d1<=d<=d2
Step B (4142): calculate z from d using the lens-maker's formula
Step C (4144): O1 and O2 are calculated by BIM operations on S1 and S2 respectively
Step D (4146): Calculate Odiff:=O1−O2 for every element in the matrices O1 and O2
Step E (4148): Calculate the linear distance weighted estimate of the reconstructed object O(i,j) as expressed by:
For every i,j:

$$\text{If } ABS[Odiff(i, j)] < T, \text{ then} \tag{F}$$

$$O(i, j) = $$
$$O1(i, j, d, z) \times (z1 - z)/(z1 - z2) + O2(i, j, d, z) \times (z - z2)/(z1 - z2),$$
$$\text{else } O(i, j) = 0. \tag{G}$$

Figure 14C:
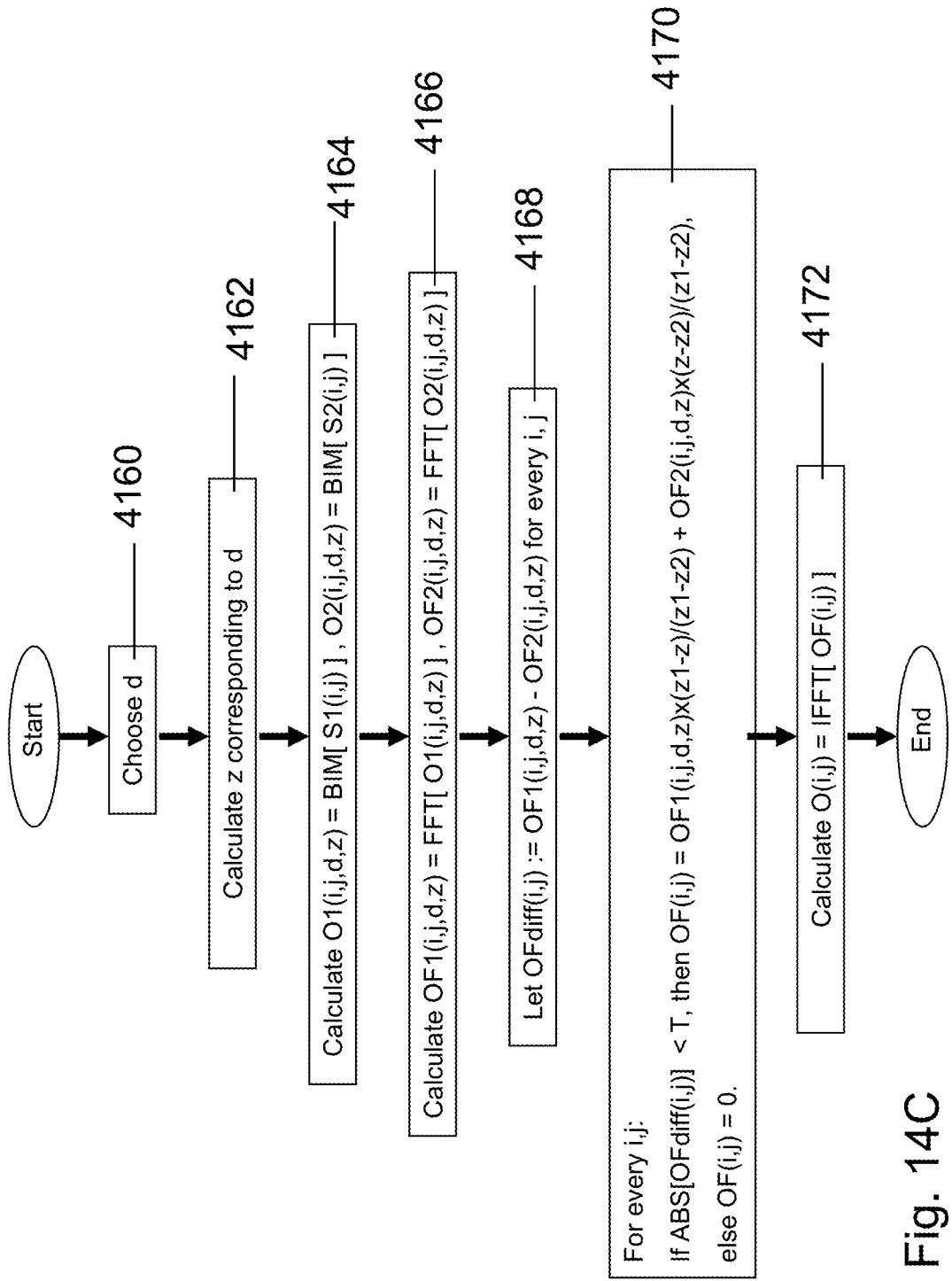

FIG. 14C illustrates another algorithm by which a plane of distance d from the lens 4112 is chosen by the viewer and the image on that plane may be transformed in Fourier space, reconstructed, then transformed back in real space, and is outlined here as Algorithm 41B:

Step A (4160): choose d>>f, d1<=d<=d2

Step B (4162): calculate z from d using the lens-maker's formula

Step C (4164): O1 and O2 are calculated by BIM operations on S1 and S2 respectively Step D (4166): OF1 and OF2 are calculated by FFT operations on O1 and O2 respectively Step E (4168): OFdiff:=OF1−OF2 is calculated for every element in the matrices OF1 and OF2

Step F (4170): Calculate the linear distance weighted estimate of the reconstructed object OF (i,j) in Fourier space as expressed by:

For every i,j:

$$\text{If } ABS[OFdiff(i, j)] < T, \text{ then} \tag{H}$$

$$OF(i, j) =$$

$$OF1(i, j, d, z) \times (z1 - z)/(z1 - z2) + OF2(i, j, d, z) \times (z - z2)/(z1 - z2),$$

$$\text{else } OF(i, j) = 0. \tag{I}$$

Step G(4172): $O(i, j)$ is extracted in real space by performing the $$IFFT \text{ operation on } OF(i, j)$$

Figure 14D:
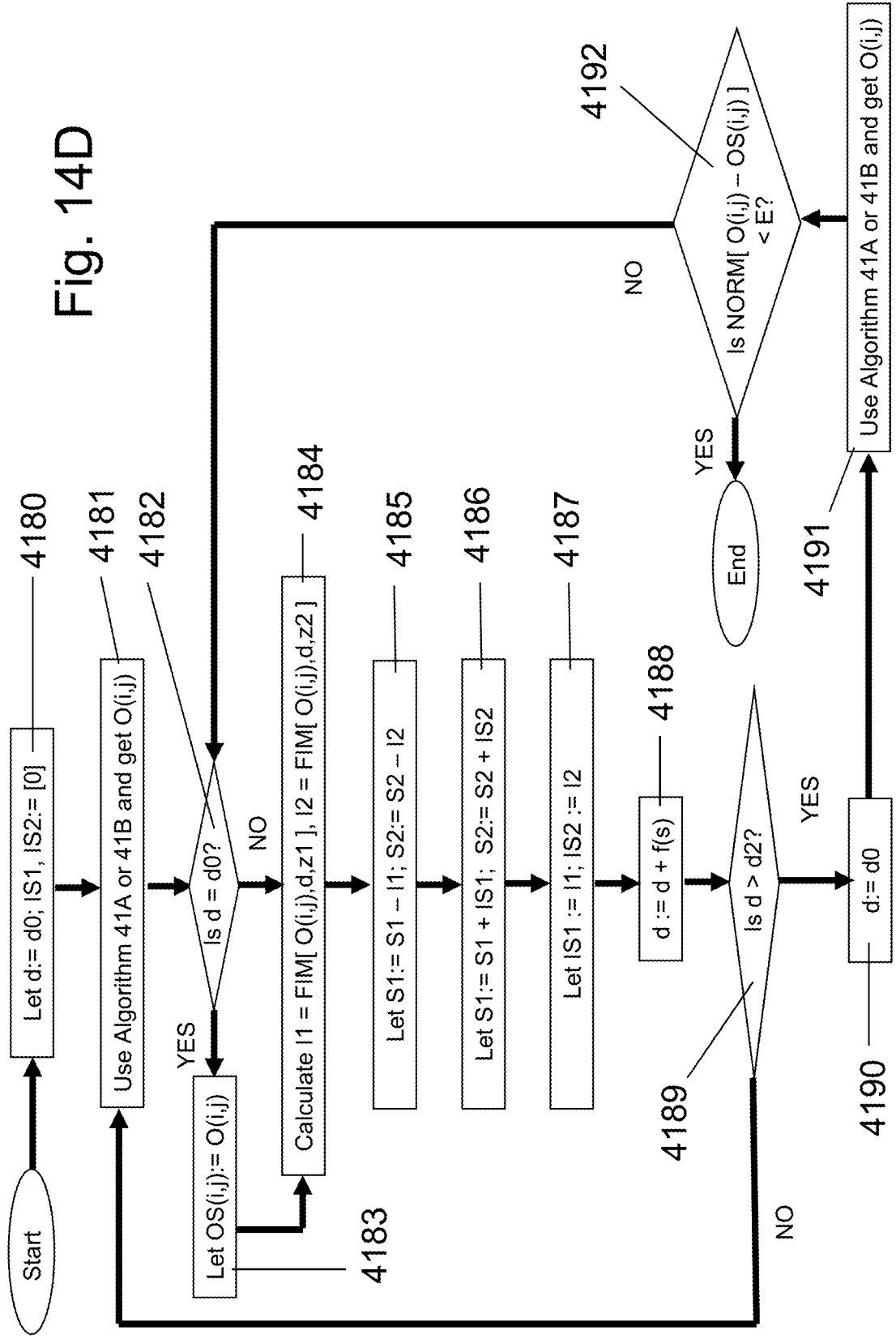

FIG. 14D illustrates an iterative algorithm by which the workspace may be reconstructed using planes at intervals of the distance d from the lens 4112 between d1 and d2. A stepping algorithm may be performed wherein d marches from d1 towards d2 which may use nonlinear intervals such as a geometric relationship. Upon completion, the cycle may be repeated and the reconstructed image of a plane at a particular d is compared to the image of the same plane from the previous cycle. If the difference between these two images is within some error tolerance, then the set of images from that particular cycle may be accepted as the reconstruction of the workspace. Otherwise, the cycle may continue through another iteration. The algorithm is outlined here as Algorithm 41C:

Step A (4180): Start with d=d0, d1<=d0<=d2, initialize IS1, IS2 as zero matrices Step B (4181): Use Algorithm 41A or Algorithm 41B to calculate O (i,j)

Step C (4182): Check if d=d0, if yes go to Step D otherwise continue to Step E Step D (4183): Store O(i,j) into OS(i,j)

Step E (4184): Calculate I1 and I2 by FIM operations on O(i,j)

Step F (4185): Take I1 and I2 out from sensor data S1 and S2 respectively.

Step G (4186): Add stored data IS1 and IS2 (I1 and I2 from previous step) to sensor data S1 and S2 respectively.

Step H (4187): Store current I1 and I2 into IS1 and IS2 respectively.

Step I (4188): Increment d by some interval function such as a geometric relationship.

Step J (4189): If d has not exceeded d2, loop back to Step B (4181) and continue from there Step K (4190): If d has exceeded d2, reset d=d0

Step L (4191): Use Algorithm 41A or Algorithm 41B to calculate O(i,j)

Step M (4192): Compare O(i,j) with OS(i,j) using a matrix norm operation, and if within error tolerance, algorithm ends. Else algorithm loops back to Step C (4182) and continues on.

Figure 15A:
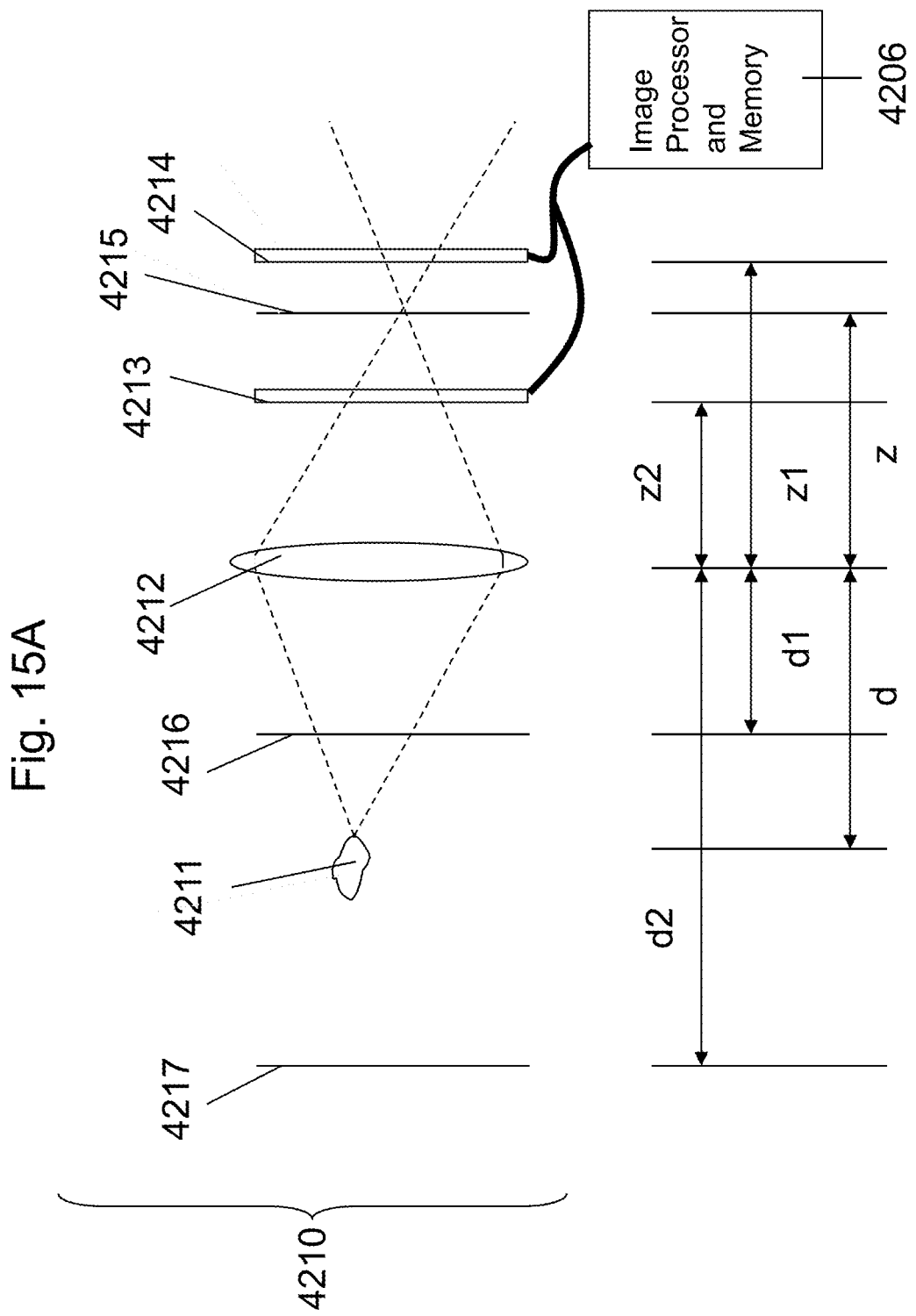
FIG. 15A-15C illustrate an embodiment of this invention, where algorithms are described to reconstruct an object of unknown distance from the lens imaged by a camera system that includes a lens and two image sensor arrays parallel to each other and to the lens, wherein each sensor array is of distinct distance from the lens.

FIG. 15A illustrates an embodiment of the invention, where an imaging system 4210 may include a lens 4212 with focal length f and aperture of size R, a front image sensor 4213 set at distance z2 from the lens 4212 on its image side (the location of which corresponds to the image focal plane of another plane 4217 at distance d2 from the lens 4212 on its real side), a back image sensor 4214 set at distance z1 from the lens 4212 on its image side (the location of which corresponds to the image focal plane of another plane 4216 at distance d1 from the lens 4212 on its real side). The real workspace on the real side of the lens 4212 may be bounded by plane 4216 and plane 4217 at distances d1 and d2 respectively from the lens 4212 on the real side. A distinct object 4211 lies on a plane at an unknown distance d from the lens 4212, and assuming a general situation where d is neither equal to d1 nor d2, the images of the object 4211 on front image sensor 4213 and back image sensor 4214 will not be in sharp focus (blurred), and the object's image focal plane 4215 will lie between the sensor planes, front image sensor 4213 and back image sensor 4214. The images may be processed and stored by an integrated image processor and memory system 4206 connected to the image sensor arrays front image sensor 4213 and back image sensor 4214. Front image sensor 4213 and back image sensor 4214 may be parallel with respect to each other.

Figure 15B:
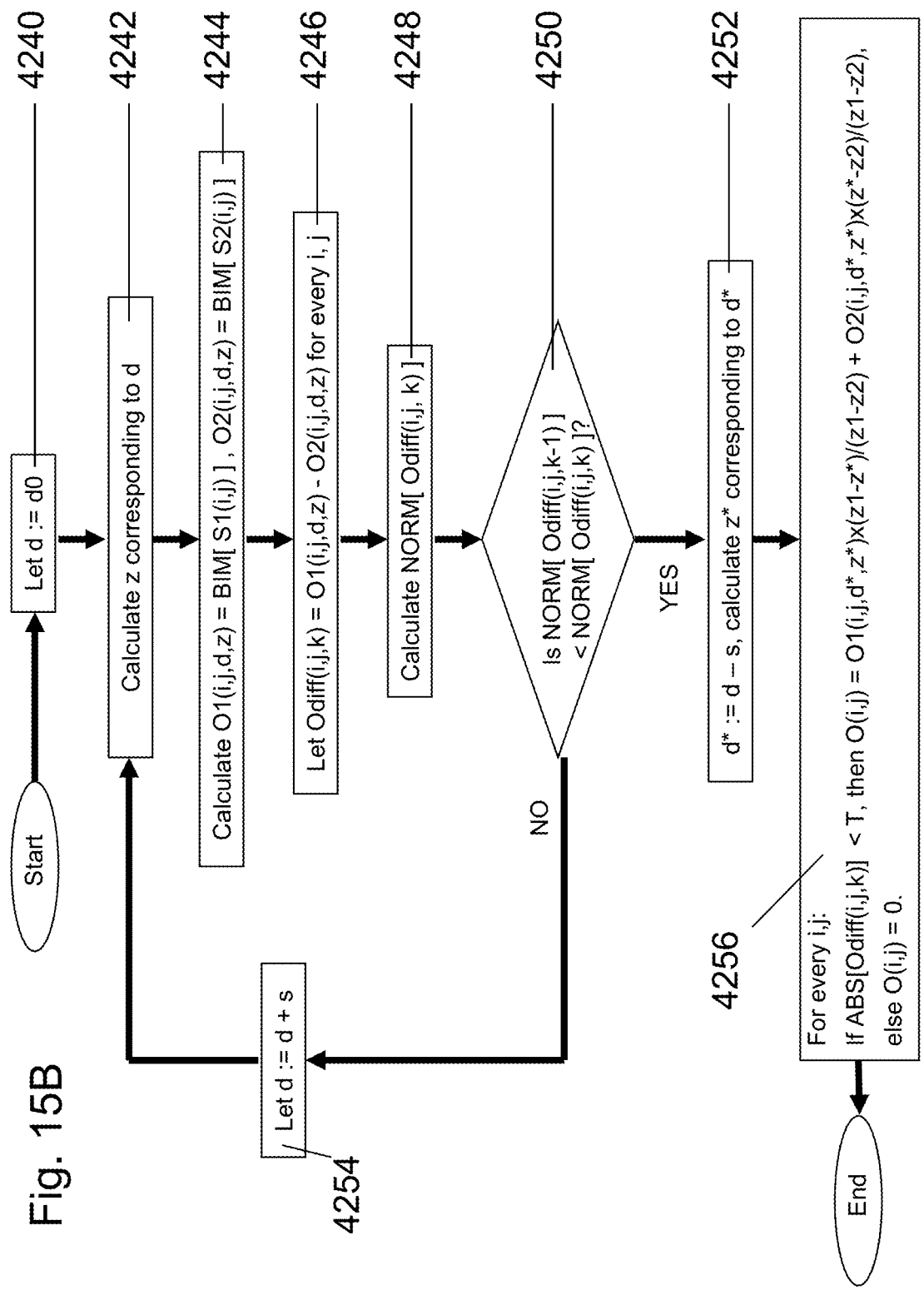

FIG. 15B illustrates an algorithm by which a single distinct object of unknown distance d from the lens 4212 is present and its image may be reconstructed. Determination of distance d of the object 4211 may be achieved through a marching algorithm searching for the minimum of Odiff(i,j) indicating best match, and is outlined here as Algorithm 42A:

Step A (4240): starting d=d0 is chosen, d1<=d0<=d2

Step B (4242): calculate z from d using the lens-maker's formula

Step C (4244): O1 and O2 are calculated by BIM operations on S1 and S2 respectively Step D (4246): Odiff:=O1−O2 is calculated for every element in the matrices O1 and O2

Step E (4248): NORM operation is performed on Odiff

Step F (4250): If the result of the NORM operation reveals a minimum, then

Step G (4252): d* is found and z* is calculated, else

Step H (4254): d is incremented by s and the steps B-F are repeated.

Step I (4256): Calculate the linear distance weighted estimate of the reconstructed object O(i,j) as expressed by:

For every i,j:

$$\text{If } ABS[Odiff(i, j)] < T, \text{ then} \tag{J}$$

$$O(i, j) =$$

$$O1(i, j, d, z) \times (z1 - z)/(z1 - z2) + O2(i, j, d, z) \times (z - z2)/(z1 - z2),$$

$$\text{else } O(i, j) = 0. \tag{K}$$

Figure 15C:
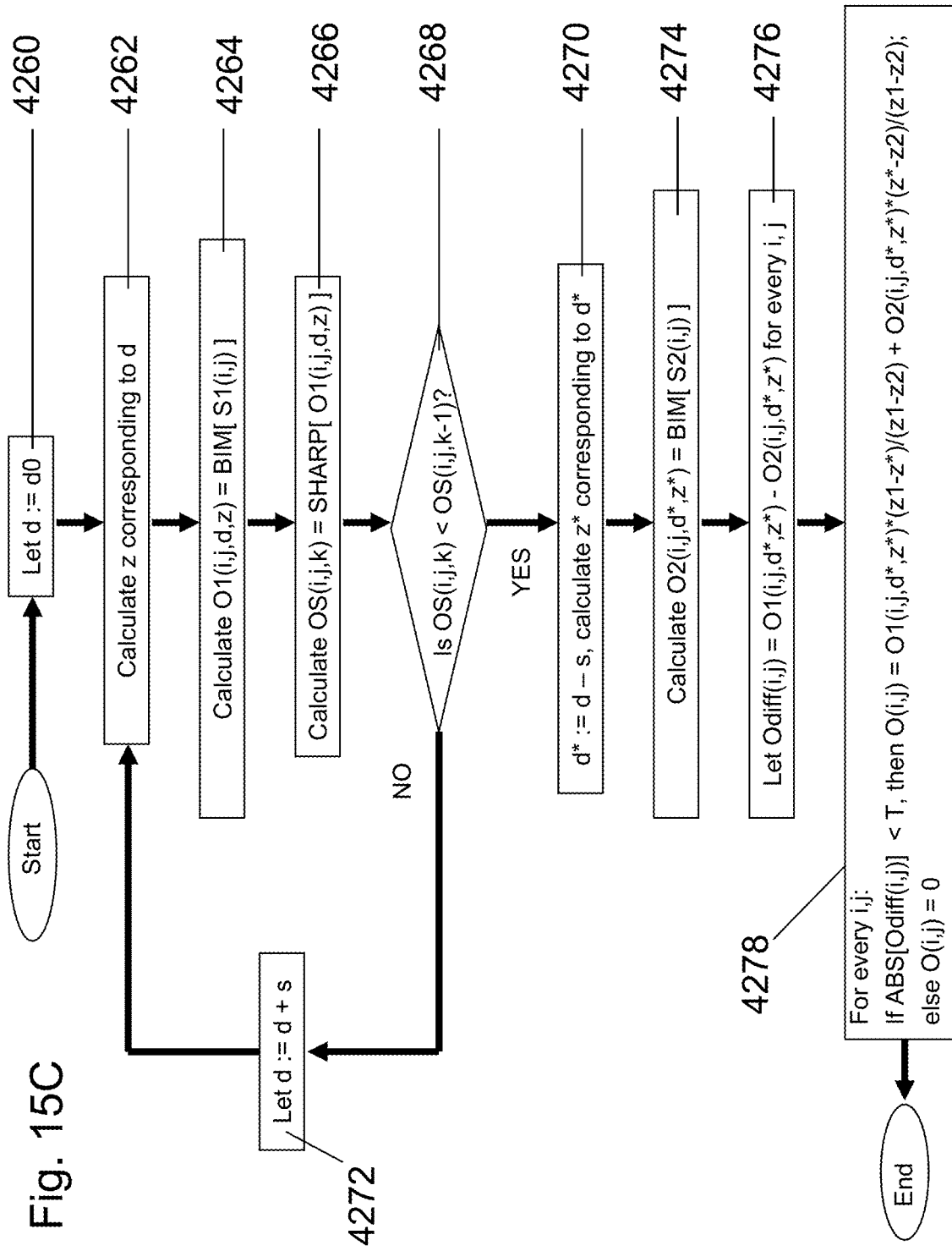

FIG. 15C illustrates another algorithm by which a single distinct object of unknown distance d from the lens 4212 is present and its image may be reconstructed. Determination of distance d of the object 4211 may be achieved through a marching algorithm searching for the maximum sharpness of O1(i,j) indicating best match. Sharpness may be calculated by any of known methods such as contrast and high-frequency content calculations. The algorithm is outlined here as Algorithm 42B:

Step A (4260): starting d=d0 is chosen, d1<=d0<=d2
Step B (4262): calculate z from d using the lens-maker's formula
Step C (4264): O1 is calculated by BIM operation on S1
Step D (4266): Sharpness value of O1 is calculated and stored in OS
Step E (4268): If a sharpness maximum is found,
then Step F (4270): d* is determined and z* is calculated
else
Step G (4272): d is incremented by s and steps B-E are repeated.
Step H (4274): O2 is calculated using BIM operation on S2 with d* and z*
Step I (4276): Odiff:=O1−O2 is calculated for every element in the matrices O1 and O2
Step J (4278): Calculate the linear distance weighted estimate of the reconstructed object O(i,j) as expressed by:
For every i,j:

$$\text{If ABS}[Odiff(i, j)] < T, \text{ then} \qquad (L)$$

$$O(i, j) =$$

$$O1(i, j, d, z) \times (z1 - z)/(z1 - z2) + O2(i, j, d, z) \times (z - z2)/(z1 - z2),$$

$$\text{else } O(i, j) = 0. \qquad (M)$$

FIG. 16A illustrates an embodiment of the invention, where an imaging system 4310 may include a lens 4312 with focal length f and aperture of size R, a front image sensor 4313 set at distance z2 from the lens 4312 on its image side (the location of which corresponds to the image focal plane of another plane 4317 at distance d2 from the lens 4312 on its real side), a back image sensor 4314 set at distance z1 from the lens 4312 on its image side (the location of which corresponds to the image focal plane of another plane 4316 at distance d1 from the lens 4312 on its real side). The real workspace on the real side of the lens 4312 may be bounded by plane 4316 and plane 4317 at distances d1 and d2 respectively from the lens 4312 on the real side. Multiple distinct objects 4311, 4318, 4319 lie on a plane at unknown distances d, d4, d5 from the lens 4312. For example, distinct object 4311 in the workspace bounded by plane 4317 and plane 4316 may have a corresponding image focal plane 4315 on the image side of lens 4312, which may lie between front image sensor 4313 and back image sensor 4314. The images may be processed and stored by an integrated image processor and memory system 4306 connected to the image sensor arrays front image sensor 4313 and back image sensor 4314. Front image sensor 4313 and back image sensor 4314 may be parallel with respect to each other.

Figure 16B:
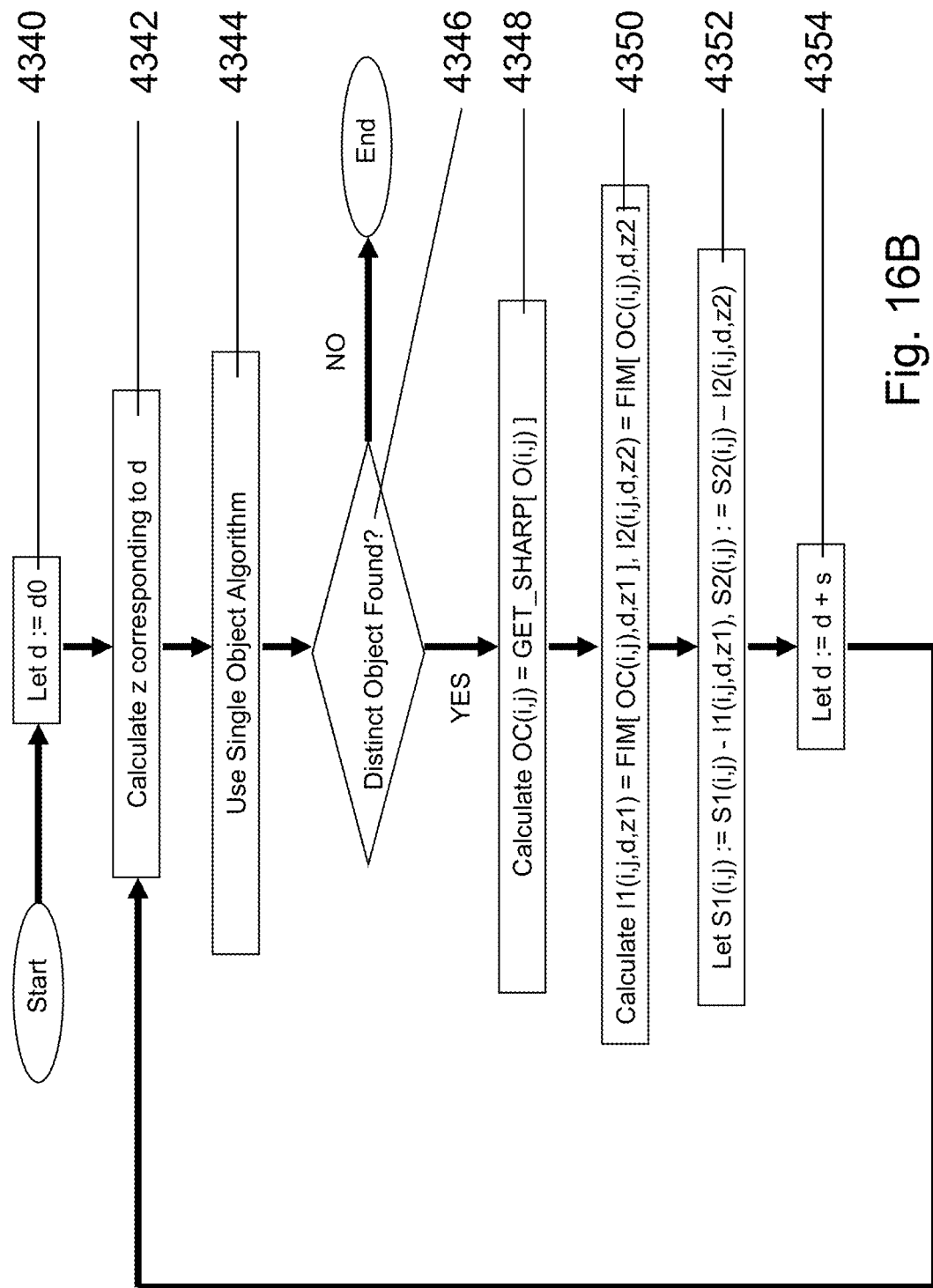

FIG. 16B illustrates an algorithm by which multiple distinct objects of unknown distances d, d4, d5 from the lens 4312 are present and their images may be successively reconstructed. Reconstruction of the objects may be achieved through a marching algorithm searching for each object from near to far from the lens in succession and performing an image subtraction operation after each object is found. The algorithm is outlined here as Algorithm 43A:

Step A (4340): starting d=d0 is chosen
Step B (4342): calculate z from d using the lens-maker's formula
Step C (4344): Use algorithms 41A, 42A or 42B to find nearest object.
Step D (4346): If no object is found, algorithm stops.
Step E (4348): If object is found, the GET_SHARP operation is performed to extract image of only the object OC from O
Step F (4350): I1 and I2 are calculated by FIM operations on OC upon front image sensor 4313 and back image sensor 4314 respectively: I1=FIM(OC, d, z1), I2=FIM (OC, d, z2)
Step G (4352): The sensor image data S1 and S2 are updated by subtracting I1 and I2 respectively.
Step H (4354): d is incremented to look for the next object.

Figure 17:
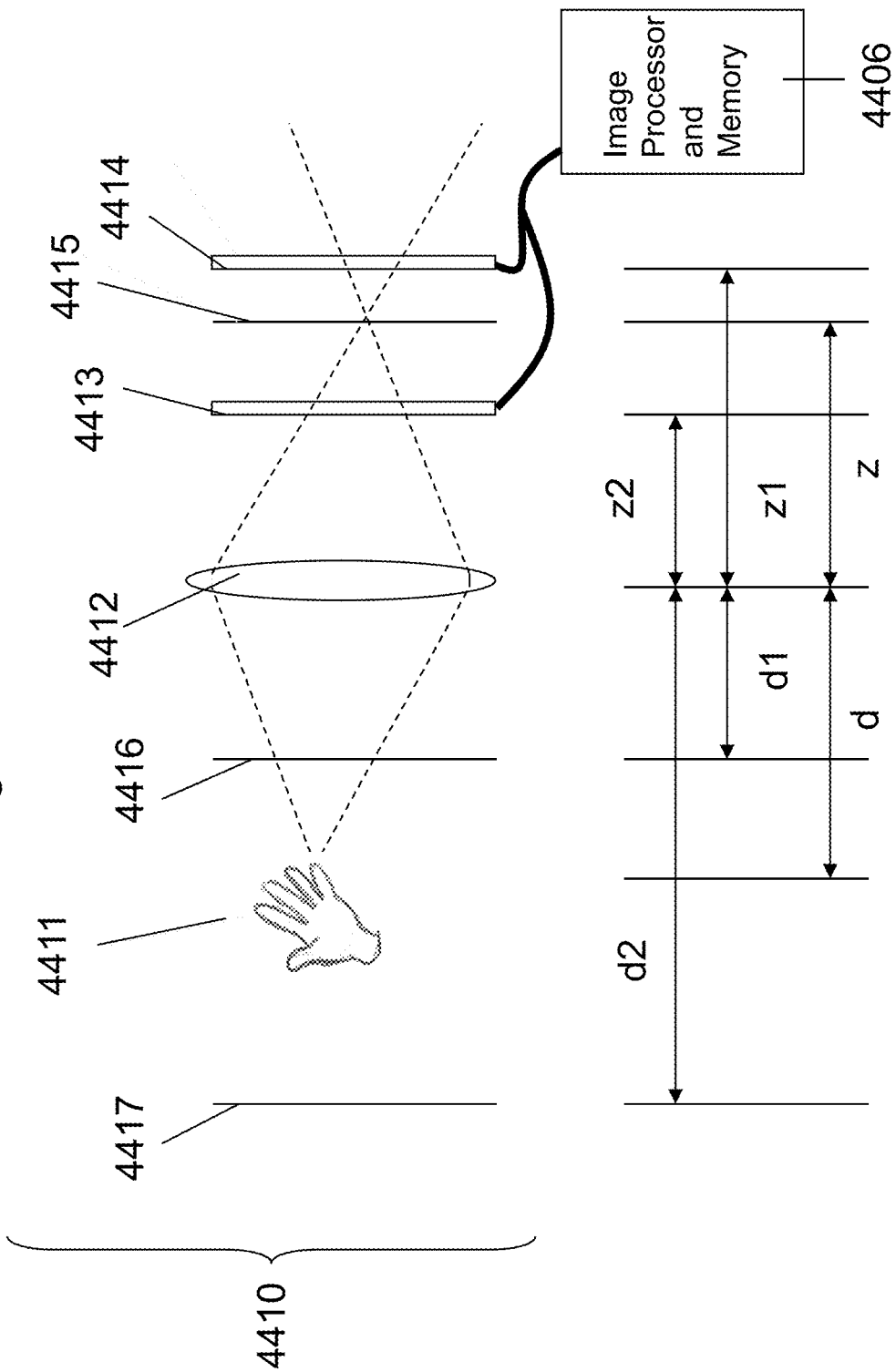
FIG. 17 illustrates an embodiment of this invention, where a remote control system uses hand gestures which are reconstructed by a camera system that includes a lens and two image sensor arrays parallel to each other and to the lens, where each sensor array is of distinct distance from the lens.

FIG. 17 illustrates an embodiment of the invention, where an imaging system 4410 may be set up as a gesture control system including a lens 4412 with focal length f and aperture of size R, a front image sensor 4413 set at distance z2 from the lens 4412 on its image side (the location of which corresponds to the image focal plane of another plane 4417 at distance d2 from the lens 4412 on its real side), a back image sensor 4414 set at distance z1 from the lens 4412 on its image side (the location of which corresponds to the image focal plane of another plane 4416 at distance d1 from the lens 4412 on its real side). The real workspace on the real side of the lens 4412 may be bounded by plane 4416 and plane 4417 at distances d1 and d2 respectively from the lens 4412 on the real side. An isolated hand 4411 or similar such object may be placed within the real workspace, and may be isolated from other objects within the real space by, for example, a technique using a glove over the hand with a specific color and using a filter gel over the lens with the same color as the glove. Isolated hand 4411 may have a corresponding image focal plane 4415 on the image side of lens 4412, which may lie between front image sensor 4413 and back image sensor 4414. At a fixed time t, isolated hand 4411 will then practically lie on the plane at some unknown distance d from the lens, and Algorithm 42A or Algorithm 42B may be used to reconstruct and image of the isolated hand 4411. An image recognition program may be used to recognize the gesture of the isolated hand 4411 at this point in time and a specific action that may be remote to the position of the isolated hand may be controlled accordingly. Time-stepping through multiple images of the isolated hand 4411 may allow a series of remote commands to be relayed or a combining of multiple gestures to relay a more complicated remote command. The images may be processed and stored by an integrated image processor and memory system 4406 connected to the image sensor arrays front image sensor 4413 and back image sensor 4414. Front image sensor 4413 and back image sensor 4414 may be parallel with respect to each other.

FIG. 18A illustrates an embodiment of the invention where a system similar to imaging system 4210 in FIG. 15A may be used in a surveillance camera system wherein by time-stepping through the image data recorded by the front image sensor 4213 and back image sensor 4214, static objects may be removed from the data and dynamic objects may be isolated and tracked. Algorithm 42A or Algorithm 42B may then be used at each time-step to reconstruct the image of the moving object. The desired time-step may typically be determined as the inverse of the frame rate of the camera recording. For example, Scene 1 4510 on front image sensor 4213 may show at time t=t0 static objects building 4512 and tree 4514. Scene 2 4520 on front image sensor 4213 shows at time t=t0+ts (the next time step ts after t0) static objects building 4512 and tree 4514, and new object, person 4516. The data S1 from the front image sensor 4213 that will be used for image reconstruction may then be updated by subtracting the difference between Scene 2 4520 and Scene 1 4510 to form differential scene 4530, thus removing static objects building 4512 and tree 4514, and leaving just dynamic object person 4516. Similar steps may be applied to back image sensor 4214.

Algorithm 42A or Algorithm 42B may then be applied to differential scene 4530 to reconstruct the image. If multiple dynamic objects are present in the scene, Algorithm 43A may be used to track and reconstruct the objects.

Figure 18B:
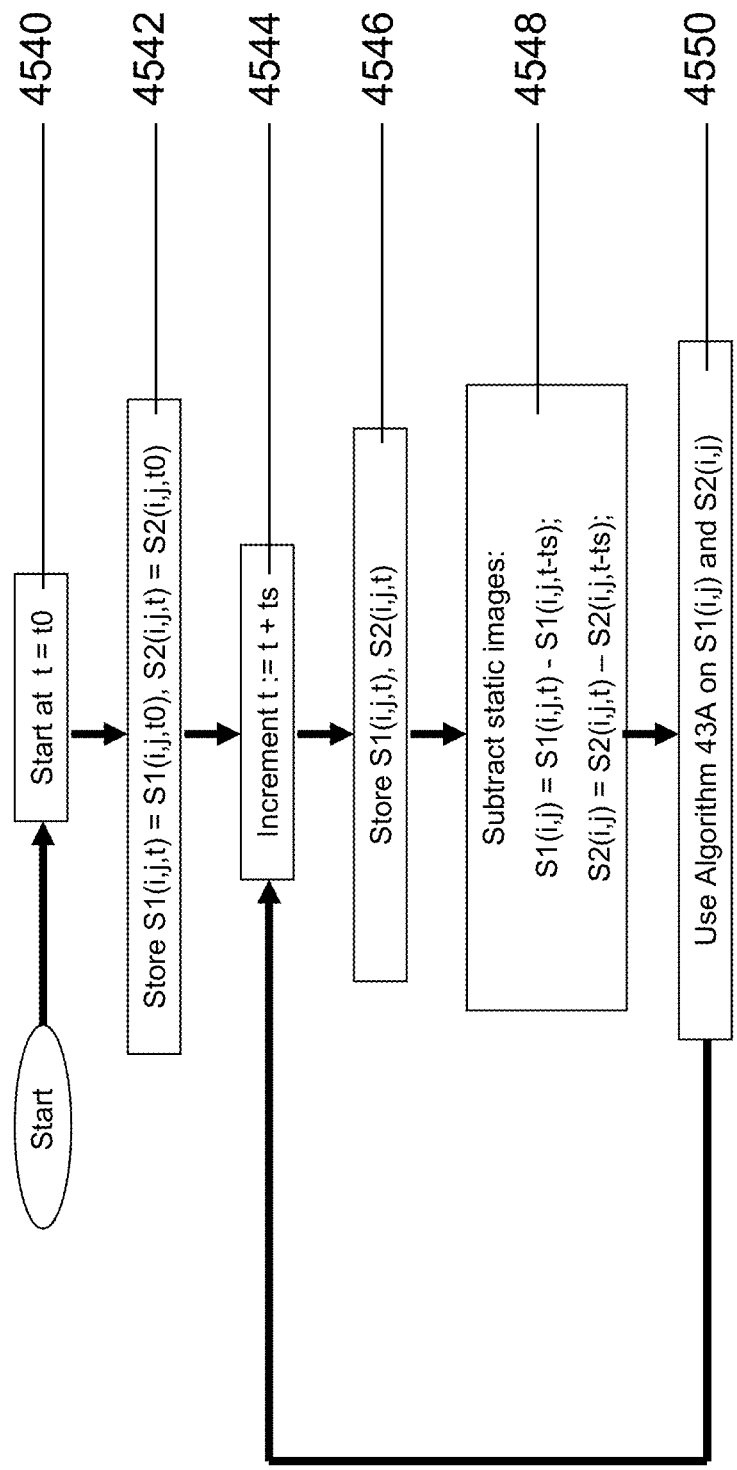

FIG. 18B illustrates an algorithm by which a surveillance camera system through time-stepping may track and reconstruct multiple distinct dynamic objects of unknown distances from the lens. The algorithm is outlined here as Algorithm 45:

Step A (4540): Start at t=t0
Step B (4542): Store sensor data S1 and S2 at t=t0
Step C (4544): Increment time by time-step ts: t: =t+ts
Step D (4546): Store sensor data S1 and S2 at new time t
Step E (4548): Calculate differential sensor data by subtracting sensor data S1 and S2 of previous time-step from sensor data S1 and S2 of current time-step, eliminating images of static objects.
Step F (4550): Perform Algorithm 43A with differential sensor data as inputs S1 and S2
Step G: Go back to Step C (4544) and continue until desired.

Figure 19A:
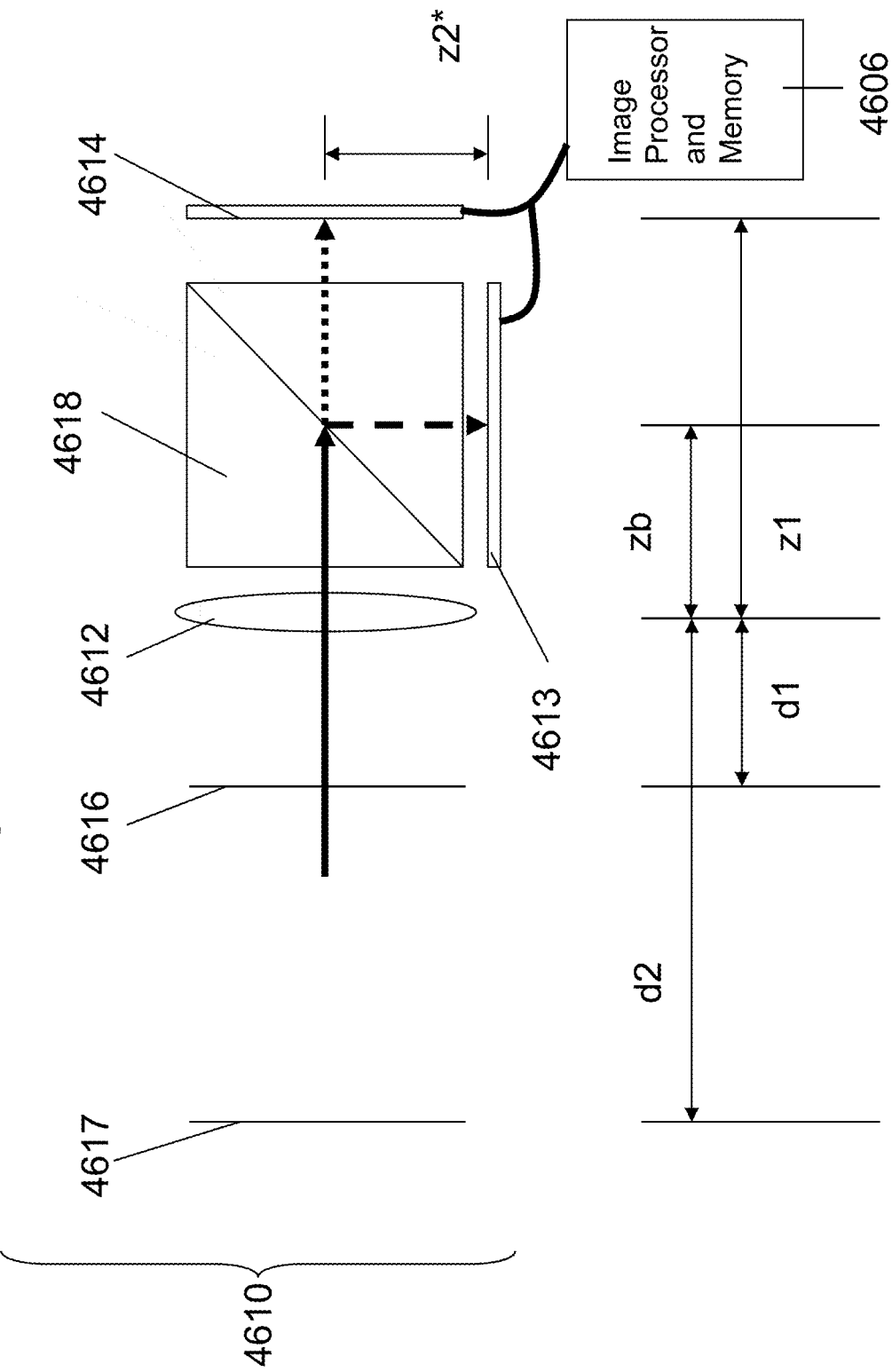
FIG. 19A illustrates an embodiment of this invention, where a camera system includes a lens, a beam-splitter and two image sensor arrays wherein images in front of the lens are split by the beam-splitter to the two image sensors wherein each sensor array is of distinct effective distance from the lens.

FIG. 19A illustrates another embodiment of the invention where a system similar to imaging system 4210 in FIG. 15A may be achieved with the use of a beam-splitter to split the image between the two image sensors. The imaging system 4610 may include a lens 4612 with focal length f and aperture of size R, a beam-splitter 4618 whose center is of distance zb from lens 4612 on its image side, a perpendicular image sensor 4613 (perpendicular in relation to the lens 4612) set at distance z2* from the center of the beam-splitter 4618, and whose effective distance from the lens, z2=zb+z2*, corresponds to the image focal plane of another plane 4617 at distance d2 from the lens 4612 on its real side, a parallel image sensor 4614 (parallel in relation to the lens 4612) set at distance z1 from the lens 4612 on its image side which corresponds to the image focal plane of another plane 4616 at distance d1 from the lens 4612 on its real side. The real workspace on the real side of the lens 4612 may be bounded by plane 4616 and plane 4617 at distances d1 and d2 respectively from the lens 4612. The images may be processed and stored by an integrated image processor and memory system 4606 connected to the image sensor arrays perpendicular image sensor 4613 and parallel image sensor 4614.

Pixel alignment of the perpendicular image sensor 4613 and parallel image sensor 4614 may be achieved using the method described by FIG. 13C. Image reconstruction algorithms described in FIG. 14-18 are applicable to the imaging system described in FIG. 19A.

Figure 19B:
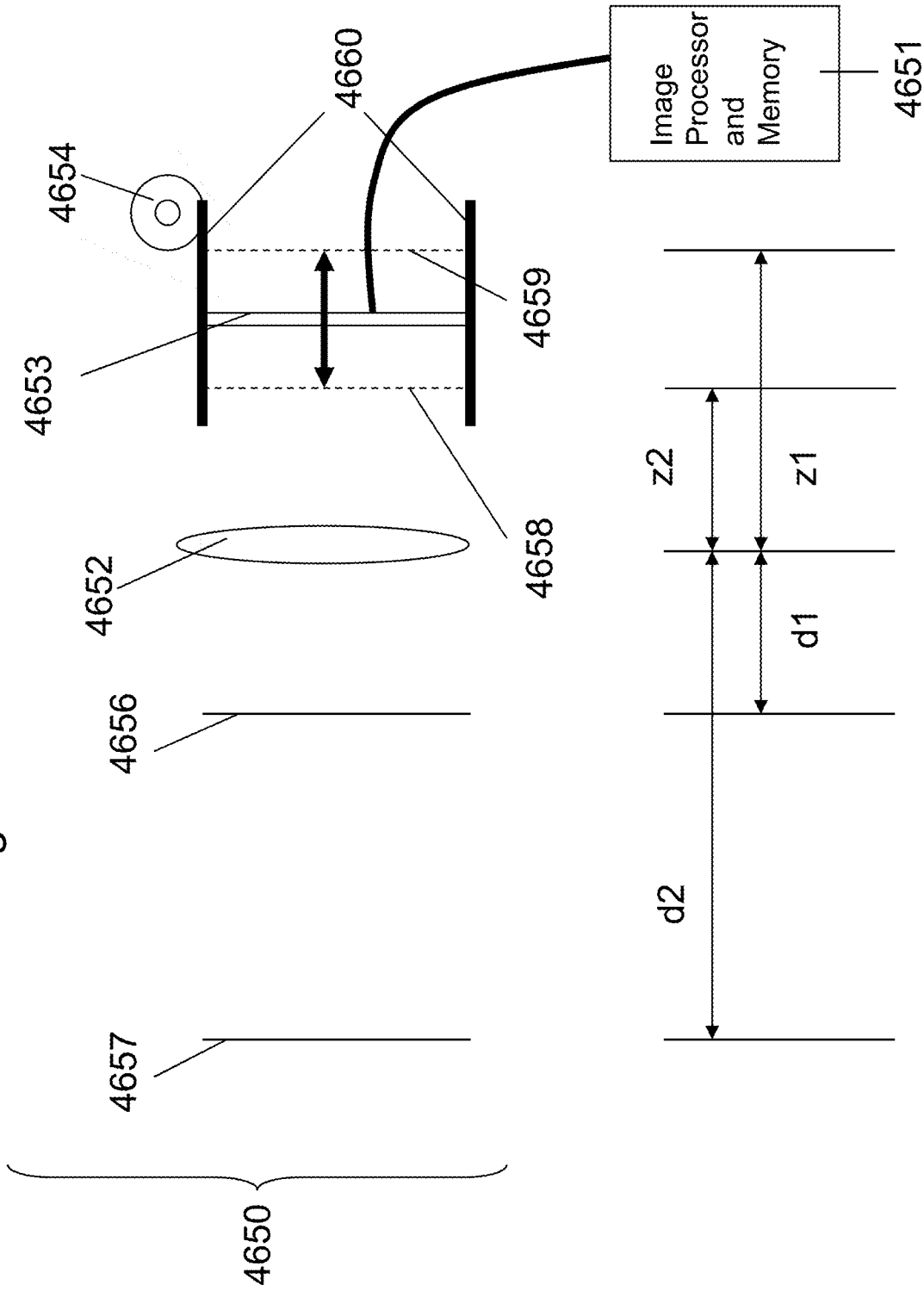
FIG. 19B illustrates an embodiment of this invention, where a camera system includes a lens, a fast motor and one image sensor array wherein images in front of the lens are detected by the image sensor while it is at two distinct positions relative to the lens within the time duration of interest. The image sensor is actuated back and forth with respect to the lens by the fast motor.

FIG. 19B illustrates another embodiment of this invention where a system similar to imaging system 4210 in FIG. 15A may be achieved with the use of a single image sensor that may be actuated back-and-forth from the lens by a fast motor. The single image sensor imaging system 4650 may include a lens 4652 with focal length f and aperture of size R, an image sensor 4653 parallel in relation to the lens 4612 set on rails 4660 on the image side of the lens 4652, and an actuation motor 4654 that drives the lens along the rails 4660 with respect to the lens 4652.

The image sensor 4653 may be actuated between two positions of distances z1 and z2 from the lens 4652. z1 is the location of image focal plane 4659 which corresponds to another plane 4656 at distance d1 from the lens 4652 on its real side, while z2 is the location of image focal plane 4658 which corresponds to another plane 4657 at distance d2 from the lens 4652 on its real side. The real workspace on the real side of the lens 4652 is bounded by plane 4656 and plane 4657 at distances d1 and d2 respectively from the lens 4652. The image sensor 4653 stores images of scenes within the real workspace when it is at locations z1 and z2 from the lens 4652. In this manner, it is behaving like two independent image sensors located at distances z1 and z2 from the lens 4652, similar to the imaging system 4110, and may have the advantage of not attenuating any of the light coming from the scene. The actuation motor 4654 may be a type of piezoelectric drive which typically has maximum linear speeds of 800,000 microns per second and precision of a few nanometers. For example, with a real workspace defined by the space from 1 to 10 meters from the lens of typical focal length about 5 mm, the distance between z1 and z2 with air in between will be about 22.5 microns, which allows the image sensor 4653 to move back and forth between the positions z1 and z2 at a rate of more than 15,000 times per second. Typically, this will be enough for a camera system to collect the two images where the frame rate is about 30 frames per second, even accounting for shutter speed and shutter delay. The collected images from image sensor array 4653 may be processed and stored by an integrated image processor and memory system 4151 connected to the image sensor array 4653.

Pixel alignment of the image sensor 4653 along the rails 4660 specifically at positions z1 and z2 may be achieved using the method described by FIG. 13C where in this case the location of the photo-detector that detects the laser beam is inspected at positions z1 and z2, and adjustments are made in the event of discrepancies. Image reconstruction algorithms described in FIG. 14-18 are applicable to the imaging system described in FIG. 19A.

Several material systems have been illustrated as examples for various embodiments of this invention in this patent application. It will be clear to one skilled in the art based on the present disclosure that various other material systems and configurations can also be used without violating the concepts described. It will also be appreciated by persons of ordinary skill in the art that the present invention is not limited to what has been particularly shown and described hereinabove. Rather, the scope of the invention includes both combinations and sub-combinations of the various features described herein above as well as modifications and variations which would occur to such skilled persons upon reading the foregoing description. Thus the invention is to be limited only by the appended claims.

We claim:

1. An integrated device, the device comprising:
   a first level comprising a first mono-crystal layer, said first mono-crystal layer comprising a plurality of single crystal transistors;
   an overlying oxide disposed on top of said first level;
   a second level comprising a second mono-crystal layer, said second level overlaying said oxide,
      wherein said second mono-crystal layer comprises a plurality of image sensors,
      wherein said second level is bonded to said first level comprising an oxide to oxide bond;
   a plurality of pixel control circuits;
   a third level disposed underneath said first level, wherein said third level comprises a plurality of third transistors,
wherein said plurality of third transistors each comprise a single crystal channel; and
a plurality of recessed channel transistors.

2. The integrated device according to claim 1,
wherein a thickness of said second mono-crystal layer is less than 5 microns.

3. The integrated device according to claim 1,
wherein said third level comprises a plurality of landing pads.

4. The integrated device according to claim 1,
wherein said first mono-crystal layer comprises alignment marks, and
wherein said second level is aligned to said alignment marks.

5. The integrated device according to claim 1, further comprising:
a plurality of memory circuits.

6. The integrated device according to claim 1, further comprising:
at least three isolated single crystal layers.

7. The integrated device according to claim 1,
wherein each of said plurality of image sensors is directly connected to at least one of said plurality of pixel control circuits.

8. An integrated device, the device comprising:
a first level comprising a first mono-crystal layer, said first mono-crystal layer comprising a plurality of single crystal transistors;
an overlying oxide disposed on top of said first level;
a second level comprising a second mono-crystal layer, said second level overlaying said oxide,
 wherein said second mono-crystal layer comprises a plurality of image sensors,
 wherein said second level is bonded to said first level comprising an oxide to oxide bond;
a plurality of pixel control circuits;
a third level disposed underneath said first level,
 wherein said third level comprises a plurality of third transistors,
 wherein said plurality of third transistors each comprise a single crystal channel; and
a plurality of metal gate transistors.

9. The integrated device according to claim 8,
wherein a thickness of said second mono-crystal layer is less than 5 microns.

10. The integrated device according to claim 8,
wherein said third level comprises a plurality of landing pads.

11. The integrated device according to claim 8,
wherein said first mono-crystal layer comprises alignment marks, and
wherein said second level is aligned to said alignment marks.

12. The integrated device according to claim 8, further comprising:
a plurality of memory circuits.

13. The integrated device according to claim 8, further comprising:
at least three electrically isolated single crystal layers.

14. The integrated device according to claim 8,
wherein each of said plurality of image sensors is directly connected to at least one of said plurality of pixel control circuits.

15. An integrated device, the device comprising:
a first level comprising a first mono-crystal layer, said first mono-crystal layer comprising a plurality of single crystal transistors;
an overlying oxide disposed on top of said first level;
a second level comprising a second mono-crystal layer, said second level overlaying said oxide,
 wherein said second mono-crystal layer comprises a plurality of image sensors,
 wherein said second level is bonded to said first level comprising an oxide to oxide bond;
a plurality of pixel control circuits;
a third level disposed underneath said first level,
 wherein said third level comprises a plurality of third transistors,
 wherein said plurality of third transistors each comprise a single crystal channel, and wherein said plurality of image sensors is aligned to said plurality of single crystal transistors with a less than 600 nm alignment error; and
a plurality of recessed channel transistors.

16. The integrated device according to claim 15,
wherein a thickness of said second mono-crystal layer is less than 5 microns.

17. The integrated device according to claim 15,
wherein said third level comprises a plurality of landing pads.

18. The integrated device according to claim 15,
wherein said first mono-crystal layer comprises alignment marks, and
wherein said second level is aligned to said alignment marks.

19. The integrated device according to claim 15, further comprising:
a plurality of memory circuits.

20. The integrated device according to claim 1, further comprising:
at least three electrically isolated single crystal layers.

* * * * *